United States Patent
Takeda et al.

(10) Patent No.: US 8,508,141 B2
(45) Date of Patent: Aug. 13, 2013

(54) LIGHT CONTROL APPARATUS FOR LIGHT EMITTING DEVICE AND ILLUMINATION SYSTEM

(75) Inventors: Toru Takeda, Tokyo (JP); Akeo Kasakura, Tokyo (JP); Shinji Takai, Ushiku (JP); Yoshihito Sato, Ushiku (JP); Hiroaki Sakuta, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 192 days.

(21) Appl. No.: 13/096,353

(22) Filed: Apr. 28, 2011

(65) Prior Publication Data

US 2011/0260633 A1    Oct. 27, 2011

Related U.S. Application Data

(63) Continuation of application No. PCT/JP2011/051642, filed on Jan. 27, 2011.

(30) Foreign Application Priority Data

Jan. 29, 2010 (JP) ................................ 2010-019772
Apr. 9, 2010 (JP) ................................ 2010-090905
Dec. 24, 2010 (JP) ................................ 2010-288970

(51) Int. Cl.
*H05B 37/02* (2006.01)
*G05F 1/00* (2006.01)

(52) U.S. Cl.
USPC .......................................... 315/192; 315/291

(58) Field of Classification Search
USPC .......... 315/291, 191, 192, 193, 185 R, 185 S, 315/307, 312, 209 R, 200 R
See application file for complete search history.

(56) References Cited

U.S. PATENT DOCUMENTS

| | | | |
|---|---|---|---|
| 6,411,045 B1 | 6/2002 | Nerone | |
| 6,412,971 B1 | 7/2002 | Wojnarowski et al. | |
| 6,853,150 B2 * | 2/2005 | Clauberg et al. | 315/185 R |
| 7,053,560 B1 * | 5/2006 | Ng | 315/185 R |

(Continued)

FOREIGN PATENT DOCUMENTS

| | | |
|---|---|---|
| JP | 1-128395 | 5/1989 |
| JP | 5-49265 | 2/1993 |

(Continued)

OTHER PUBLICATIONS

Japanese Office Action issued Jun. 26, 2012, in Japan Patent Application No. 2011-239609 (with English Translation).

(Continued)

*Primary Examiner* — Minh D A
(74) *Attorney, Agent, or Firm* — Oblon, Spivak, McClelland, Maier & Neustadt, L.L.P.

(57) ABSTRACT

A light control apparatus for a LED light-emitting device comprises a driving current supply unit supplying an AC current as a driving current via a pair of terminals to the LED light-emitting device including a set of LED elements having mutually different light emission wavelength regions connected in parallel while providing opposite polarities and the pair of terminals provided to supply the driving current to the set of LED elements; an individual amount defining unit defining a positive driving current amount and a negative driving current amount respectively to be supplied to the LED light-emitting device in a positive half cycle and a negative half cycle included in one cycle of the AC current respectively.

14 Claims, 33 Drawing Sheets

(56) References Cited

U.S. PATENT DOCUMENTS

| | | | |
|---|---|---|---|
| 8,063,571 B2 * | 11/2011 | Yang | 315/224 |
| 8,188,670 B2 * | 5/2012 | Yasuda | 315/192 |
| 2003/0043611 A1 | 3/2003 | Bockle et al. | |
| 2003/0122502 A1 | 7/2003 | Clauberg et al. | |
| 2006/0158130 A1 | 7/2006 | Furukawa | |
| 2008/0203936 A1 | 8/2008 | Mariyama et al. | |
| 2010/0066258 A1 | 3/2010 | Yasuda | |
| 2010/0171437 A1 | 7/2010 | Van Herpen et al. | |
| 2010/0244724 A1 | 9/2010 | Jacobs et al. | |

FOREIGN PATENT DOCUMENTS

| | | |
|---|---|---|
| JP | 11-220501 | 8/1999 |
| JP | 2002-16290 | 1/2002 |
| JP | 2002-281764 | 9/2002 |
| JP | 2004-111104 | 4/2004 |
| JP | 2004-235097 | 8/2004 |
| JP | 2005-513819 | 5/2005 |
| JP | 2005-235565 | 9/2005 |
| JP | 2006-179672 | 7/2006 |
| JP | 2007-194071 | 8/2007 |
| JP | 2008-53189 | 3/2008 |
| JP | 2008-218043 | 9/2008 |
| JP | 2008-304694 | 12/2008 |
| JP | 2009-110918 | 5/2009 |
| JP | 2009-158114 | 7/2009 |
| JP | 2009-158507 | 7/2009 |
| JP | 2009-170240 | 7/2009 |
| JP | 2009-231525 | 10/2009 |
| WO | WO 2008/084771 A1 | 7/2008 |
| WO | WO 2008/149268 A1 | 12/2008 |
| WO | WO 2008/149286 A2 | 12/2008 |

OTHER PUBLICATIONS

International Preliminary on Patentability and Written Opinion issued Jan. 27, 2011 in Application No. PCT/JP2011/051642 (English Translation).

Notice of Reason for Rejection issued Feb. 7, 2012 in Japanese Patent Application No. 2011-239609 (with English translation).

* cited by examiner

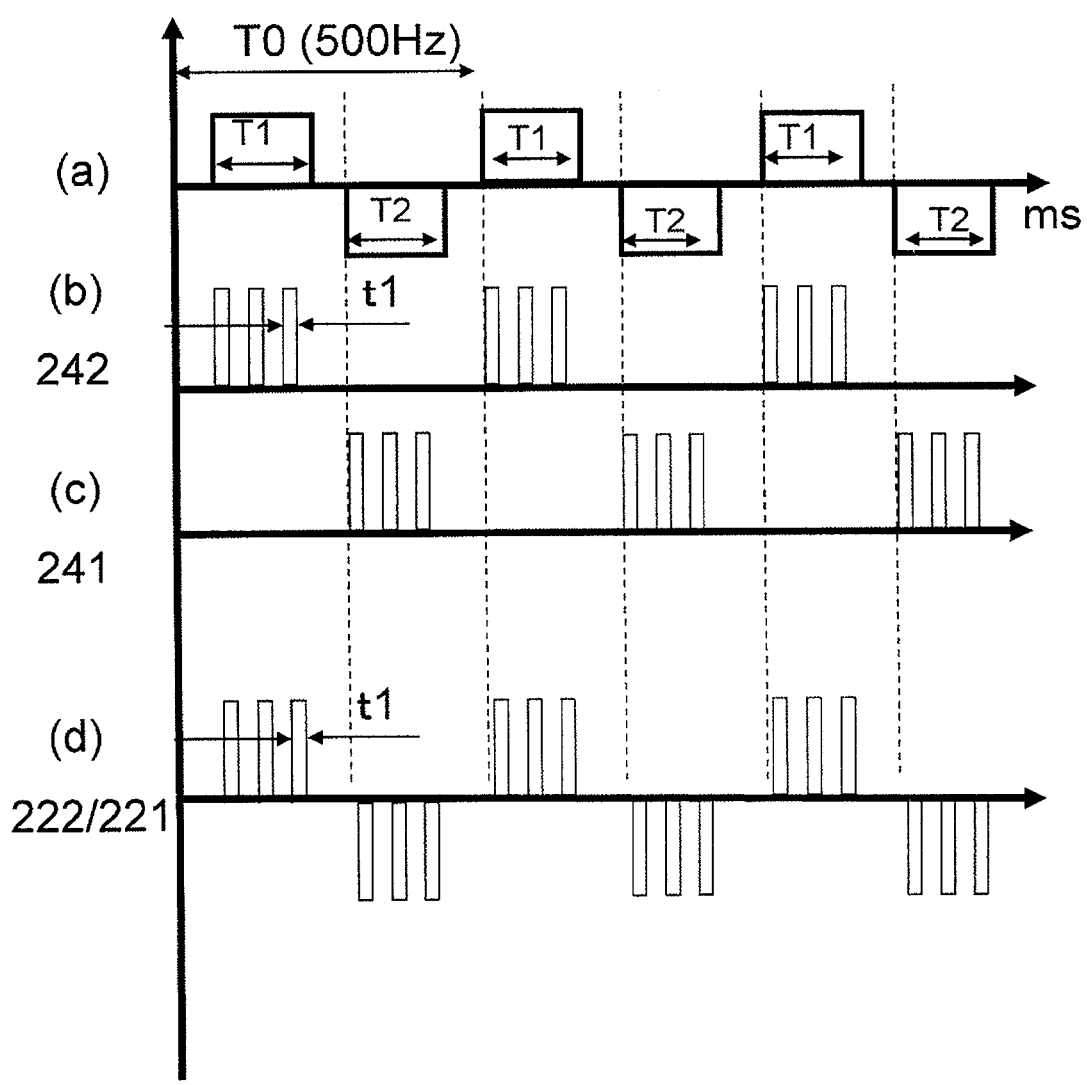

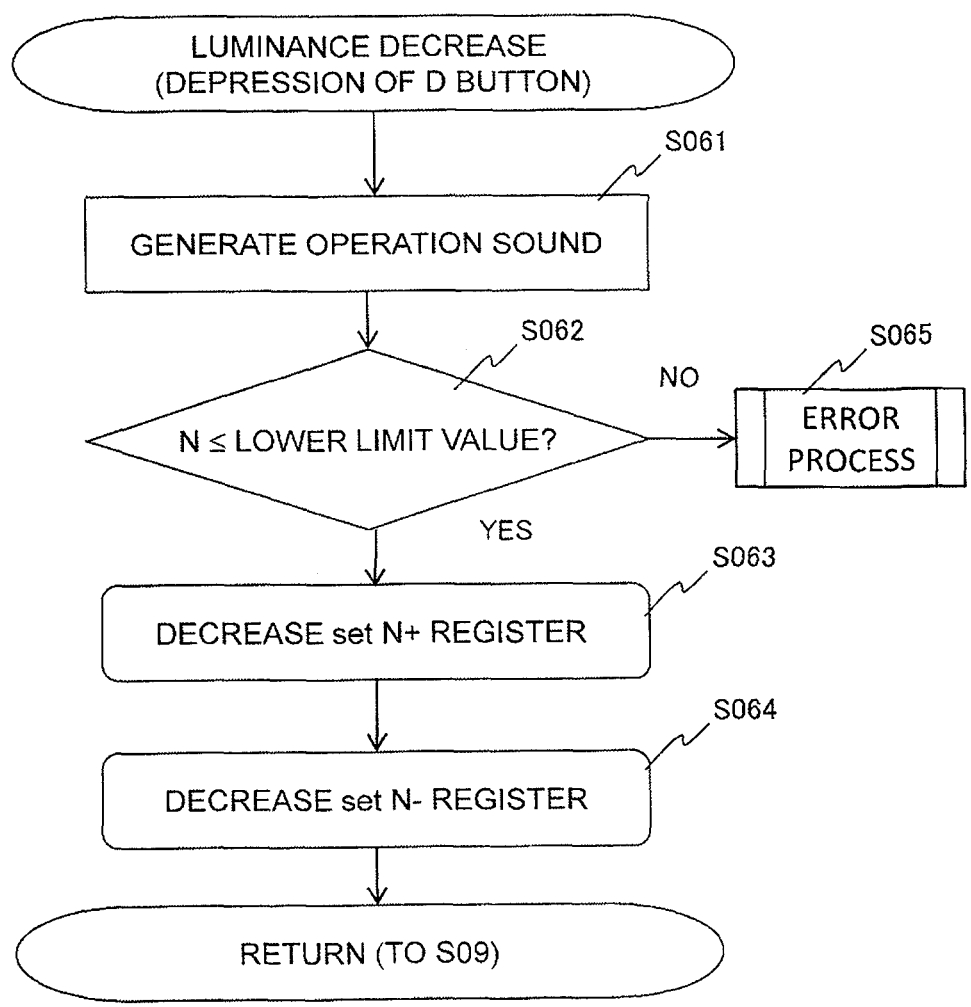

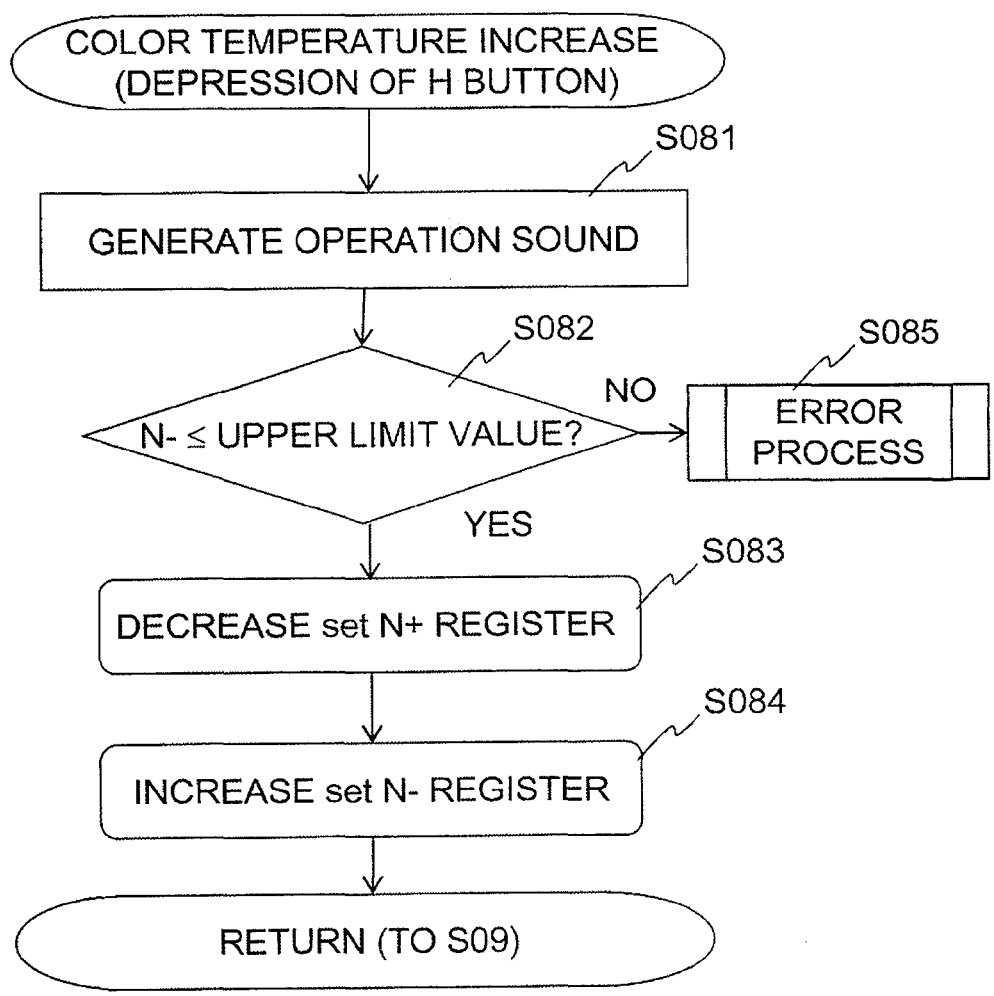

LIGHT CONTROL APPARATUS FOR LIGHT EMITTING DEVICE AND ILLUMINATION SYSTEM

CROSS-REFERENCE TO RELATED APPLICATION

This is a continuation of Application PCT/JP2011/051642, filed on Jan. 27, 2011, now pending, the contents of which are herein wholly incorporated by reference.

BACKGROUND OF THE INVENTION

The present invention relates to a lighting control apparatus for a white LED (Light Emitting Diode) light-emitting device. The present invention also relates to an illumination system.

BACKGROUND ART

When the color temperature of the illumination light is made adjustable in a room by using any conventional illumination equipment such as incandescent lamps and fluorescent lamps, the color temperature of the illumination light has been hitherto switched in the room such that both of a bulb light source such as a halogen lamp having a high color temperature and a bulb light source such as an incandescent bulb having a color temperature lower than that of the halogen lamp are installed in the room, and turning ON/OFF of each of the bulb light sources is controlled by means of individual switches provided for the respective bulb light sources.

In another situation, a large-scale illumination apparatus, in which incandescent bulbs are used as light sources and the hue and the color temperature are adjusted by using various optical filters, has been used in a special way of use such as the stage lighting in which the color of the illumination light and the color temperature of the white color are important direction factors under the stage lighting.

In recent years, LED illumination apparatuses such as LED bulbs, in each of which LED (light emitting diode) is used as a light source, begin to come into widespread use as the illumination equipment in place of the conventional illumination equipment. The feature of the LED illumination apparatus is exemplified such that the electric power consumption is low and the durability is high as compared with the incandescent bulb and the fluorescent lamp. It is desired to realize the adjustment of the hue and the color temperature of the white light source as described above by using any white LED.

A circuit, in which an AC voltage is applied to both ends of a pair of LED's or a pair of LED branches (including a plurality of LED's connected in series), is referred to as a preceding technique in relation to the present invention (for example, Patent document 1, 2, 3).

[Patent document 1] Japanese Patent Application Laid-open No. 2009-231525
[Patent document 2] U.S. Pat. No. 6,412,971 (FIG. 23, FIG. 25, FIG. 26)
[Patent Document 3] Japanese Patent Application Laid-open No. 2002-281764 (FIG. 1)
[Patent document 4] Japanese Patent Application Laid-open No. 2005-513819 (PCT) (FIG. 2, FIG. 3)

When it is intended to realize the light control for the white illumination by using LED, the color temperature of the illumination light can be made adjustable by preparing a plurality of white LED's having different color temperatures and individually controlling the lighting/blackout (turning ON/OFF) with respect to the white LED's.

However, if the color temperature of the LED illumination can be made variable by adjusting the driving current supplied to a single LED illumination apparatus or device, the LED illumination apparatus or device can appeal to a wide range of users.

SUMMARY OF THE INVENTION

The present invention has been made taking the foregoing circumstances into consideration, an object of which is to provide such a technique that a driving current, which makes it possible to adjust the luminance (light emission amount) and the chromaticity (hue, color temperature), can be supplied to a set of LED elements in accordance with an operation performed by a user.

A first aspect of the present invention is light control apparatus for a white LED light-emitting device, comprising: a driving current supply unit which supplies an AC current as a driving current via a pair of terminals to the white LED light-emitting device including a set of LED elements having mutually different light emission wavelength regions connected in parallel while providing opposite polarities and the pair of terminals provided to supply the driving current to the set of LED elements; an individual amount defining unit which defines a positive driving current amount and a negative driving current amount respectively to be supplied to the white LED light-emitting device in a positive half cycle and a negative half cycle included in one cycle of the AC current respectively; and an operation unit which is provided to impart, to the individual amount defining unit, an operation amount for adjusting the positive driving current amount and the negative driving current amount defined by the individual amount defining unit.

The first aspect of the present invention may apply a configuration that the white LED light-emitting device further comprises a total amount defining unit which increases/decreases a total amount of the positive driving current amount and the negative driving current amount to be supplied to the white LED light-emitting device during the one cycle without changing a ratio between the both, wherein the operation unit imparts, to the total amount defining unit, an operation amount for adjusting the total amount defined by the total amount defining unit depending on an operation.

The first aspect of the present invention may apply a configuration that the individual amount defining unit defines a supply start timing for the positive driving current and a supply start timing for the negative driving current in the positive half cycle and the negative half cycle depending on the operation amount of the operation unit.

The first aspect of the present invention may apply a configuration that the individual amount defining unit includes: a triac which controls supply start and supply stop of the positive and negative driving currents with respect to the white LED light-emitting device; a trigger generating unit which imparts, to the triac, a supply start trigger for the positive driving current and a supply start trigger for the negative driving current; and a time constant circuit which includes a first variable resistor for determining a time constant for allowing the trigger generating unit to generate the supply start trigger for the positive driving current and a second variable resistor for determining a time constant for allowing the trigger generating unit to generate the supply start trigger for the negative driving current, wherein the operation unit includes a first operation unit for adjusting a resistance value of the first variable resistor and a second operation unit for adjusting a resistance value of the second variable resistor.

The first aspect of the present invention may apply a configuration that the individual amount defining unit includes: a triac which controls supply start and supply stop of the positive and negative driving currents with respect to the white LED light-emitting device; a trigger generating unit which imparts, to the triac, a supply start trigger for the positive driving current and a supply start trigger for the negative driving current; and two time constant circuits in which a portion disposed on one side from a movable point possessed by a variable resistor is a resistor a for determining a time constant A for allowing the trigger generating unit to generate the supply start trigger for the positive driving current and a portion disposed on the other side from the movable point is a resistor b for determining a time constant B for generating the supply start trigger for the negative driving current, wherein the operation unit includes a first adjusting unit for adjusting a position of the movable point of the variable resistor depending on an operation.

The first aspect of the present invention may also apply a configuration that the total amount defining unit further includes one common variable resistor which is used to determine the time constant A for allowing the trigger generating unit to generate the supply start trigger for the positive driving current together with the resistor a and which is used to determine the time constant B for allowing the trigger generating unit to generate the supply start trigger for the negative driving current together with the resistor b, and the operation unit further includes a second adjusting unit which is independent from the first adjusting unit and which adjusts a resistance value of the common variable resistor.

The first aspect of the present invention may also apply a configuration that the operation unit includes a first dial which is provided as the first adjusting unit and a second dial which is provided as the second adjusting unit, the first dial and the second dial being arranged coaxially and independently from each other.

The first aspect of the present invention may also apply a configuration that the operation unit includes a first slide knob which is provided as the first adjusting unit and a second slide knob which is provided as the second adjusting unit.

The first aspect of the present invention may also apply a configuration that the operation unit includes a touch panel which includes a shift button directed toward the one side and a shift button directed toward the other side to serve as the first adjusting unit as well as an increase button to increase the resistance value and a decrease button to decrease the resistance value to serve as the second adjusting unit; the individual amount defining unit generates a resistance equivalent to that of the common variable resistor by using at least one transistor in accordance with a depressing operation for depressing the increase button to increase the resistance value or the decrease button to decrease the resistance value; and the total amount defining unit generates a resistance equivalent to that of the variable resistor by means of at least one transistor in accordance with an operation of the shift button directed toward the one side or the shift button directed toward the other side.

The first aspect of the present invention may also apply a configuration that the individual amount defining unit includes an integration circuit which generates a triangular wave voltage having a period equal to that of an AC voltage of the AC current, a non-inverting input terminal into which the triangular wave voltage generated by the integration circuit is inputted, an inverting input terminal into which a voltage obtained by divining, by a variable resistor, a DC voltage provided by rectifying the AC voltage is inputted as a reference voltage for defining a slice level of the triangular wave voltage, and a comparator which outputs positive and negative rectangular wave voltages as a result of comparison between voltages inputted from the non-inverting input terminal and the inverting input terminal respectively; the driving current supply unit supplies the positive driving current to the white LED light-emitting device in a period of time in which the positive voltage is outputted from the comparator, while the driving current supply unit supplies the negative driving current to the white LED light-emitting device in a period of time in which the negative voltage is supplied from the comparator; and the operation unit adjusts a resistance value of the variable resistor in accordance with an operation.

The first aspect of the present invention may also apply a configuration that the driving current supply unit supplies the positive driving current and the negative driving current as pulse-shaped currents to the white LED light-emitting device; and the total amount defining unit includes pulse width adjusting means for adjusting pulse widths of the pulse-shaped currents supplied as the positive driving current and the negative driving current.

The first aspect of the present invention may also apply a configuration that the driving current supply unit supplies, to the white LED light-emitting device, one or more pulse-shaped current or pulse-shaped currents having a predetermined pulse width or pulse widths in a predetermined period of time of the positive half cycle and a predetermined period of time of the negative half cycle respectively in the one cycle of the AC current, the apparatus further including: a pulse control unit which serves as the individual amount defining unit and the total amount defining unit for defining at least one of a number and the pulse width or pulse widths of the positive pulse-shaped current or pulse-shaped currents supplied in the predetermined period of time in the positive half cycle and at least one of a number and the pulse width or pulse widths of the negative pulse-shaped current or pulse-shaped currents supplied in the predetermined period of time in the negative half cycle; and the operation unit including a first operation unit which imparts, to the pulse control unit, an operation amount for increasing one of the at least one of the number and the pulse width or pulse widths of the positive pulse-shaped current or pulse-shaped currents and the at least one of the number and the pulse width or pulse widths of the negative pulse-shaped current or pulse-shaped currents and decreasing the other in accordance with an operation, and a second operation unit which imparts, to the pulse control unit, an operation amount for increasing/decreasing the at least one of the number and the pulse width or pulse widths of the positive pulse-shaped current or pulse-shaped currents and the at least one of the number and the pulse width or pulse widths of the negative pulse-shaped current or pulse-shaped currents at equal proportions in accordance with an operation.

The first aspect of the present invention may also apply a configuration that the driving current supply unit supplies the positive pulse-shaped current or pulse-shaped currents and the negative pulse-shaped current or pulse-shaped currents from one of two wiring lines connected to the pair of terminals of the white LED light-emitting device respectively, the apparatus further including: a changeover switch which switches a connection state in relation to the pair of terminals and the two wiring lines.

The first aspect of the present invention may also apply a configuration that the pulse control unit includes a first register which holds a register value corresponding to the number of the positive pulse-shaped current or pulse-shaped currents in accordance with the operation of the first operation unit and the second operation unit, and a second register which holds a register value corresponding to the number of the negative pulse-shaped current or pulse-shaped currents in accordance with the operation of the first operation unit and the second operation unit; the driving current supply unit supplies, to the white LED light-emitting device, the positive pulse-shaped current or pulse-shaped currents of the number corresponding to the register value of the first register and the negative pulse-shaped current or pulse-shaped currents of the number corresponding to the register value of the second register from one of two wiring lines connected to the pair of terminals of the white LED light-emitting device respectively; and the register value of the first register and the register value of the second register are replaced with each other in accordance with the operation of the operation unit to switch a connection state in relation to the pair of terminals and the two wiring lines.

The first aspect of the present invention may also apply a configuration that the driving current supply unit supplies the positive pulse-shaped current or pulse-shaped currents and the negative pulse-shaped current or pulse-shaped currents from one of two wiring lines connected to the pair of terminals of the white LED light-emitting device respectively, the apparatus further including: a detecting unit which detects a first voltage value and a second voltage value proportional to respective average values of the positive pulse-shaped current or pulse-shaped currents and the negative pulse-shaped current or pulse-shaped currents supplied to the white LED light-emitting device respectively in respective predetermined periods of time of the positive and negative half cycles from one of the two wiring lines; a converting unit which converts the first voltage value into a first feedback register value corresponding to the number of the positive pulse-shaped current or pulse-shaped currents and which converts the second voltage value into a second feedback register value corresponding to the number of the negative pulse-shaped current or pulse-shaped currents; and a feedback control unit which compares the first feedback register value and the register value stored in the first register, which rewrites the value of the first register into the first feedback register value if the both are different from each other, which compares the second feedback register value and the register value stored in the second register, and which rewrites the value of the second register into the second feedback register value if the both are different from each other.

A second aspect of the present invention is an illumination system provided with a set of LED element groups having different light emission wavelength regions and a light control apparatus for supplying a driving current to the LED element groups, the illumination system including: an individual electric power control unit which controls individual electric powers to be supplied to the respective LED element groups respectively; and a total electric power control unit which increases/decreases a total value of the individual electric powers supplied to the set of LED element groups without changing a ratio between the individual electric powers, wherein the respective individual electric powers and the total value of the individual electric powers are controlled on an identical time base.

The second aspect of the present invention may also apply a configuration that the illumination system further includes a switching unit which switches polarities of the individual electric powers to be supplied to the respective LED element groups respectively so that a positive driving current is supplied as the individual electric power to be supplied to one of the set of LED element groups connected in parallel while providing opposite polarities and a negative driving current is supplied as the individual electric power to be supplied to the other of the set of LED element groups.

The second aspect of the present invention may also apply a configuration that the individual electric power control unit independently controls the individual electric powers to be supplied to the respective LED element groups respectively.

The second aspect of the present invention may also apply a configuration that the illumination system further includes an operation unit which imparts an operation amount for allowing the individual electric power control unit to determine the individual electric power on one hand and which imparts an operation amount for allowing the total electric power control unit to increase/decrease the total value on the other hand.

The second aspect of the present invention may also apply a configuration that the illumination system further includes: a DC power source; and a supply unit which outputs the driving current for the set of LED element groups by using a DC current fed from the DC power source, wherein the individual electric power control unit and the total electric power control unit impart, to the supply unit, a control signal for allowing the supply unit to output the driving current having a predetermined waveform, and the supply unit outputs the driving current having the waveform of the same shape as that of a waveform of the control signal.

A third aspect of the present invention is a light control apparatus for supplying a driving current to a set of LED element groups having different light emission wavelength regions, the light control apparatus comprising: an individual electric power control unit which controls individual electric powers to be supplied to the respective LED element groups respectively; and a total electric power control unit which increases/decreases a total value of the individual electric powers supplied to the set of LED element groups without changing a ratio between the individual electric powers, wherein the respective individual electric powers and the total value of the individual electric powers are controlled on an identical time base.

The third aspect of the present invention may also apply a configuration that the light control apparatus according to claim 21 further comprises: a DC power source; and a supply unit which outputs the driving current for the set of LED element groups by using a DC current fed from the DC power source, wherein the individual electric power control unit and the total electric power control unit impart, to the supply unit, a control signal for allowing the supply unit to output the driving current having a predetermined waveform, and the supply unit outputs the driving current having the waveform of the same shape as that of a waveform of the control signal.

According to the present invention, it is possible to provide the technique wherein the driving current, which makes it possible to adjust the luminance (light emission amount) and the chromaticity (hue, color temperature), can be supplied to the set of LED elements in accordance with the operation performed by the user.

BRIEF DESCRIPTION OF THE DRAWINGS

FIG. 9A illustrates waveforms provided in the light control apparatus according to the fourth embodiment.

FIG. 10C illustrates a flow chart illustrating a program process (luminance-decreasing process) performed by the microprocessor according to the fourth embodiment.

FIG. 11C illustrates a flow chart illustrating a program process (color temperature-increasing process) performed by the microprocessor according to the fourth embodiment.

DETAILED DESCRIPTION OF THE EMBODIMENTS

Embodiments of the present invention will be explained below with reference to the drawings. Embodiments are described as constructed by way of example. The present invention is not limited to the construction or arrangement of Embodiments.

First Embodiment

Figure 1:
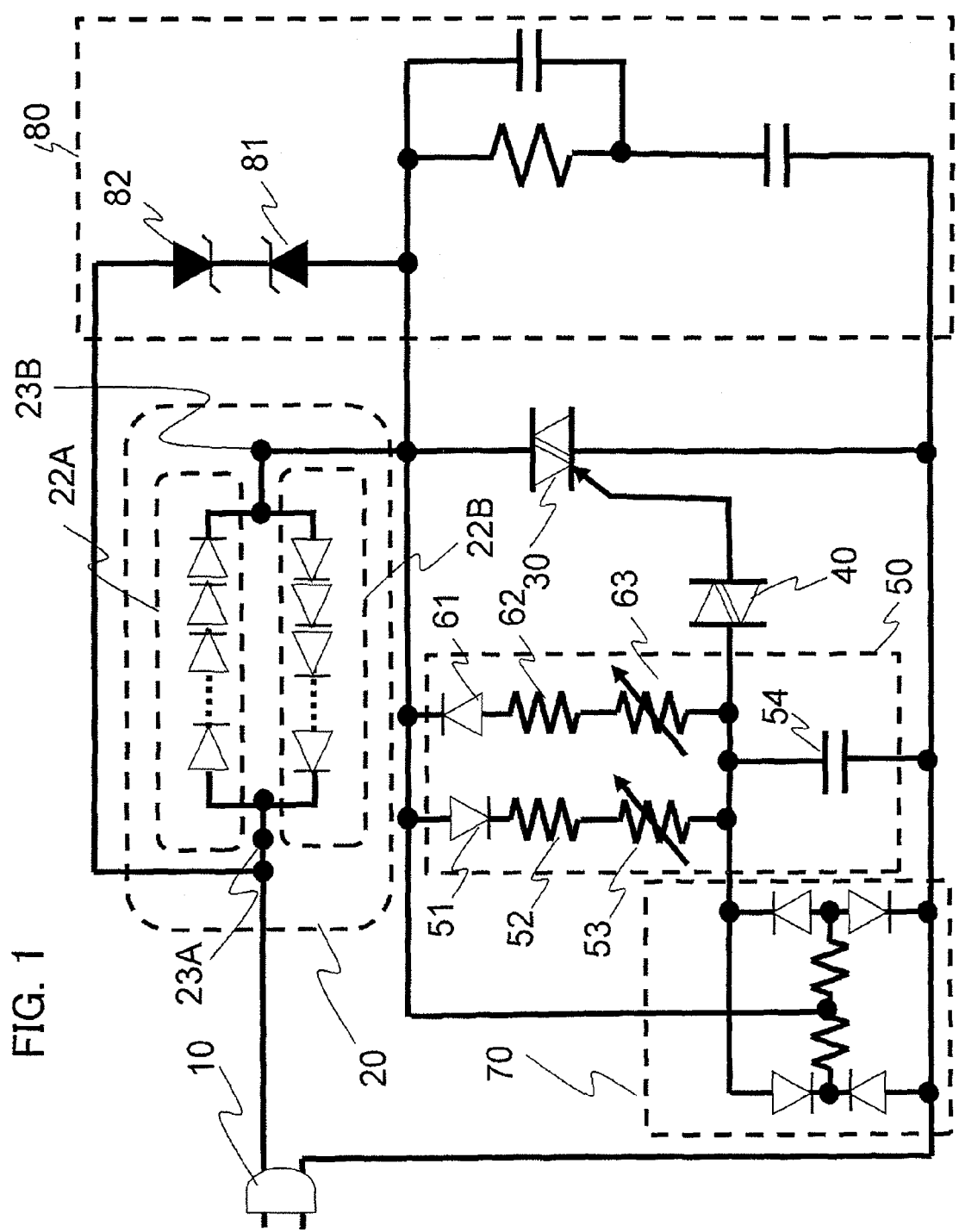
FIG. 1 illustrates an exemplary circuit arrangement of a light control apparatus for a white LED light-emitting device according to a first embodiment.

FIG. 1 shows an exemplary circuit arrangement of a white LED light control apparatus (white color modulation apparatus) according to a first embodiment of the present invention. With reference to FIG. 1, an LED light control circuit adjusts the hue of white illumination light obtained by the light emission of a white LED light-emitting device 20 (hereinafter referred to as "light-emitting device 20").

In this embodiment, the light-emitting device 20 includes light emitting diode groups manufactured on a sapphire substrate, wherein a set of LED group 22A and LED group 22B, in each of which a plurality of (for example, twenty) LED elements are connected in series, are connected in parallel in mutually opposite or reverse directions (opposite or reverse polarities), and the light-emitting device 20 has two terminals 23A, 23B which are led out from wiring lines for connecting the LED group 22A and the LED group 22B in parallel respectively. An AC (alternating current) current is applied or allowed to flow between the two terminals 23A, 23B. Accordingly, when the positive current is applied, then one of the LED group 22A and the LED group 22B is turned ON or subjected to the lighting, and the other is turned OFF or subjected to the blackout. When the negative current is applied, then one is turned OFF, and the other is turned ON.

In the example illustrated in FIG. 1, the circuit connection is provided so that the driving current is supplied to the LED group 22A in the positive half cycle of the AC current, while the driving current is supplied to the LED group 22B in the negative half cycle of the AC current.

In this embodiment, each of the LED elements included in the LED groups 22A, 22B respectively has a light emission wavelength of 410 nm and a terminal voltage of 3.5 V in the case of the forward direction current. When the twenty LED elements are connected in series, the maximum light amount is generated with a DC (direct current) current at 70 V.

A fluorescent member or fluorescent substance, which emits the white color of about 3000° K when the fluorescent member or fluorescent substance is stimulated (excited) by the light having a light emission wavelength of 410 nm, is embedded in each of the LED elements of the LED group 22A for constructing the light-emitting device 20, which is turned ON in one half cycle of the positive and negative half cycles of the AC current supplied between the terminals 23A, 23B.

On the other hand, a fluorescent member or fluorescent substance, which emits the white color of about 5000° K when the fluorescent member or fluorescent substance is stimulated (excited) by the light having a light emission wavelength of 410 nm, is embedded in each of the LED elements for constructing the LED group 228, which is turned ON in the other half cycle of the positive and negative half cycles of the AC current supplied between the terminals 23A, 23B.

However, the number of the plurality of LED elements for constructing each of the LED groups 22A, 22B can be appropriately changed. It is also allowable to use one LED element. It is necessary that the white lights, which are emitted by the LED groups 22A, 22B, should be different from each other. However, it is possible to appropriately select the color temperature (light emission wavelength region).

The light control circuit has an AC power source input terminal 10, a triac 30, a trigger diode 40, a time constant circuit 50, a hysteresis eliminating circuit 70, and a protective circuit 80.

The AC power source input terminal 10 is a terminal provided to supply the electric power from the commercial power source (AC 100V) into the light control circuit. The AC power source input terminal 10 includes a plug to effect the connection to the commercial power source. One side of the input terminal 10 is connected to an input terminal 23A of the light-emitting device 20.

The triac 30 is connected to an input terminal 23B of the light-emitting device 20. The AC current, which is inputted from the plug 10, is applied during the period of time of electric power application in the AC 1 cycle with respect to each of the LED groups 22A, 22B. When the triac 30 is turned ON (ignited) at a certain point in time in the half cycle, the positive or negative current is continuously supplied to the terminal 23B until the half cycle comes to an end.

The trigger diode 40 supplies, to the triac 30, a trigger signal in order to ignite the triac 30.

The time constant circuit 50 controls the timing at which the trigger diode 40 supplies the trigger signal to the triac 30. The time constant circuit has a diode 51, a resister 52, and a variable resistor 53 which are connected in series, a diode 61, a resister 62, and a variable resistor 63 which are connected in series, and a capacitor (condenser) 54. The time constant circuit 50 is connected to the trigger diode 40. The variable resistors 53, 63 are provided with operation units (for example, knobs) in order to individually adjust the resistance values thereof.

The resistor 52, the variable resistor 53, and the capacitor 54 constitute a CR time constant circuit for charging the application voltage to be applied to the trigger diode 40 in the AC positive half cycle (former half of the cycle). The trigger diode 40 is turned ON in accordance with the time constant which is determined by the resistance values and the capacitance value thereof. The diode 51 is a countercurrent-preventive diode. On the other hand, the resistor 62, the variable resistor 63, and the capacitor 54 constitute a CR time constant circuit for charging the application voltage to be applied to the trigger diode 40 in the AC negative half cycle (latter half of the cycle). The trigger diode 40 is turned ON in accordance with the time constant which is determined by the resistance values and the capacitance value thereof.

Figure 2:
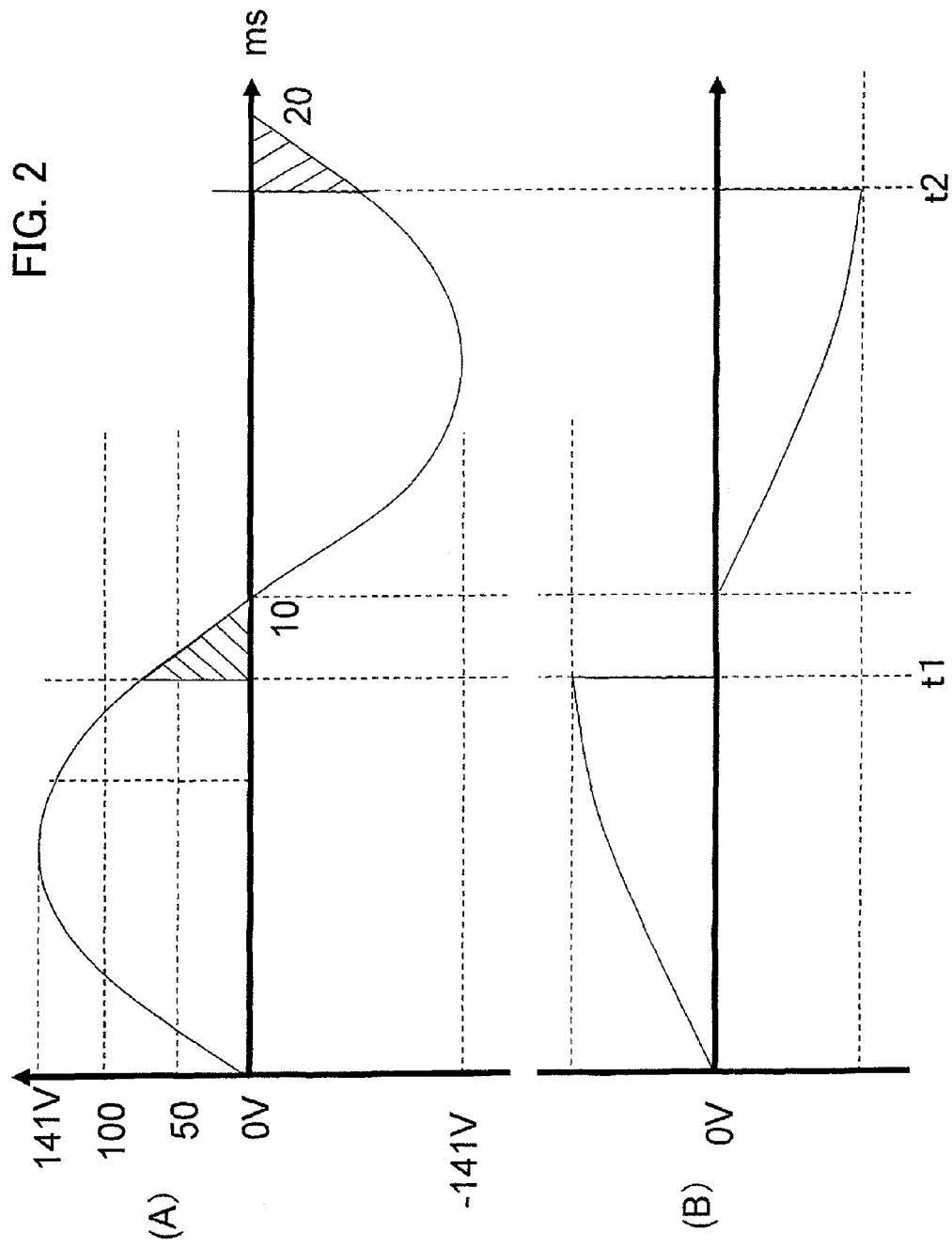
FIG. 2 (A) illustrates a commercial power source waveform applied to a light modulation circuit, and FIG. 2 (B) shows a voltage applied to a trigger diode (charging situation of electric charge applied to a capacitor).

FIG. 2 (A) shows a commercial power source waveform applied to the light control circuit, and FIG. 2 (B) shows the voltage applied to the trigger diode 40 (charging situation of the electric charge applied to the capacitor 54). As illustrated in FIG. 2 (A), the sine curve AC voltage is applied to the light control circuit. The positive charge is started with respect to the capacitor 54 of the time constant circuit 50 simultaneously with the start of the voltage application in the positive half cycle. The trigger diode 40 supplies the trigger signal to the triac 30 at a time t1 at which the electric charge, which is charged in the capacitor 45, is in a predetermined amount. The triac 30 is ignited, and the supply of the positive current is started for the light-emitting device 20. The current supply is continued until the half cycle is completed. In the negative half cycle, the same operation is performed except that that the polarity is opposite to that of the positive half cycle. The triac 30 is ignited at a time t2, and the negative current is supplied to the light-emitting device 20.

In this way, the triac 30 is ignited at the timings in accordance with the time constant of the time constant circuit 50 in the respective positive and negative half cycles to supply the driving current to the light-emitting device 20. Hatched portions illustrated in FIG. 2 (A) indicate the voltage (current) supplied to the light-emitting device 20 in the positive and negative half cycles. The time constant changes depending on the resistance values of the variable resistors 53, 63. That is, the smaller the resistance value of the variable resistor 53 is, the smaller the time constant is, wherein the timing, at which the triac 30 is ignited, becomes early. As described above, when the resistance values of the variable resistors 53, 63 are changed, it is possible to obtain the variable current application time, i.e., the variable current value in the half cycle with respect to each of the LED groups 22A, 22B. The resistance values of the variable resistors 53, 63 can be individually operated. Therefore, in the light control circuit of the first embodiment, it is possible to individually control (adjust) the current application time in each of the positive and negative half cycles.

The hysteresis eliminating circuit 70 is a circuit provided to eliminate the hysteresis by eliminating the residual electric charge charged to the capacitor 54 until the completion of the AC positive and negative half cycles.

The protective circuit 80 is connected in parallel with respect to the light-emitting device 20 and the triac 30. One end thereof is connected to the terminal 23A of the light-emitting device 20, and the other end is grounded. The protective circuit 80 has Zener diodes 81, 82. When any impulse or any surge arises, the breakdown is caused to protect the light-emitting device 20.

Next, an exemplary operation (exemplary handling) of the light control circuit will be explained. At first, the operation units of the variable resistors 53, 63 are operated so that the respective resistance values thereof are set to the maximum values. The plug 10 is connected to the unillustrated commercial power source 100 V. Accordingly, a state is given, in which the AC voltage (AC current) is supplied to the light control circuit.

Accordingly, the current, which is illustrated by hatched lines in FIG. 2 (A), is allowed to flow through the light-emitting device 20 (load). Accordingly, each of the LED groups 22A, 22B intermittently emits the light at the latter half portion of each of the half cycles. The human eye senses that the lighting is provided darkly.

Subsequently, when the operation unit of the variable resistor 53 is operated to decrease the resistance value, then the ignition timing of the triac 30 is quickened or advanced, and the average current value is increased in the positive half cycle of the AC current. The human eye senses that the lighting is provided slightly brightly.

Further, when the operation unit of the variable resistor 63 is operated to decrease the resistance value, the average current value is increased in the negative half cycle of the AC current. The human eye senses that the lighting is provided more brightly. In this situation, the white light emission at 5000° K, which is emitted or radiated from the LED group 22B, occupies a major proportion of the entire light amount of the light-emitting device 20. Therefore, it is sensed that the lighting is not only brighter than that obtained when only the LED group 22A is turned ON, but the color temperature is also raised.

As explained above, according to the first embodiment, the LED groups 22A, 22B, which have the different color temperatures, can be individually controlled by the individual variable resistors 53, 63 corresponding to the respective half cycles of the AC current. Therefore, the color temperature of the light emitted from the light-emitting device 20 can be adjusted to any arbitrary color temperature within a range from 3000° K to 5000° K.

Second Embodiment

Next, a second embodiment will be explained. A light control circuit according to the second embodiment has constitutive parts or components which are common to those of the first embodiment. Therefore, the different feature will be mainly explained, and the common feature will be omitted from the explanation.

Figure 3:
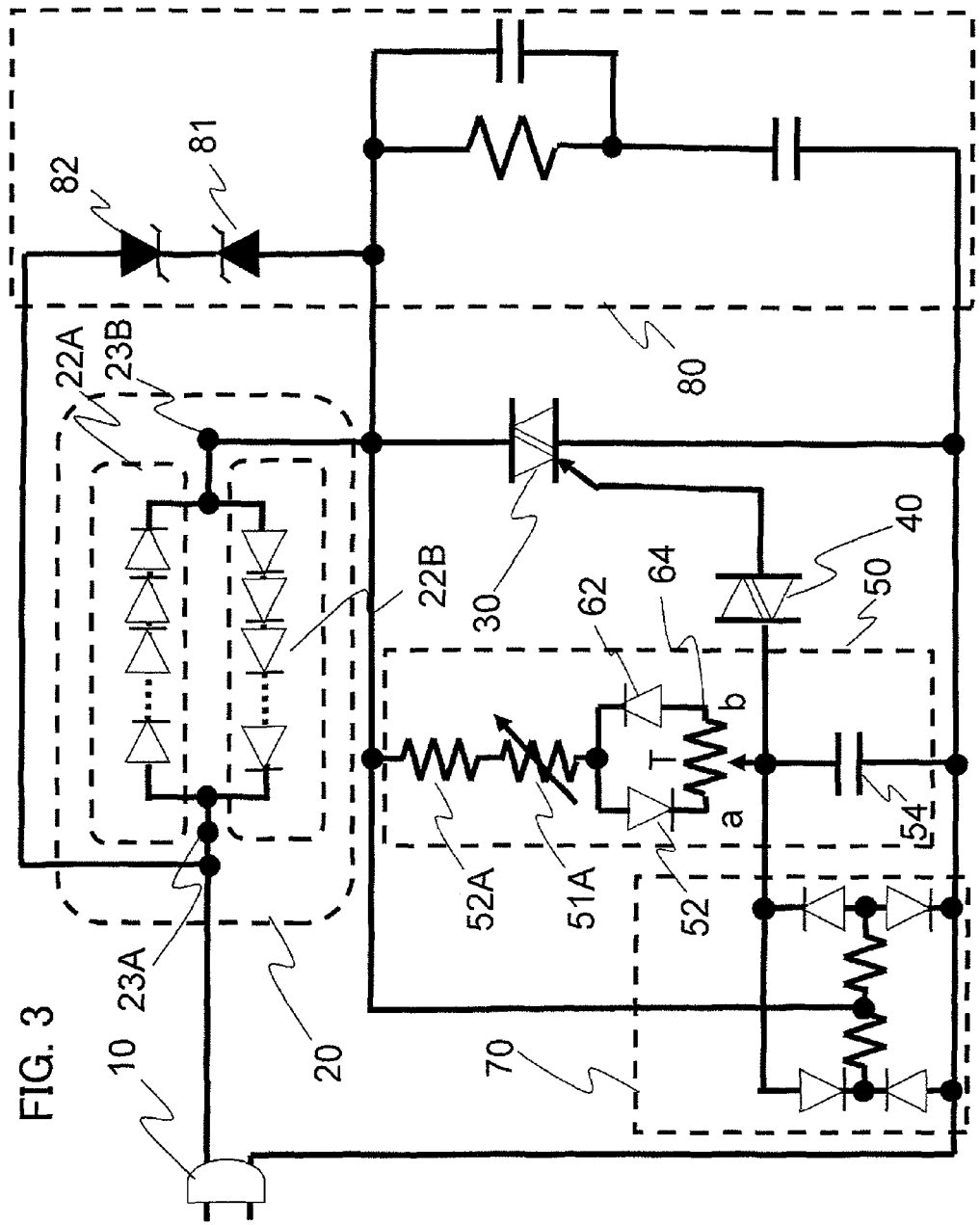
FIG. 3 illustrates an exemplary circuit arrangement of a light control apparatus for a white LED light-emitting device according to a second embodiment.

FIG. 3 illustrates an exemplary circuit arrangement of the light control circuit according to the second embodiment. The light control circuit of the second embodiment is provided with a time constant circuit 50A in place of the time constant circuit 50 of the first embodiment. The time constant circuit 50A includes a resistor 52A, a variable resistor 51A which is connected in series to the resistor 52A, a diode 52 which is connected in the forward direction to the variable resistor 51A, a diode 62 which is connected in the reverse (opposite) direction to the variable resistor 51A, and a variable resistor 64 which connects the diodes 52, 62 to one another.

A movable point T of the variable resistor 64 is movable between one end side (diode 52 side ("a" side)) and the other end side (diode 62 side ("b" side)). A contact element, which is provided for the movable point T, is connected to the capacitor 54. The resistance values of the respective variable resistors 51A, 64 are variable in accordance with the operation performed with unillustrated operation units.

The entire current, which is supplied to the light-emitting device 20, can be increased/decreased by increasing/decreasing the resistance value of the variable resistor 51A in accordance with the arrangement as described above. That is, it is possible to increase/decrease the total light amount of the light-emitting device 20.

As the movable point T of the variable resistor 64 approaches nearer to the a side (proportional distribution on the a side is decreased), the resistance value (time constant) is decreased in the positive half cycle of the AC current, while the resistance value (time constant) is increased in the negative half cycle. As the movable point T approaches nearer to the b side, the resistance value (time constant) is increased in the positive half cycle, and the resistance value (time constant) is decreased in the negative half cycle. Therefore, the ignition timing of the triac 30 may be made variable in the respective positive and negative half cycles depending on the position of the movable point T.

An exemplary operation (exemplary handling) of the light control circuit according to the second embodiment (FIG. 3) is as follows. At first, the resistance value of the variable resistor 51A is set to the maximum value. On the other hand, the movable point T of the variable resistor 64 is positioned at an intermediate or middle point between the a side and the b side. The position is adjusted by operating the operation unit so that the resistance value on the a side is equal to the resistance value on the b side.

Subsequently, the plug 10 is connected to the unillustrated commercial power source 100 V. After that, when the movable point T is allowed to approach to the a side by operating the operation unit of the variable resistor 64, then the time constant, which is constructed by the variable resistor 52A, the proportional distribution of the a side of the variable resistor, and the capacitor 54, is decreased, the average current supplied to the LED group 22A is increased, and the light amount of the LED group 22A of the light-emitting device 20 is increased.

On the other hand, when the movable point T is allowed to approach to the a side, then the time constant, which is constructed by the variable resistor 51A, the proportional distribution of the b side of the variable resistor 64, and the capacitor 54, is increased, the average current supplied to the LED group 22B is decreased, and the light amount of the LED group 22B of the light-emitting device 20 is decreased. On the contrary, when the movable point T is allowed to approach to the b side, then the light amount of the LED group 22A is decreased, and the light amount of the LED group 22B is increased.

According to the second embodiment, it is possible to adjust the total light amount of the LED groups 22A, 22B of the light-emitting device 20 having the different color temperatures in accordance with the operation of the variable resistor 51A. Further, it is possible to adjust the ratio between the current supply amounts (current intensities) supplied to the LED groups 22A, 22B. The total light amount and the current supply amount ratio may be operated independently from each other. Therefore, the light, which comes from the light-emitting device 20, can be adjusted to provide the desired color temperature within a range from 3000° K to 5000° K.

Further, according to the second embodiment, it is possible to effect the separation such that the operation unit of the variable resistor 51A is "light amount knob (light amount operation unit)" and the operation unit of the variable resistor 64 is "color tone knob (color tone operation unit)". Therefore, a user can recognize the adjustment object by intuition as compared with the arrangement of the first embodiment. It is possible to provide the preferred man-machine interface as compared with the first embodiment.

Figure 4:
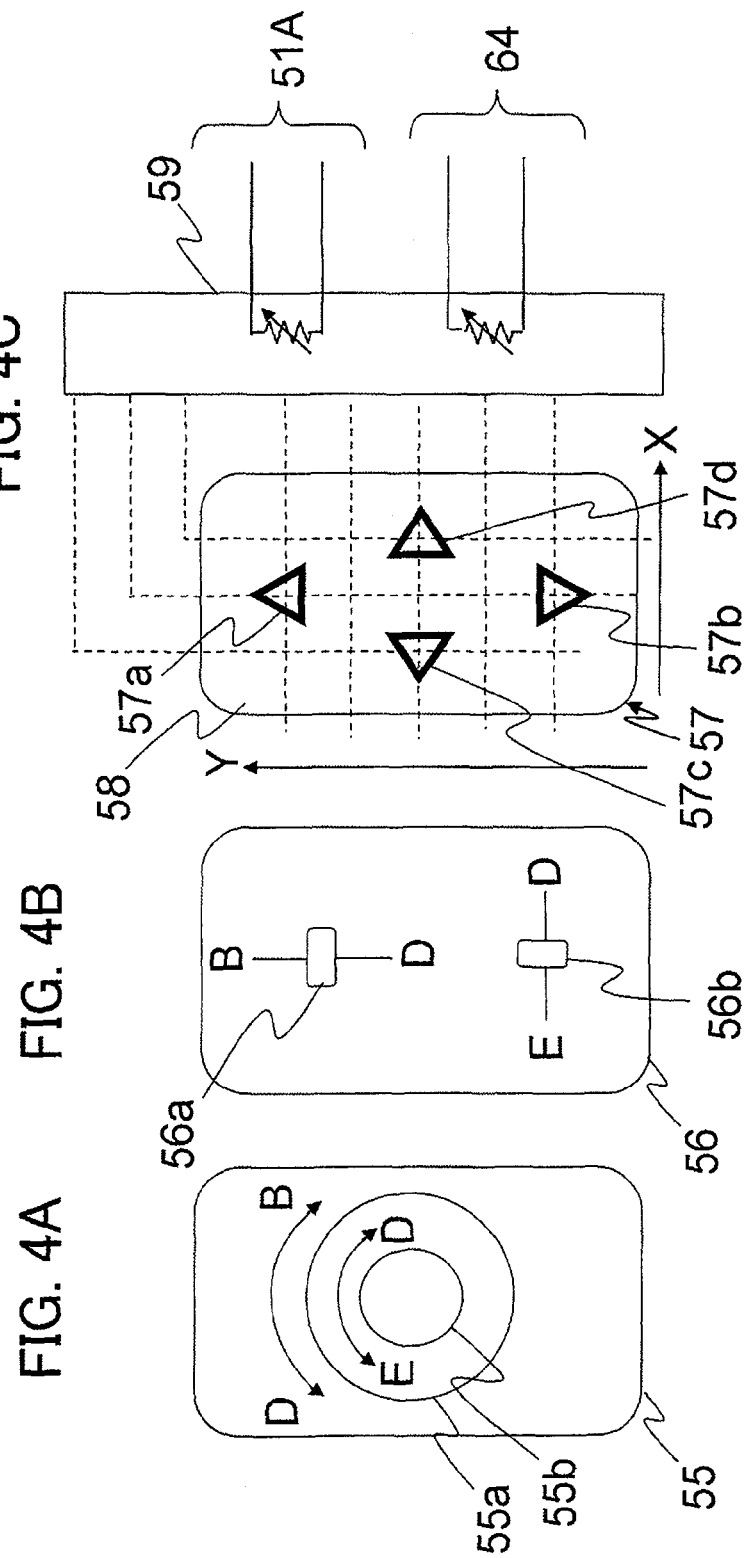
FIGS. 4A, 4B, and 4C illustrate exemplary arrangements of operation units applicable to the second embodiment.

FIGS. 4A, 4B, and 4C show exemplary arrangements of the operation unit applicable to the second embodiment. An operation unit 55 illustrated in FIG. 4A is a double dial type operation unit in which a dial knob 55a (light amount-adjusting knob) for operating the variable resistor 51A and a dial knob 55b (color tone-adjusting knob) for operating the variable resistor 64 are arranged coaxially.

When the double dial structure is adopted as described above, the user can adjust the brightness (light amount) and the chromaticity (color tone) without having any doubt. The operation unit 55 is preferred, for example, for such a way of use that the flashing and the light control are frequently performed as with any interior illumination equipment.

An operation unit 56 illustrated in FIG. 4B is an operation unit which is applied when slide type variable resistors 51A, 64 are applied. In the case of the rotary dial knob as illustrated in FIG. 4A, the relationship between the amount of rotation of the knob and the operation amount (brightness, color tone) is somewhat incomprehensive by intuition. The operation unit 56 is provided with slide knobs 56a, 56b corresponding to the brightness and the color tone. Therefore, it is possible to know the relationship between the knob position and the operation amount by intuition.

An operation unit 57 illustrated in FIG. 4C indicates a touch sensor type operation unit which is provided with a known X-Y contact type touch sensor 58 and a decoder circuit 59. The decoder circuit 59 detects contacts of seven wiring lines in total, i.e., three wiring lines in the X direction and four wiring lines in the Y direction. The decoder circuit 59 detects the touch operation for upper and lower push-buttons 57a, 57b (brightness adjustment) and left and right push-buttons 57c, 57d (color tone adjustment) provided for the touch sensor. The decoder 59 includes one or more transistor or transistors to equivalently operate as the variable resistors 51A, 64 so that the operation of one or more transistor or transistors is controlled depending on the detection result. It is possible to expect the high durability for the operation unit 57 to such an extent that any physical movable part is not provided as compared with the operation units 55, 56.

Third Embodiment

Figure 5:
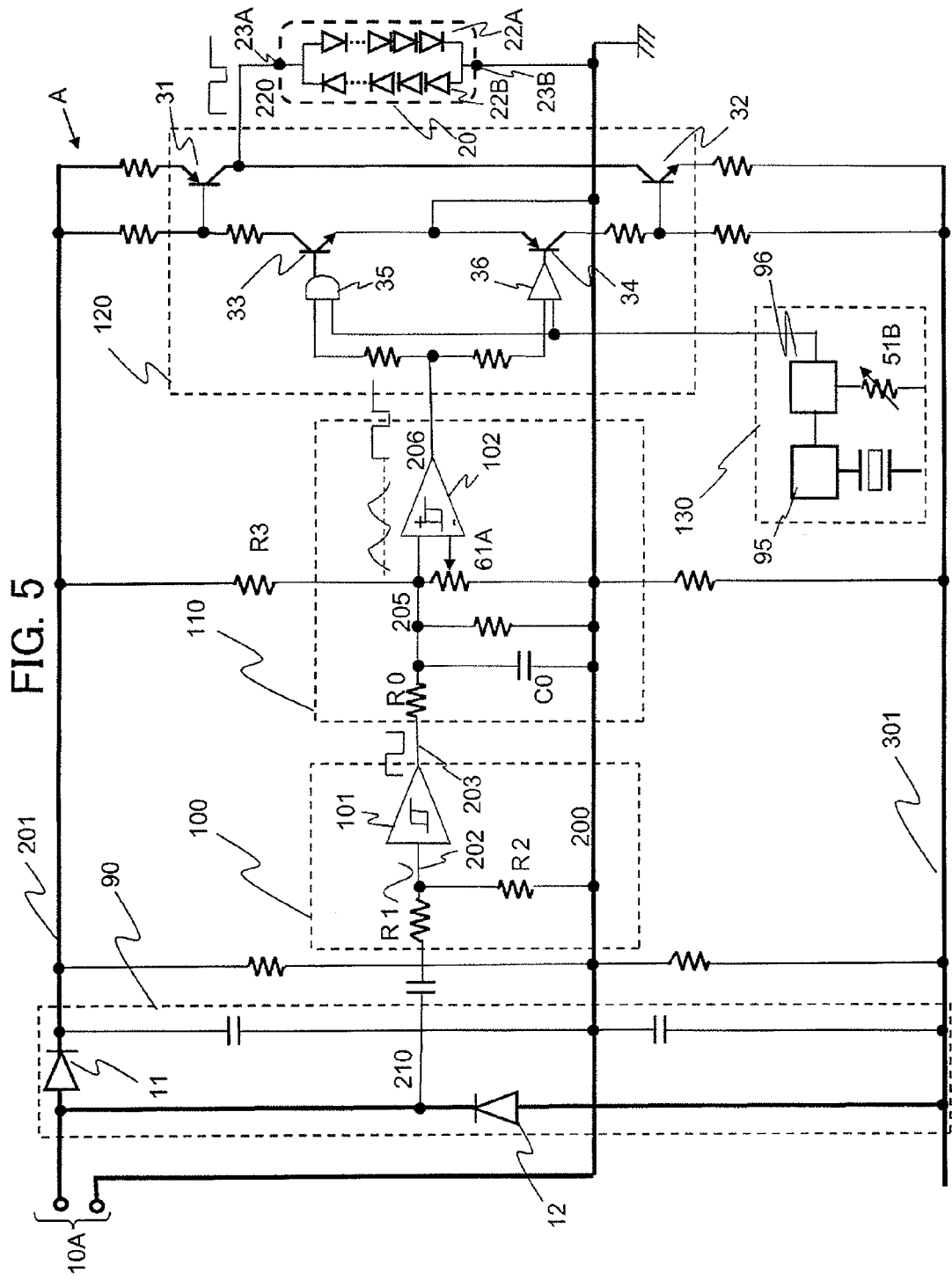
FIG. 5 illustrates an exemplary circuit arrangement of a light control apparatus for a white LED light-emitting device according to a third embodiment.

Next, an explanation will be made about a third embodiment in which the self-excited oscillation frequency independent from the commercial AC frequency is used. FIG. 5 illustrates an exemplary arrangement of a light control apparatus according to the third embodiment. With reference to FIG. 5, the light control apparatus comprises an input terminal 10A, a half-wave voltage doubler circuit 90 (hereinafter referred to as "rectifier circuit 90"), a clock generating circuit 100, a duty ratio adjusting circuit 110, a push-pull type driving circuit 120 having complementary transistors 31, 32 (hereinafter referred to as "driving circuit 120"), and a driving pulse generating/varying circuit 130 for generating the self-excited oscillation frequency (hereinafter referred to as "pulse width adjusting circuit 130"). A light-emitting device 20 is driven by the driving circuit 120. The light-emitting device 20 is the same as those of the first and second embodiments. However, the terminals 23A, 23B are omitted from the illustration in FIG. 5.

In the light control circuit illustrated in FIG. 5, the input AC voltage of the commercial power source 100 V inputted from the input terminal 10A is rectified by the rectifier circuit 90. That is, the positive voltage is rectified by a diode 11, and the positive DC current at about 120 V is supplied to a wiring line 201. The negative voltage is rectified by a diode 12, and the negative DC voltage at about 120 V is supplied to a wiring line 301. A wiring line 200 is at the common ground electric potential with respect to the wiring line 201 and the wiring line 301.

±15 V, for which the wiring line 200 is at the common ground electric potential, is supplied from an unillustrated power source circuit for operating the circuit to the driving pulse generating/varying circuit 130 and comparators (operation amplifiers) 101, 102 possessed by the clock generating circuit 100 and the duty ratio adjusting circuit 110 respectively.

Figure 6:
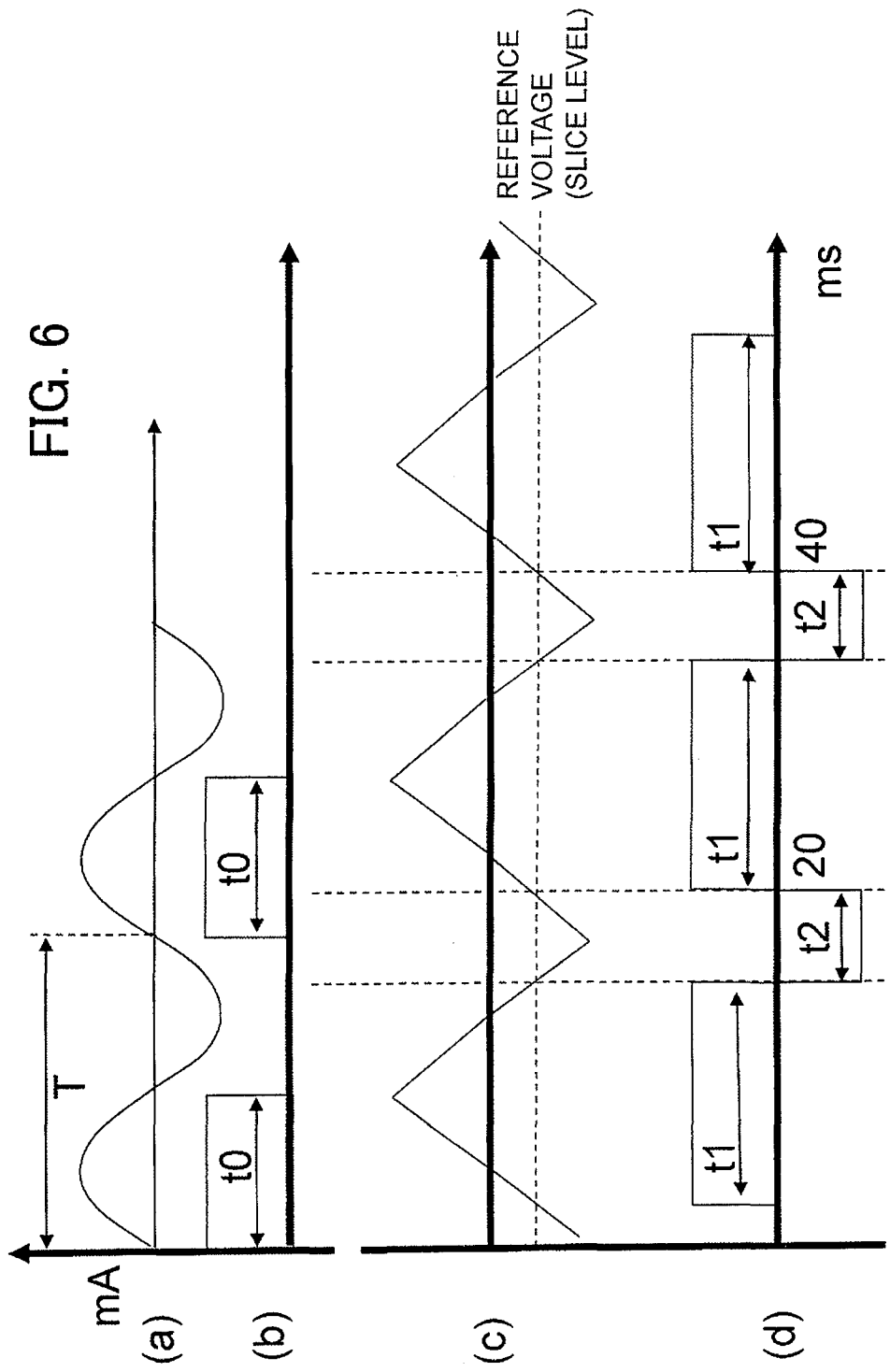
FIG. 6 illustrates waveforms provided in the light control apparatus according to the third embodiment.
Figure 7:
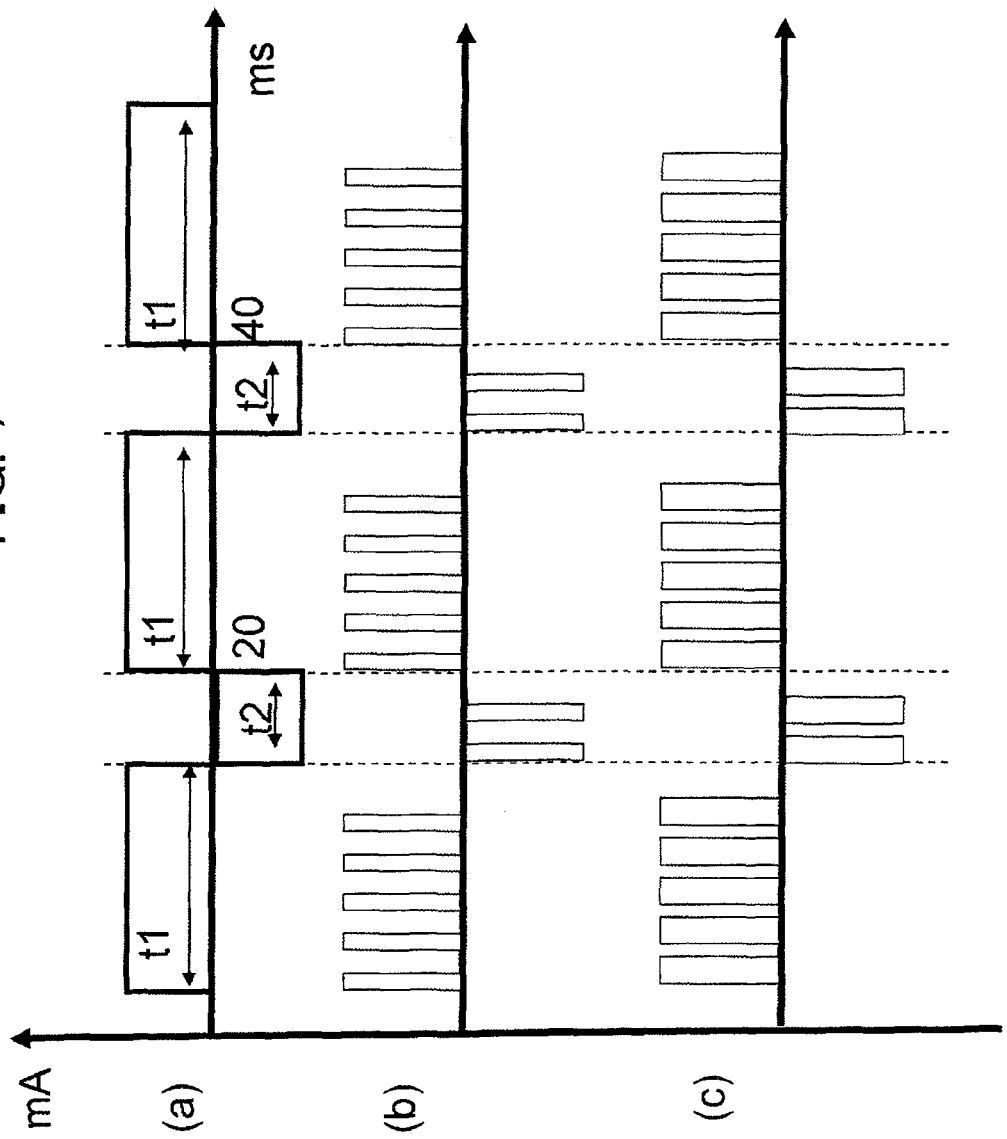
FIG. 7 illustrates waveforms provided in the light control apparatus according to the third embodiment.

The operation of the respective portions of the light control circuit will be explained below. FIGS. 6 and 7 illustrate waveforms provided in the light control circuit. FIG. 6 (a) shows the AC voltage inputted into the input terminal 10A. FIG. 6 (b) shows the output waveform from the comparator 101. FIG. 6 (c) shows the triangular wave formed by an integrator (resister R0 and capacitor C0) included in the duty ratio adjusting circuit 110. FIG. 6 (d) shows the output waveform from the comparator 102. FIG. 7 (a) shows the output waveform from the comparator 102, FIG. 7 (b) schematically shows the current waveform supplied to the LED groups 22A, 22B, and FIG. 7 (c) schematically shows the current waveform supplied to the LED groups 22A, 22B.

In the clock generating circuit 101, the input AC voltage (50 Hz, 100 V) of the input terminal 10 is supplied from the wiring line 210, and the divided voltage, which is determined by the ratio (R1/R2) between the resistors R1, R2, is inputted into the comparator 101. The rectangular wave voltage as illustrated in FIG. 6 (b) is outputted to the wiring line 203 disposed on the output side of the comparator 101 in accordance with the driving of the comparator 101. The rectangular wave voltage is utilized as the clock which is turned ON/OFF at every half cycle period of time t0 of the input AC current (FIG. 6 (a)).

In the duty ratio adjusting circuit 110, the triangular wave is generated by the integration circuit constructed by the resistor R0 and the capacitor C0, which is inputted into the non-inverting input terminal (+V) of the comparator 102. On the other hand, the inverting input terminal (−V) of the comparator 102 has one end which is connected to the wiring line 201 via a resistor R3 and the other end which is connected to a movable point of a variable resistor 61A connected to the wiring line 200. Accordingly, the voltage, which depends on the position of the movable point of the variable resistor 61A, is inputted as the reference voltage into the inverting input terminal of the comparator 102.

In the comparator 102, the reference voltage acts as the slice level for the triangular wave inputted from the non-inverting input terminal. That is, the comparator 102 provides the positive output when the triangular wave is higher than the slice level, and the comparator 102 provides the negative output when the triangular wave is lower than the slice level. Therefore, the rectangular wave, in which the positive period of time t1 having the voltage higher than the reference voltage and the negative period of time t2 having the voltage lower than the reference voltage are alternately repeated, is outputted from the comparator 102 (see FIG. 6 (d)). The period of time t1 is more shortened as the slice level approaches nearer to the voltage inputted into the non-inverting input terminal.

The driving circuit 120 has transistors 31, 32, 33, 34. The transistors 33, 31 function as the switch to supply the positive driving current via the wiring line 220 to the LED group 22B of the light-emitting device 20 in the period of time t1 as such a period of time that the output of the comparator 102 is positive. The transistors 34, 32 function as the switch to supply the negative driving current via the wiring line 220 to the LED group 22A in the period of time t2 as such a period of time that the output of the comparator 102 is negative.

The pulse width adjusting circuit 130 of the self-excited oscillation frequency type is the adjusting circuit for the driving current amount in the periods of time t1, t2 in which the supply is effected to the LED groups 22A, 22B. The pulse width adjusting circuit 130 is constructed by a pulse width modulation (PWM) circuit. That is, the pulse width adjusting circuit 130 is provided with main components of a self-excited oscillation circuit 95, a pulse duty ratio adjusting circuit 96, and a variable resistor 51B.

The pulse width adjusting circuit 130 adjusts the duty ratio of the basic pulse at 500 Hz generated by the self-excited oscillation circuit 95 to obtain the duty ratio corresponding to the resistance value of the variable resistor 51B by means of PWM in the pulse duty ratio adjusting circuit 96 so that the output is provided at the adjusted duty ratio. In this embodiment, the arrangement is made such that the higher the resistance value of the variable resistor 51B is, the larger the duty ratio is.

The output (pulse) of the pulse width adjusting circuit 130 is inputted into an AND (logical product) circuit 35 and an OR (logical sum) circuit 36 into which the output of the comparator 102 is inputted. The output terminal of the AND circuit 35 provides the input into the base of the transistor 33. The base of the transistor 31 is connected to the collector of the transistor 31. Therefore, when the output of the comparator 102 is positive, and the output from the pulse width adjusting circuit 130 is turned ON, then the AND circuit 35 is turned ON, the transistor 33 is turned ON, and the transistor 31 is subsequently turned ON. The driving current, which is based on the positive voltage, is supplied to the LED group 22A, and the LED group 22A is flashed.

On the other hand, the OR circuit 36 is turned ON, and the transistor 34 and the transistor 32 are turned ON in the interval in which the inverting input of the pulse width adjusting circuit 130 is negative in the period of time t2 in which the output of the comparator 102 is negative. The driving current, which is based on the negative voltage, is supplied to the LED group 22B, and the LED group 22B is flashed.

Therefore, as illustrated in FIG. 7 (b), the pulse-shaped driving current, which corresponds to the pulse width and the number of pulses outputted from the pulse width adjusting circuit 130, is supplied to the LED group 22A and the LED group 22B in the period of time t1 and the period of time t2 (FIG. 7 (a)). In this way, also in the third embodiment, the electric power supply amount (driving current amount) can be allowed to differ with respect to the LED group 22A and the LED group 22B by changing the supply period of time (duty ratio) of the driving current for each of the LED groups 22A, 22B in one cycle by means of the operation unit (for example, a knob) of the variable resistor 61A. That is, it is possible to obtain the variable color temperature of the light-emitting device 20.

When the resistance value of the variable resistor 51B is adjusted by the unillustrated operation unit (for example, a knob), and the duty ratio of the pulse outputted from the pulse width adjusting circuit 130 is raised, then the pulse width, which is supplied to the LED groups 22A, 22B, is widened as illustrated in FIG. 7 (c). That is, it is possible to raise the average current amount of the driving current for each of the LED groups 22A, 22B. When the operation is performed reversely, it is possible to lower the average current amount of the driving current for each of the LED groups 22A, 22B. In this way, it is possible to obtain the variable total light amount of the light-emitting device 20 in the third embodiment as well.

In the operation state in which the period of time t1 is longer than the period of time t2 as illustrated in FIGS. 6 and 7, the time, in which the LED group 22A is flashed in the positive half cycle of the input AC voltage, is longer than the time in which the LED group 22B is flashed in the negative half cycle of the input AC voltage. The human eye does not sense the flashing of the LED groups 22A, 22B as described above. The LED group 22B, which has the color temperature (5000° K) higher than the color temperature (3000° K) of the LED group 22A, has the dominant lighting time. Therefore, the human eye senses a bluish white color.

On the contrary, when the movable point of the variable resistor 61A is allowed to approach to the positive electric potential (toward the wiring line 201) as deviated from the midpoint by means of the operation of the variable resistor 61A, then the flashing time of the LED group 22A is shortened in the positive half cycle, while the flashing time of the LED group 22B is lengthened in the negative half cycle. Therefore, the LED group 22A, which has the low color temperature, has the dominant flashing time. The human eye senses a reddish white color. The variable resistor 61A provides the adjusting function for the color tone as described above. Therefore, the color temperature of the white color emitted or radiated by the light-emitting device 20 can be made continuously variable between 3000° K and 5000° K.

As described above, in the third embodiment, the total light amount, i.e., the luminance (brightness) of the light-emitting device 20 can be adjusted by adjusting the resistance value of the variable resistor 51B. When the pulse width outputted from the circuit 130 is increased (duty ratio is increased) by means of the operation of the variable resistor 51B, the pulse-shaped current, which is allowed to flow through the wiring line 220 to connect the transistors 31, 32 and one terminal of the light-emitting device 20 (the other terminal of the light-emitting device 20 is connected (grounded) to the wiring line 200), has the pulse width which is increased in both of the positive and the negative as illustrated in FIG. 7 (c). Therefore, the average current value is increased in both of the positive and negative polarities, and the total light emission amount of the light-emitting device 20 is increased. Therefore, it is possible to adjust the luminance brought about by the light-emitting device 20.

According to the arrangement of the third embodiment, an advantage is obtained such that the occurrence of any flicker can be suppressed as compared with the arrangements of the first and second embodiments. In the arrangement of the third embodiment illustrated in FIG. 5, the driving control can be performed for the light-emitting device 20 on the basis of the output from the comparator 102 by using a known circuit chip having a control circuit and four semiconductor switches (transistors) called "H-type full bridge" (H-type full bridge driving circuit: for example, TA8428K(S) produced by Toshiba Corporation) in place of the driving circuit 120 and the pulse width adjusting circuit 130.

The first to third embodiments have been exemplified such that the commercial power source is supplied from the receptacle or plug socket. However, the supply from any interior fixed wiring line of the commercial power source does not obstruct the present invention to be carried out as well.

Fourth Embodiment

Figure 8:
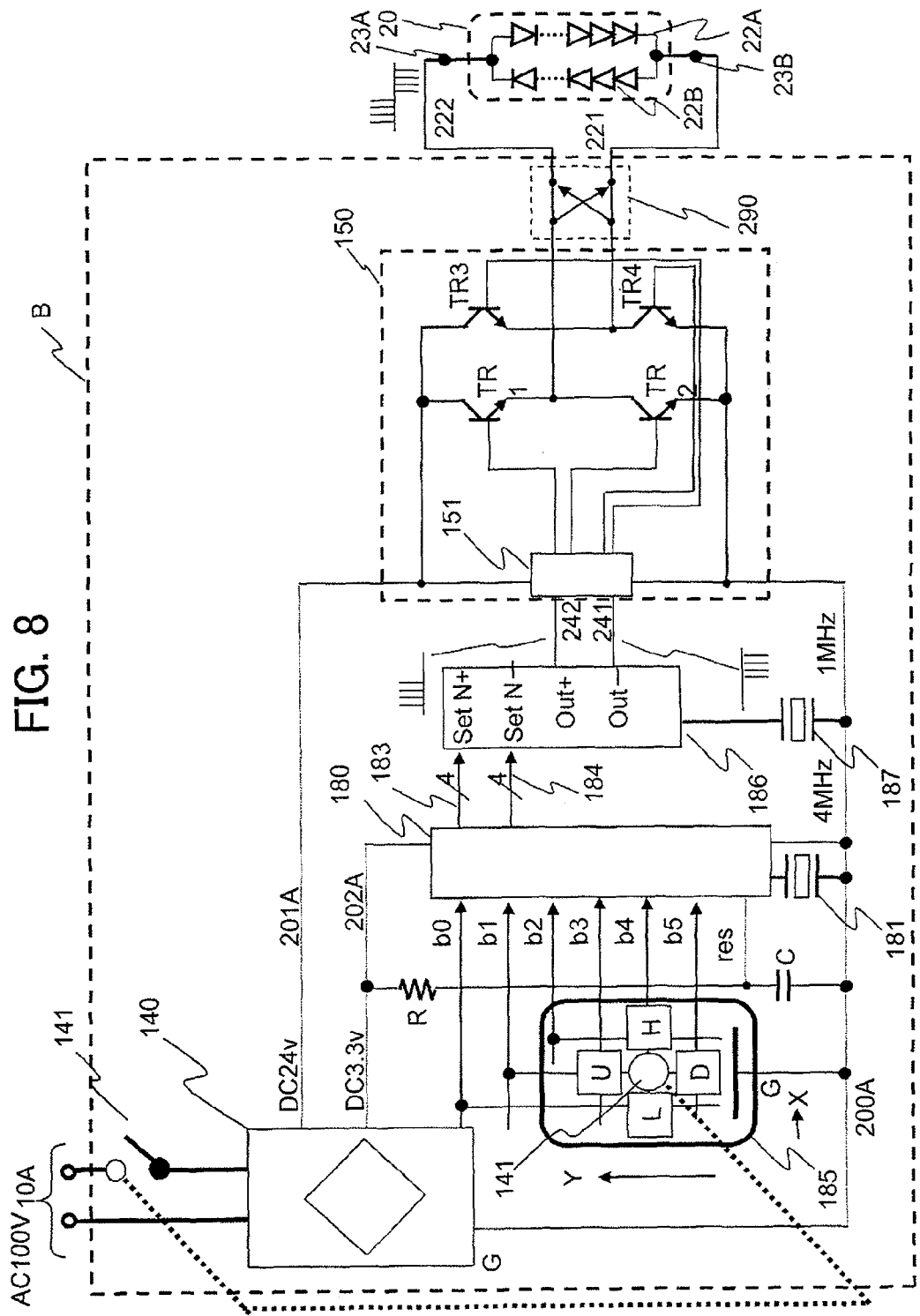
FIG. 8 illustrates an exemplary circuit arrangement of a light control apparatus for a white LED light-emitting device according to a fourth embodiment.

Next, a fourth embodiment will be explained. An example, in which the driving control of a light-emitting device 20 is carried out by using a microcomputer, is explained in the fourth embodiment. FIG. 8 shows an exemplary arrangement of a light control circuit according to the fourth embodiment. With reference to FIG. 8, the light control circuit comprises an input terminal 10A of the AC power source connected to the commercial power source 100 V, a two-voltage DC power source circuit 140 (hereinafter referred to as "power source circuit 140"), a main power source switch 141, an H-type full bridge driving circuit 150 (hereinafter referred to as "driving circuit 150"), a memory-containing type microprocessor 180 (hereinafter referred to as "microcomputer 180"), and an X-X matrix type push-button switch 185 (hereinafter referred to as "XY switch 185). The driving circuit 150 includes four transistor switches (semiconductor switches) and a control circuit 151. For example, TA8428K(S) produced by Toshiba Corporation can be applied as the driving circuit 150.

The constitutive components as described above are accommodated in an unillustrated insulating case having a height and a width of about 10 cm to construct a lighting control apparatus B of the light-emitting device 20. The XY switch 185 is provided operably from the outside on one surface of the insulating case. The insulating case is installed, for example, in such a state that the back surface of the one surface is installed on a wall surface of a building or a part thereof is embedded in a wall of a building in a state in which the one surface is exposed to the outside. The input terminal 10 may be a female connector provided for the insulating case. The input terminal 10 may include a power source cable and a plug. Further, the installation place is not limited to the wall surface of the building.

The light-emitting device 20 is approximately the same as those explained in the first to third embodiments. The light-emitting device 20 is fixed to a ceiling in a room in many cases. Two terminals 23A, 23B, which are possessed by the light-emitting device 20, are connected to the lighting control apparatus B via wiring lines 221, 222. However, there is no limitation thereto.

A positive DC voltage of about 24 V is supplied to a wiring line 201A for connecting the power source circuit 140 and the control circuit 151, and a positive DC voltage of 3.3 V is supplied to a wiring line 202A for connecting the power source circuit 140 and the power source terminal of the microcomputer 180. The power source circuit 140, the microcomputer 180, and the control circuit 151 are connected while using a wiring line 200A as a common ground electric potential. The wiring line 201A supplies the electric power to turn ON the light-emitting device 20, and the wiring line 202A supplies the driving electric power for the microcomputer 180.

The XY switch 185 has such a circuit structure that both of the X line and the Y line are short-circuited to the ground terminal G when any one of a plurality of intersections of the X line and the Y line disposed at nine places is depressed. Further, the XY switch 185 has such a circuit structure that the wiring lines b0 to b5, which are connected to the input terminal of the microcomputer 180, are held at about 3.3 V when any one of the intersections is not depressed.

An inexpensive microprocessor (MP), which is in such an extent that a memory-containing type master clock is operated at 4 MHz from an oscillator 181, may be applied to the microcomputer 180. Those possessed as the input terminals include the six input terminals b0 to b5 other than the power source reset terminal "reset". Further, the microcomputer 180 is provided with "set N+ register" and "set N− register" each having a 4-bit width. The value of the set N+ register and the value of the set N− register may be set to a timer 186 disposed at the next stage from the output terminal.

The timer 186 is a timer and counter, which is driven by a ceramic oscillator 187 at 1 MHz. Complementary burst pulses illustrated in FIG. 9A (b) and (c) are outputted in a self-excited manner at preset timings from the wiring lines 241, 242 for connecting the output terminal and the input terminal of the control circuit 151. The frequency setting is performed beforehand for the timer 186 so that the complementary burst pulses have a pulse frequency of 10 kHz and a burst repetition frequency (FIG. 9A (a)) of about 500 Hz.

The register value of the set N+ register, which is set to the timer 186, is used to control the number of burst pulses supplied in the positive half cycle. That is, the larger the register value of the set N+ register is, the more increased the number of burst pulses supplied in the positive half cycle is. On the other hand, the register value of the set N− register, which is set to the timer 186, is used to control the number of burst pulses supplied in the negative half cycle. That is, the larger the register value of the set N− register is, the more increased the number of burst pulses supplied in the negative half cycle is. The periods of time (T1, T2) of generation of the burst pulses can be changed in the respective positive and negative half cycles by adjusting a counter set to the timer 186. The respective register values of the set N+ register and the set N− register may be used to control at least one of the pulse width and the number of the burst pulse or burst pulses. That is, it is also allowable that the positive and negative burst pulses, which have at least one of the pulse width and the pulse number corresponding to the respective register values, are outputted.

With reference to FIG. 8, a polarity exchange switch 290 is provided between the wiring line 221 and the wiring line 222 for connecting the control circuit 150 and the light-emitting device 20. In the arrangement of the fourth embodiment, the preferred connection is provided such that the wiring line 222 is connected to the terminal 23A and the wiring line 221 is connected to the terminal 23B. The polarity conversion switch 290 provides such a state that the wiring line 222 is substantially connected to the terminal 23A and the wiring line 221 is connected to the terminal 23B by manually performing the switching operation when the wiring lines 222, 221 and the terminals 23A, 23B of the light-emitting device 20 are connected oppositely. When the polarity is exchanged by the operation of the polarity exchange switch 290, the switching is effected from the state in which the driving current is supplied from the wiring line 222 to the light-emitting device 20 to the state in which the driving current is supplied from the wiring line 221.

An explanation will be made below about the operation of the respective components of the light control circuit. At first, the input terminal 10 is connected to the commercial power source 100 V, and then the main power source switch 141 is closed. When the main power source switch 141 is closed, then the rectification and the voltage conversion operation are performed by the power source circuit 140, and the driving electric power (DC 3.3 V) is supplied to the microcomputer 180. Further, the reset terminal res has the high electric potential (hereinafter referred to as "H") while delaying by about 50 msec in accordance with the time constant of the capacitor C and the resister R, and the operation as the microcomputer 180 is started.

As illustrated in FIG. 8, the main power source switch 141 can be installed at the central portion of the XY switch 185. However, the main power source switch 141 is an ordinary main power source switch which makes no response to the button operation of the XY switch 185.

The microcomputer 180 starts the initialization operation in accordance with a known method. An operation program, which is recorded in unillustrated internal ROM (Read Only Memory), is loaded to unillustrated RAM (Random Access Memory) to successively start the operation in accordance with the program from the beginning of the program.

Figure 9B:
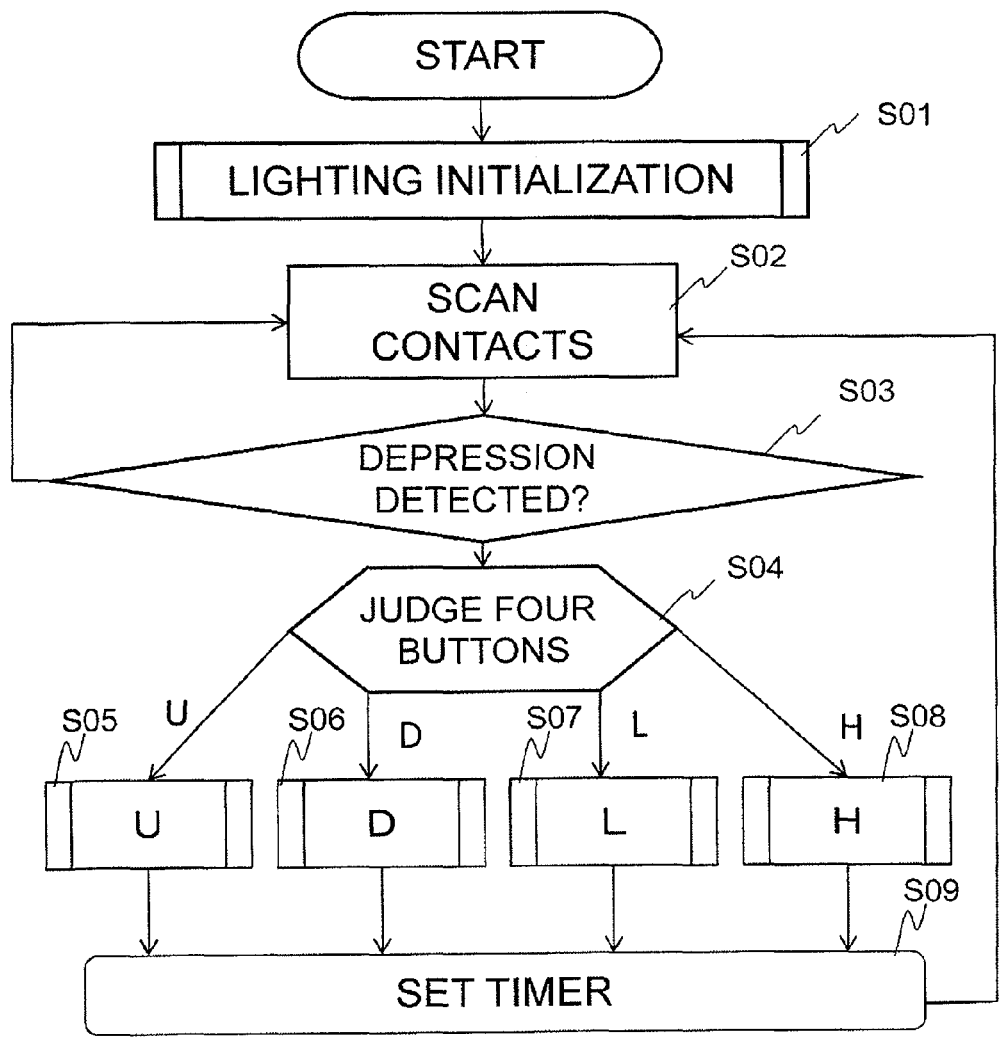
FIG. 9B shows a flow chart illustrating a program process performed by a microprocessor according to the fourth embodiment.

As illustrated in a flow chart of FIG. 9B, the lighting initialization operation is firstly performed in order that the light-emitting device 20 is in a predetermined standard lighting state (Step S01) in the program operation of the microcomputer 180 after the initialization operation. As a result, the voltages having the waveforms illustrated in FIG. 9A (b) and (c) are supplied respectively to the driving circuit 150 by the aid of the wiring lines 241, 242.

That is, the voltage based on the burst pulses is supplied from the wiring line 242 in the period of time T1 in the former half cycle at the burst repetition frequency T0 (500 Hz), and the voltage based on the burst pulses is supplied from the wiring line 241 in the period of time T2 in the latter half cycle.

The control circuit 151 receives the supply of the burst pulses from the wiring lines 242, 241 to control ON/OFF of the transistors TR1 to TR4 in accordance with the burst pulses. The control circuit turns ON the transistors TR1, TR4 during the period in which the positive pulses are supplied to the control circuit 151. Accordingly, the positive burst pulse-shaped current, which turns ON the LED group 22A, is supplied to the wiring line 222 in the period of time corresponding to the period of time T1 (FIG. 9A (a)). On the contrary, the control circuit 151 turns ON the transistors TR3, TR2 during the period in which the negative pulses are supplied to the control circuit 151. Accordingly, the negative burst pulse-shaped current, which turns ON the LED group 22B, is supplied to the wiring line 222 in the period of time corresponding to the period of time T2 (FIG. 9A (d)). In this way, the driving circuit 150 outputs the positive and negative burst pulse-shaped currents to the wiring line 222 by using the current fed from the DC power source (power source circuit 140) depending on the ON state of the positive and negative burst pulses supplied to the wiring lines 242, 241. Therefore, each of the positive and negative burst pulse-shaped currents (i.e., the driving current for the light-emitting device 20), which is supplied to the wiring line 222, has the waveform which is the same shape as that of the waveform of each of the positive and negative burst pulses (i.e., the control signal for the driving circuit 150) supplied via the wiring lines 242, 241. The "waveform of the same shape" means such a waveform that the relative timings of ON and OFF of the pulses are approximately identical with each other, which includes both of a case in which the heights of pulses are identical with each other and a case in which the heights of pulses are different from each other.

As a result, the LED group 22A is turned ON (lighted) by the positive driving current from the wiring line 222, while the LED group 22B is turned ON (lighted) by the negative driving current from the wiring line 222. In this arrangement, the number of burst pulses (average current) supplied to the wiring line 222 is equal to the number of those supplied to the wiring line 221. Therefore, the LED group 22A and the LED group 22B are turned ON (lighted) to an identical extent (approximately equivalently) respectively, and the white color state having a moderate color temperature is maintained.

As described above, owing to the frequency setting for the timer 440 performed beforehand, 1 cycle T0 is set to 2 msec (500 Hz), and the output periods of time T1, T2 of the burst pulses are set to 500 μsec respectively in the former half and the latter half of 1 cycle. Therefore, an envelope waveform of 1 cycle illustrated in FIG. 9A (a) resides in the rectangular alternating current (AC) at 500 Hz. Therefore, the actual current, which is allowed to flow through the light-emitting device 20 via the wiring line 222, has the waveform which resides in the alternate repetition of the positive bursts having a pulse width of 50 μsec (t1) and the negative bursts having the same width (see FIG. 9A (d)). The operation until arrival at this point in time is allowed to proceed by merely closing the main power source switch 141.

In FIG. 9A (d), the pulse width, which is thicker than the actual width, is schematically depicted in the drawing, because it is difficult to express the pulses having the pulse width of 50 μsec. In accordance with the above statement, the operation of Step S01 illustrated in FIG. 9B comes to an end.

After that, the microcomputer 180 starts a scanning operation for contacts of the XY switch 185, and a waiting state is continued until the depression is detected (loop of Steps S02, S03 illustrated in FIG. 9B).

Although not illustrated in FIG. 9B, the count of an unillustrated waiting timer is started in the waiting state. If the depression is not detected until the waiting timer undergoes the time out (if the light modulation operation is not performed by a user), the main power source switch 141 is shut off. Accordingly, the light-emitting device 20 returns to the blackout state.

If the light modulation operation, i.e., the push-button operation for the XY switch 185 is performed by the user, then it is judged which one of "U (UP)" button, "D (DOWN)" button, "L (LOW)" button, and "H (HIGH)" button provided for the XY switch 185 is depressed, on the basis of the ON/OFF (1/0) pattern of the wiring lines b0 to b5 (Step S04), and the process proceeds to the operation to be performed when each one of the buttons is depressed.

That is, if the U button is depressed, the luminance (light amount) increasing process (Step S05) is executed. If the D button is depressed, the luminance (light amount) decreasing process (Step S06) is executed. If the L button is depressed, the color temperature increasing process (Step S07) is executed. If the H button is depressed, the color temperature decreasing process (Step S08) is executed. Details of the processes of Steps S05 to S08 will be described later on. If any one of the processes of Steps SOS to S08 is executed, the values of "set N+ register" and "set N− register" possessed by the microcomputer 180 are changed. When any one of Steps S05 to S08 is completed, the microcomputer 180 sets the values of "set N+ register" and "set N− register" to the timer 186 (Step S09). The process is returned to Step S02, and the scanning process for contacts is restarted.

Details of the processes of Steps S05 to S08 will be individually explained below. At first, an explanation will be made about the operation to be performed in response to the action of the user (operator) intended to increase/decrease the light amount (luminance of the light-emitting device 20). For example, if the operator depresses the U button, the microcomputer 180 detects the depression of the U button to perform the process of Step S05, i.e., the process to follow a flow of the luminance increasing process illustrated in FIG. 10B.

Figure 10A:
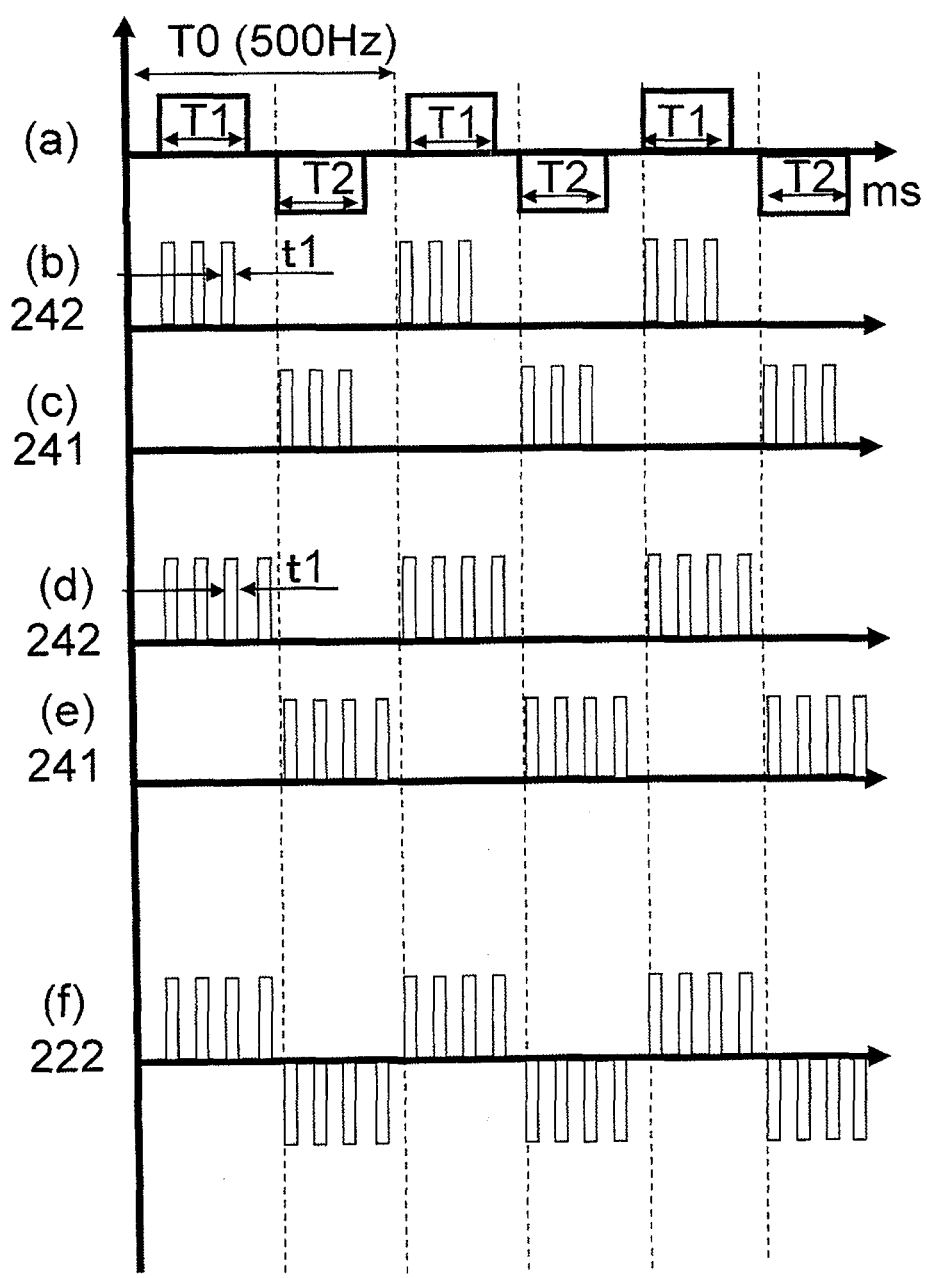
FIG. 10A illustrates waveforms provided in the light control apparatus according to the fourth embodiment.
Figure 10B:
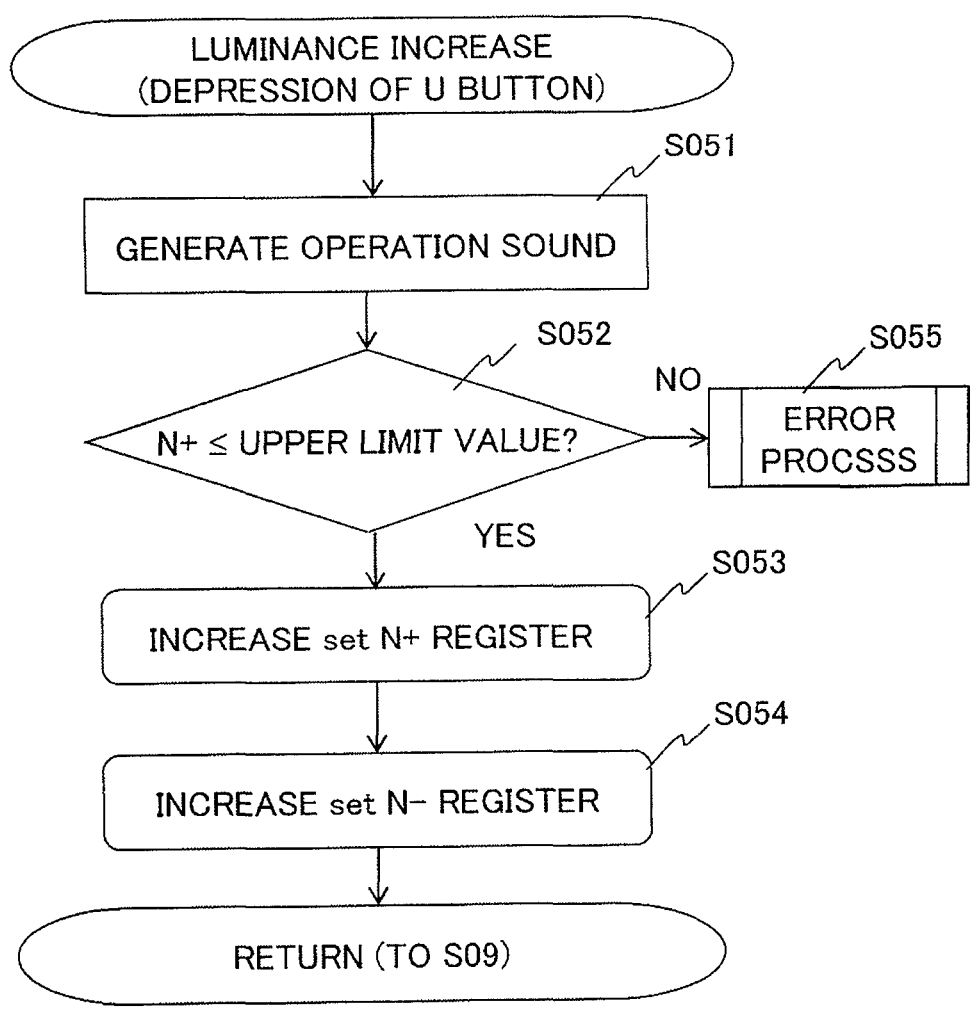
FIG. 10B illustrates a flow chart illustrating a program process (luminance-increasing process) performed by a microprocessor according to the fourth embodiment.

With reference to FIG. 10B, at first, the microcomputer 180 drives an unillustrated electronic sound generator to generate a detection sound (for example, "pip" sound) in order to inform the operator of the detection of the depression of the button (Step S051). The lighting control apparatus B may be provided with an LED lamp for informing the detection of the depression. The LED lamp may be turned ON (lighted) for a predetermined period of time together with the output of the detection sound or in place of the detection sound.

Subsequently, the microcomputer 180 refers to the value N of each of the set N+ register (not illustrated) and the set N− register (not illustrated) contained in the microcomputer 180 itself to judge whether or not the value N is not less than a predetermined upper limit value (Step S052). In this procedure, if the value N is not less than the upper limit value (S052, NO), it is judged that the user repeatedly increases the luminance and the button is continuously depressed while exceeding the maximum luminance determined by the performance of the LED element. The process proceeds to an error process routine (Step S055), and the operation error is informed.

On the contrary, if the value N is smaller than the upper limit value (S052, YES), the microcomputer 180 drives the output port for the wiring line 183 to write, for example, a value "100 (4 of decimal number)" into the set N+ register contained in the timer 186 (Step S053). Before the writing, the set N+ register holds the initial value "011 (3 of decimal number)" written into the register by the initialization operation (Step S01). The value of the set N+ register is increased in accordance with the process in Step S053.

Subsequently, the microcomputer 180 drives the output port for the wiring line 184 to write the same value "100" as that of the increment value of the set N+ resister into the set N− register contained in the timer 186 as well (Step S054). Before the writing, the set N− register holds the initial value "011" in the initialization operation. The value of the set N− register is increased in accordance with the writing in Step S054. After that, the process returns to Step S09.

The four pulses are outputted, for example, in the predetermined period of time T1 of the former half of 1 cycle as illustrated in FIG. 10A (d) to the out+ line (wiring line 242) of the timer (counter) 186, and the four pulses are outputted, for example, in the predetermined period of time T2 of the latter half of 1 cycle as illustrated in FIG. 10A (e) to the out− line (wiring line 241) of the timer (counter) 186 in accordance with the processes of Steps S053, S054. As a result, the pulse current, which is 4/3 times the initial value, i.e., larger than the initial value by 33% as illustrated in FIG. 10A (f), is supplied via the wiring line 222 to the light-emitting device 20 driven by the control circuit 150. The total light amount (luminance), which is brought about from the light-emitting device 20, is increased by about 33%.

After that, if the user intends to increase the luminance again and the U button is depressed, then the processes and the operations are repeatedly performed as described above. The luminance (brightness brought about by the light emitted from the light-emitting device 20) is increased 5/3 times as compared with the initial value. That is, the obtained luminance is improved or increased by 66%. In this way, the process for increasing the luminance is performed.

The luminance is also decreased in accordance with the procedure which is approximately the same as that adopted when the luminance is increased. That is, if the D button, which is the luminance decreasing button, is depressed, the luminance decreasing process of Steps S061 to S064 illustrated in FIG. 10C is performed as the process ranging from Step S04 (FIG. 9B) to Step S06. The process in Steps S061 to S064 is the same as the process illustrated in FIG. 10B except that the error process (Step S065) is performed if the register value N is not more than a predetermined lower limit value in Step S062 and the register value is reduced in Steps S063, S064. The register value is reduced by "001" of binary number every time when the D button is depressed once.

Therefore, if the D button is depressed once immediately after the initialization operation (Step S01), the total light amount (luminance) is lowered to 2/3 of the initial value, i.e., by 33%. If the D button is depressed twice, the obtained total light amount is reduced to 1/3 of the initial value, i.e., by 66%. However, the proportion of the increase/decrease in the light amount (luminance), which is provided by depressing the U button or the D button once, can be appropriately set.

The foregoing statement is provided to explain the increase/decrease in the light amount. Next, an explanation will be made about the procedure for changing the color tone. In the fourth embodiment, the light-emitting device 20 comprises the LED group 22A having the low color temperature of 2500° K (K represents the Kelvin temperature) and the LED group 22B having the high color temperature of 6000° K. Therefore, when the driving current allowed to flow through the LED 22A is increased, and the driving current allowed to flow through the LED 22B is decreased, then it is possible to lower the color temperature of the entire light-emitting device 20.

When the color temperature is lowered, the user (operator) depresses the L button of the XY switch 185. Accordingly, a color temperature decreasing process of Step S07 (FIG. 11B) is executed after performing the judging process of Step S04 by the microcomputer 180.

Figure 11A:
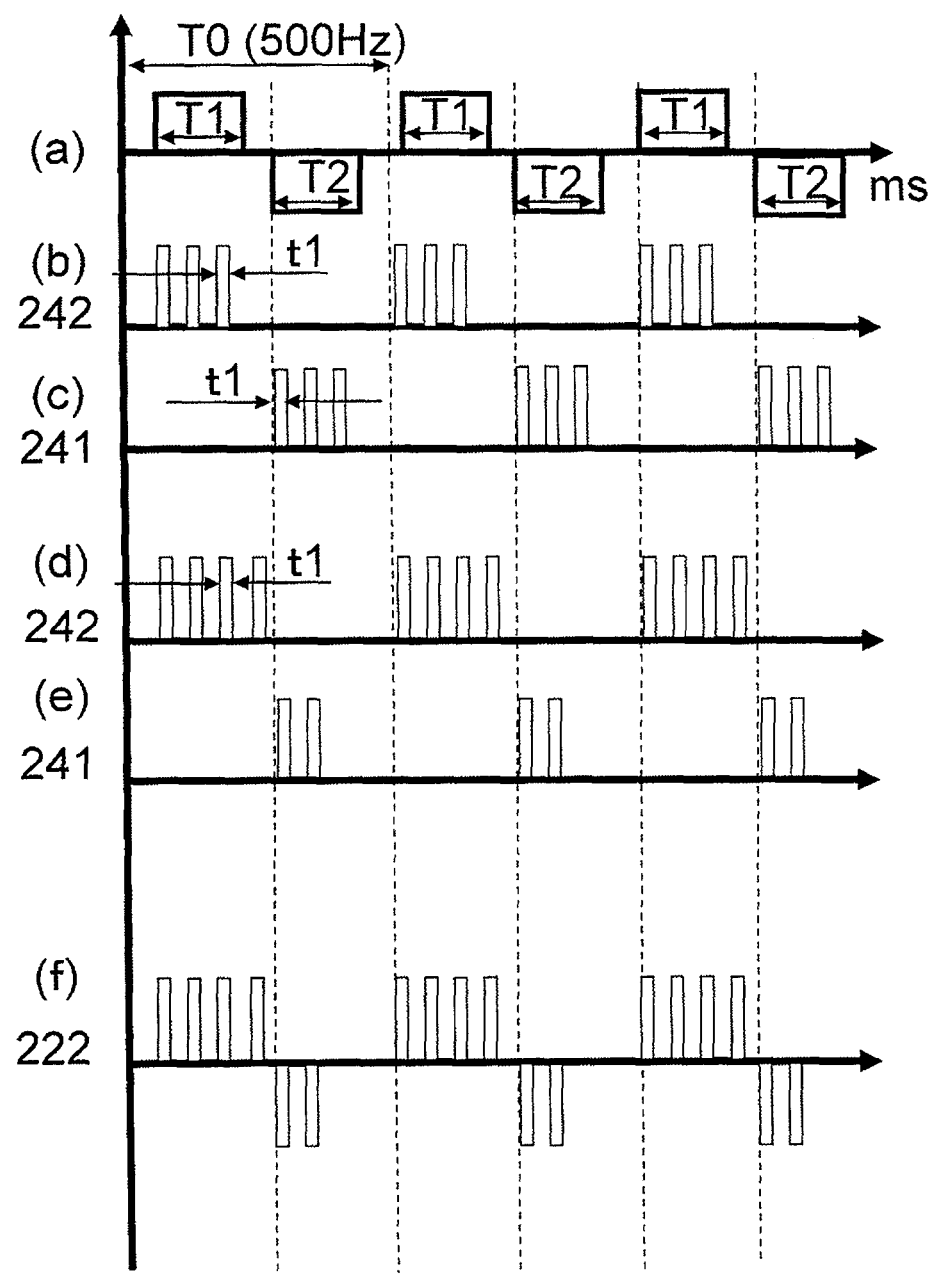
FIG. 11A illustrates waveforms provided in the light control apparatus according to the fourth embodiment.
Figure 11B:
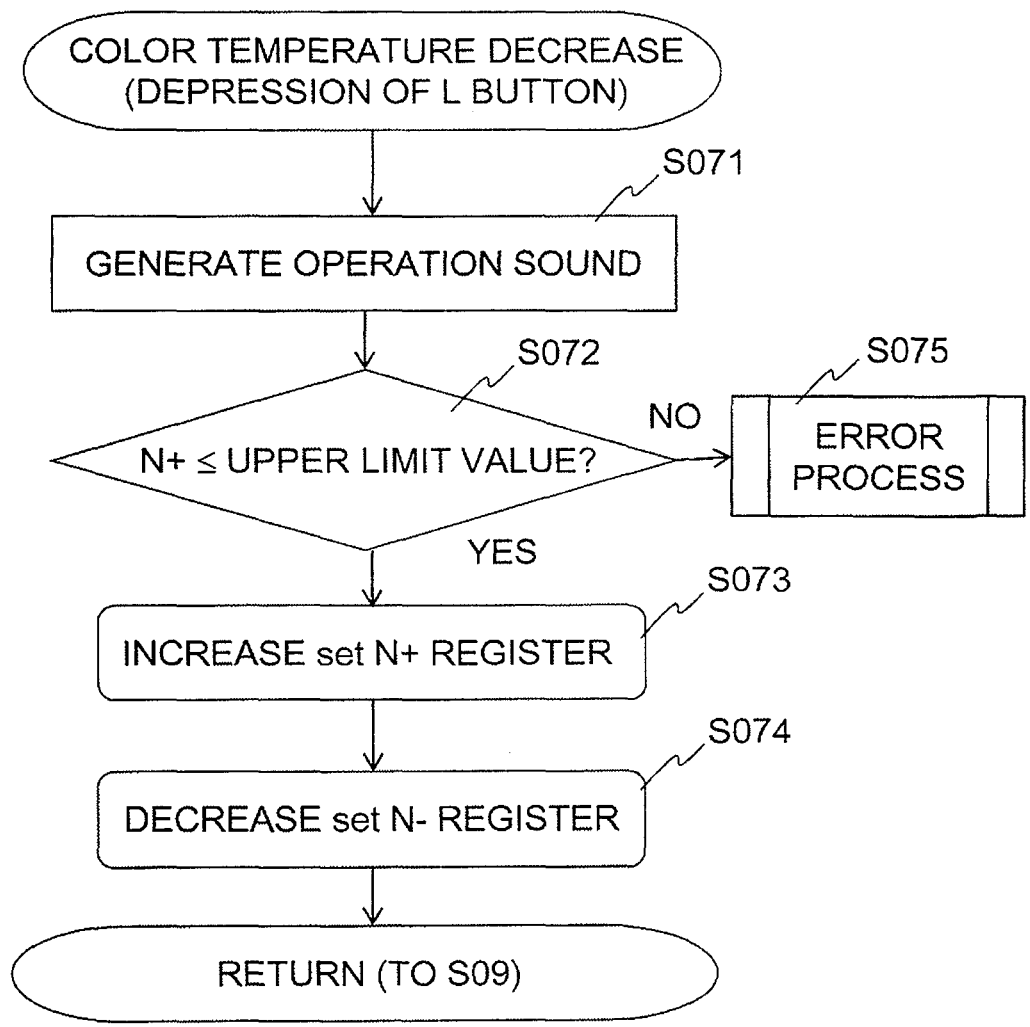
FIG. 11B shows a flow chart illustrating a program process (color temperature-decreasing process) performed by the microprocessor according to the fourth embodiment.

As illustrated in FIG. 11B, when the process is started, an operation sound generating process is performed (Step S071). Subsequently, the microcomputer 180 judges whether or not the value of the set register is less than an upper limit value (Step S072). If the register value of the set N+ register is not less than the upper limit value (S072, NO), an error process is performed (Step S075).

On the contrary, if the register value is less than the upper limit value (S072, YES), the microcomputer 180 adds a predetermined value (for example, "001" of binary number) to the set N+ register (Step S073). On the other hand, the microcomputer 180 subtracts a predetermined value (for example, "001" of binary number) from the set N− register (Step S074). After that, the process returns to Step S09.

The number of pulses outputted to the wiring line 242 is increased as illustrated in FIG. 11A (d), while the number of pulses outputted to the wiring line 241 is decreased as illustrated in FIG. 11A (e) in accordance with Step S073 and Step S074.

As illustrated in FIG. 11A (f), the average value of the positive current supplied to the LED group 22A of the light-emitting device 20 via the wiring line 222 is increased, while the average value of the negative current supplied to the LED group 22B is decreased. As a result, the light amount, which is brought about from the LED group 22A having the low color temperature, is increased, and the light amount, which is brought about from the LED group 22B having the high color temperature, is decreased. Therefore, the color temperature is lowered as a whole to provide a reddish white color.

On the contrary, when the color temperature is raised, the user (operator) depresses the H button of the XY switch 185. Accordingly, a color temperature increasing process of Step S08 (FIG. 11O) is executed after performing the judging process of Step S04 by the microcomputer 180.

As illustrated in FIG. 11C, when the process is started, an operation sound generating process is performed (Step S081). Subsequently, the microcomputer 180 judges whether or not the value of the set N− register is less than an upper limit value (Step S082). If the register value of the set N− register is not less than the upper limit value (S082, NO), an error process is performed (Step S085).

On the contrary, if the register value is less than the upper limit value (S082, YES), the microcomputer 180 subtracts a predetermined value (for example, "001" of binary number) from the set N+ register (Step S083). On the other hand, the microcomputer 180 adds a predetermined value (for example, "001" of binary number) to the set N− register (Step S084). After that, the process returns to Step S09.

The number of pulses outputted to the wiring line 242 is decreased, while the number of pulses outputted to the wiring line 241 is increased in accordance with Step S083 and Step S084. Accordingly, the average value of the positive current supplied to the LED group 22A of the light-emitting device 20 via the wiring line 222 is decreased, while the average value of the negative current supplied to the LED group 22B is increased. As a result, the light amount, which is brought about from the LED group 22A having the low color temperature, is decreased, and the light amount, which is brought about from the LED group 22B having the high color temperature, is increased. Therefore, the color temperature is raised as a whole to provide a bluish white color.

According to the fourth embodiment, it is possible to change the luminance (brightness) and the color tone (color temperature) of the light-emitting device 20 by using the microcomputer 180. The fourth embodiment has been exemplified by the exemplarily illustrated X-Y contact type operation means. However, the same or equivalent effect can be obtained, for example, even when a known contact type rotary encoder or a known optical type rotary encoder is used as the operation means.

Fifth Embodiment

Next, a fifth embodiment will be explained. The fifth embodiment corresponds to a modified embodiment of the fourth embodiment. Therefore, the different feature, which is different from the feature of the fourth embodiment, will be explained, and the common feature will be omitted from the explanation.

The timer 186 illustrated in FIG. 8 is a known one which realizes such functions that any sudden increase in the number of times of depression of the button, which would be otherwise caused against the intent of the operator, is avoided when the operator continuously depresses the button, and the mechanical error such as the chattering or the like is avoided as well.

In the case of the circuit arrangement illustrated in FIG. 8, it is uncertain to which one of the wiring lines 222, 221 the anode terminal (terminal 23A) and the cathode terminal (terminal 23B) of the light-emitting device 20 are connected. Therefore, the polarity exchange switch 290 is added to exchange the polarities of the wiring lines 222, 221 as the output lines of the control unit.

Figure 12:
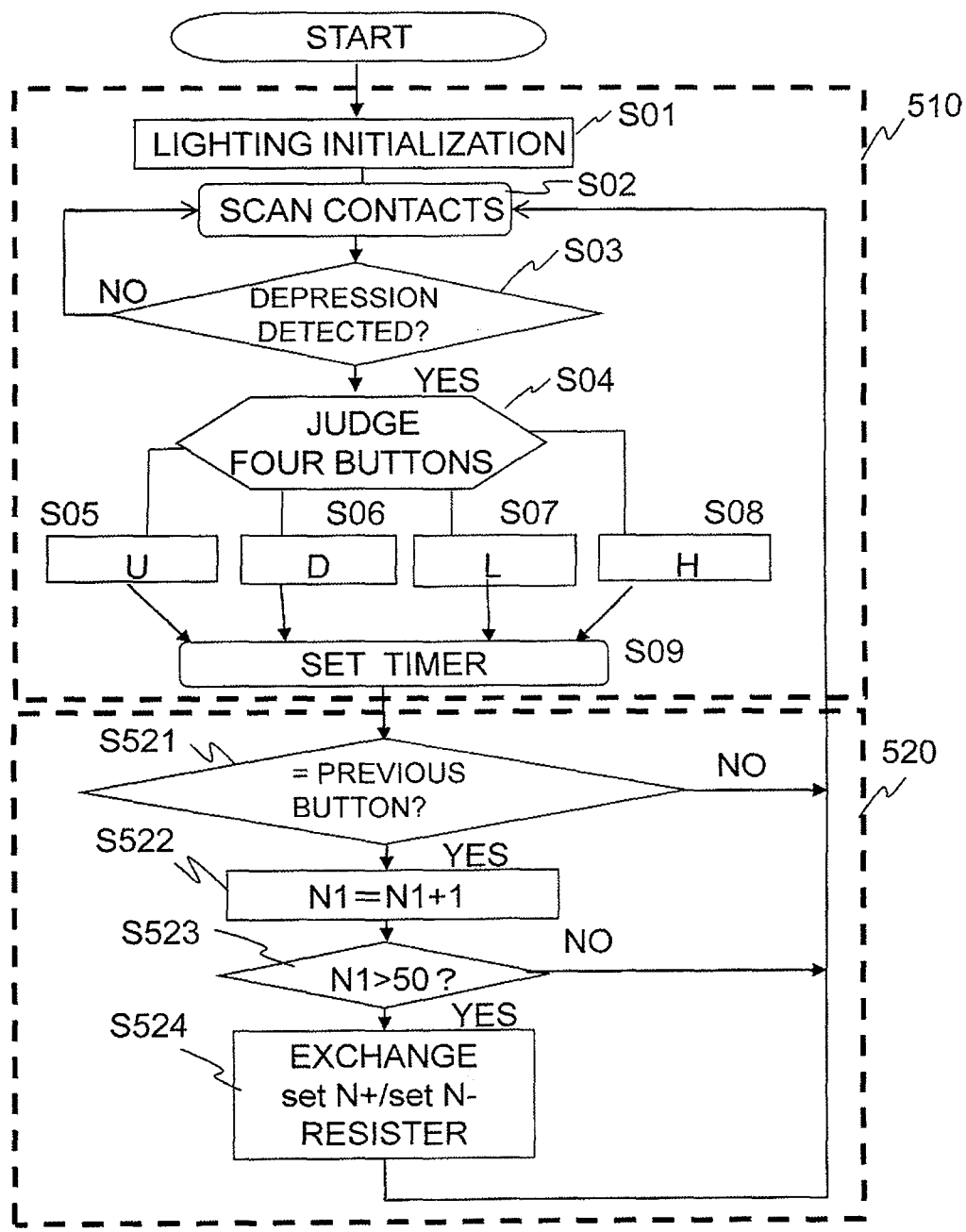
FIG. 12 illustrates a flow chart illustrating a program process (polarity-converting process) performed by a microprocessor according to a fifth embodiment.

The fifth embodiment is illustrative of an example in which the polarity exchange switch 290 is realized by the execution of a program performed by a computer (for example, microcomputer). FIG. 12 shows a flow chart concerning the fifth embodiment.

A block 510 illustrated in FIG. 12 resides in the lighting control program illustrated in FIG. 9B. A block 520 resides in an output polarity exchange program according to the fifth embodiment. When the output polarity exchange program is executed, the microcomputer 180 is operated as follows.

In a routine of "=previous button?" in Step S521, the microcomputer 180 makes comparison with an unillustrated "previous button type storage register". In this arrangement, the previous button type storage register is provided in the microcomputer 180, which stores the code to indicate the type of the button depressed by the user (operator) at last.

If the button type, which is indicated by the previous button type storage register, is not the same as the type of the button depressed this time, then the microcomputer 180 stores the code to indicate the type of the button depressed this time in the previous button type storage register, and then the process returns to Step S02. On the contrary, if the button type, which is indicated by the previous button type storage register, is the same as the type of the button depressed this time (S521, YES), 1 is added to the value N1 of an unillustrated counter (Step S522).

The value of the counter is raised every time when the same button is continuously depressed, and the value of the counter finally arrives at a predetermined value. In the example described in the fifth embodiment, if the operator continuously depresses the same button for 5 seconds or more, then the value N1 of the counter exceeds the predetermined value "50", and the process proceeds to Step S524.

In Step S524, the microcomputer 180 exchanges the output terminal (out+) of "set N+ register" installed in the microcomputer 180 and the output terminal (out−) of "set N− register". Accordingly, the burst pulses, which are based on the value of the set N− register, are outputted from the wiring line 242, and the burst pulses, which are based on the value of the set N+ register, are outputted from the wiring line 241. Accordingly, such a state is given that the AC current, in which the positive and the negative are reversed, is supplied to the wiring line 222. In this arrangement, when the light-emitting device 20 is connected in the reverse (opposite) direction, i.e., when the wiring line 222 is connected to the terminal 23B and the wiring line 221 is connected to the terminal 23A, then the LED group 22B is turned ON (lighted) when the positive driving current is supplied to the wiring line 222, and the LED group 22A is turned ON (lighted) when the negative driving current is supplied. However, as described above, the corresponding relationship between the register value and the LED group is the same as that provided in the normal connection. Therefore, even in the case of the reverse (opposite) connection, the light-emitting device 20 performs the lighting operation in the same manner as in the normal connection. Therefore, in the fifth embodiment, it is possible to omit the polarity exchange switch 290. According to the fifth embodiment, a staff in charge of the installation construction work can perform the switching into the state in which the wiring lines 222, 221 and the terminals 23A, 23B are connected substantially normally, by operating the XX switch 185 so that the direction of the color modulation (increase/decrease in color temperature) is coincident with the indication of the light modulation/color modulation apparatus judging from the result of the lighting owing to the output polarity exchange function as described above.

Sixth Embodiment

Next, a sixth embodiment will be explained. The sixth embodiment has the common feature which is common to the feature of the fourth and fifth embodiments. Therefore, the different feature, which is different from the feature of the fourth embodiment, will be explained, and the common feature will be omitted from the illustration.

The temperature coefficient of the equivalent resistance value is negative in the light-emitting device 20 in many cases. It is feared that the light-emitting device 20 may suffer from the self-destruction loop such that if the temperature of the installation place is raised, then the equivalent resistance value is lowered, the current value is raised, and the device temperature is increased. It is known to be effective that a feedback loop is provided for the driving circuit in order to reliably avoid the inconvenience. In the sixth embodiment, a feedback loop is added to the arrangement of the fourth embodiment.

Figure 13:
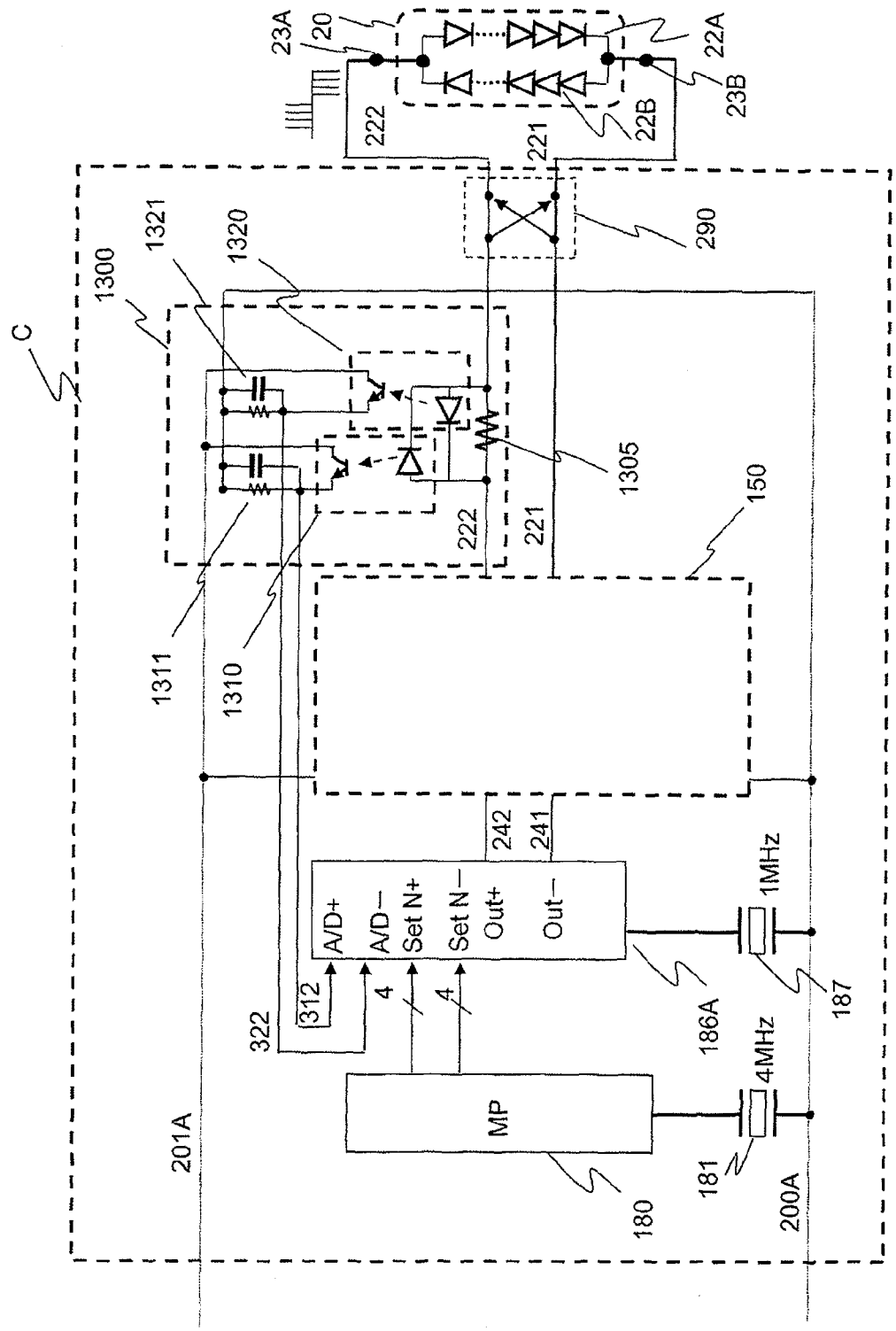
FIG. 13 illustrates an exemplary partial circuit arrangement of a light control apparatus for a white LED light-emitting device according to a sixth embodiment.

FIG. 13 illustrates an exemplary circuit arrangement according to the sixth embodiment. FIG. 14 illustrates a flow chart illustrating a microcomputer process according to the sixth embodiment. In FIG. 13, the input terminal 10, the main power source switch 141, the power source circuit 140, and the XY switch 185 illustrated in FIG. 8 are omitted from the illustration.

With reference to FIG. 13, a lighting control circuit C has a drive current detection circuit 1300 for realizing the constant current drive. The drive current detection circuit 1300 includes a resister 1305, photocouplers 1310, 1320 each of which is optically independent, and integration circuits 1311, 1321 each of which includes a resister and a capacitor (condenser).

The resistor 1305 has a resistance value of, for example, about 5Ω to generate the voltage of 0.5 to 5.0 V proportional to the current value of 0.1 to 1.0 A of the light-emitting device 20. The photocouplers 1310, 1320 are connected in parallel to the resistor 1305. A diode is provided on the input side of each of the photocouplers 1310, 1320. Therefore, the combined transistor is in conduction only in the case of the forward direction of each of them.

Therefore, the photocoupler 1310 is in conduction when the positive current, which is applied to drive the LED group 22A, is allowed to flow through the wiring line 222. The photocoupler 1320 is in conduction only when the negative current, which is applied to drive the LED group 22B in the reverse (opposite) connection, is allowed to flow through the wiring line 222. As for the conduction of the photocouplers 1310, 1320, the integration circuit 1311 and the integration circuit 1321 are charged independently. As a result, the voltage, which is proportional to the average value of the positive current, is observed on the wiring line 312. The voltage, which is proportional to the average value of the negative current, is observed on the wiring line 322.

The observed voltage is principally proportional to the average value of the pulse current allowed to flow through the wiring line 222 as the control output line. However, the voltage simultaneously makes response to the fluctuation of the DC component generated, for example, by the temperature change as well. The analog value is led to a microcomputer (MP) 186A (instead of the timer 186 in FIG. 8) via the independent wiring lines 312, 322.

In the MP 186A, the analog value is converted into 4-bit digital numerical value expression of 16 digits (values) which is stored in an unillustrated internal register, by means of an unillustrated internal analog/digital converter. The respective voltage values (digital values), which are fed from the wiring line 312 and the wiring line 322 to be stored in the internal register, have the same expression form as that of the set N+ register and the set N− register. The value, which is exhibited by each of the set N registers, indicates the voltage value corresponding to the driving current supplied to each of the LED groups 22A, 22B via the wiring line 222.

Figure 14A:
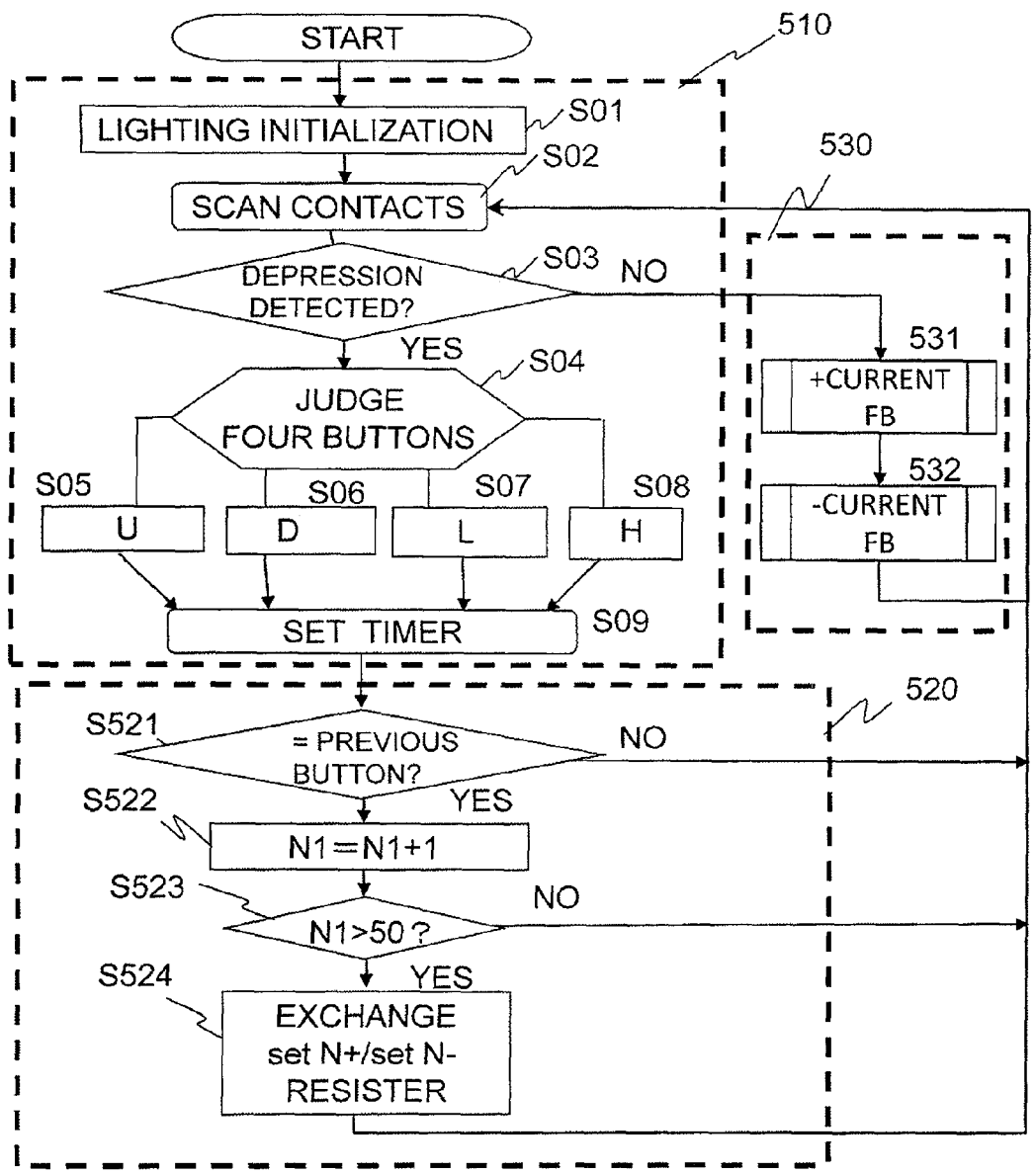
FIG. 14A illustrates a flow chart illustrating a program process (feedback control) performed by a microprocessor according to the sixth embodiment.
Figure 14B:
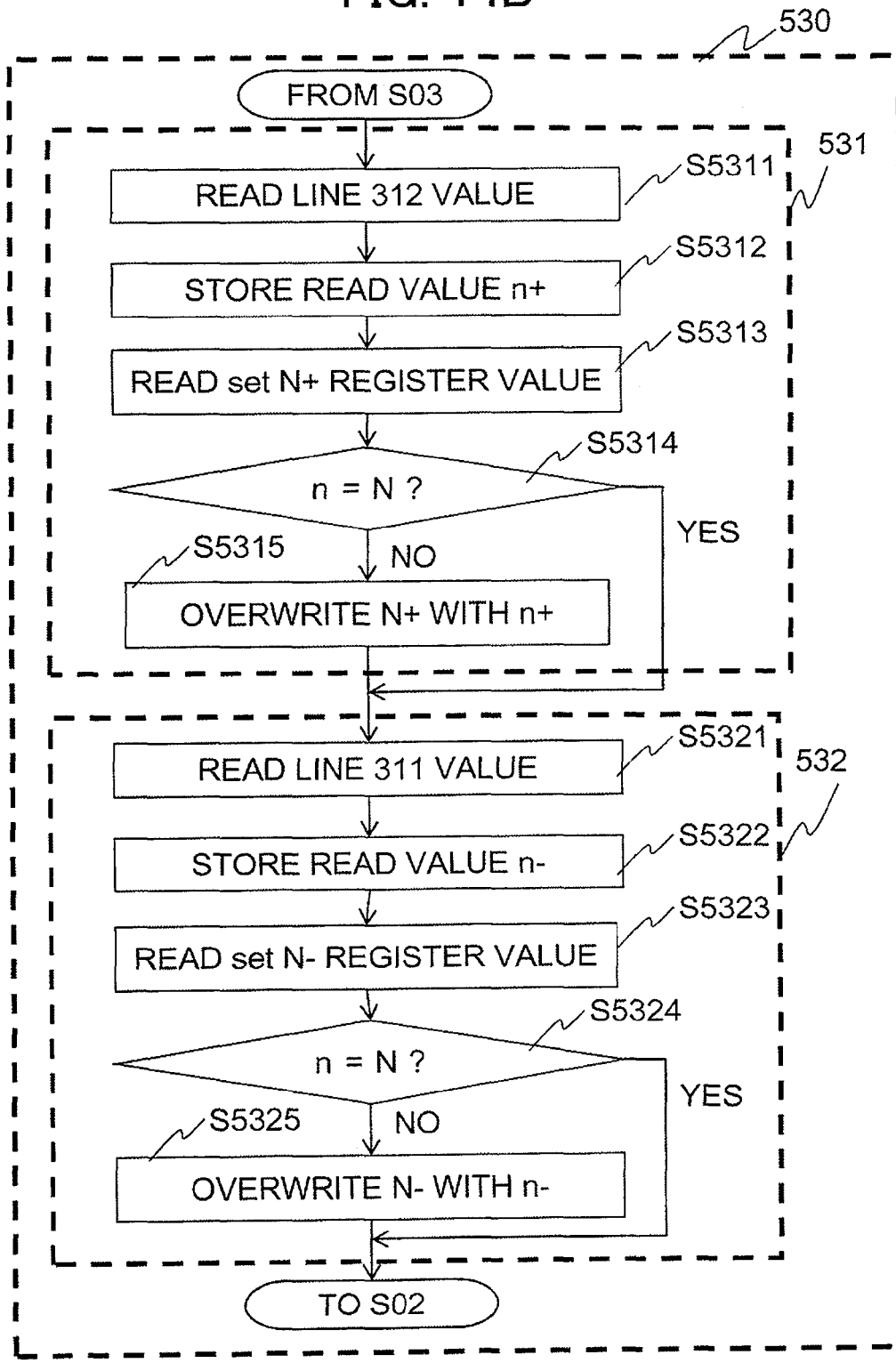
FIG. 14B illustrates a flow chart illustrating the program process (feedback control) performed by the microprocessor according to the sixth embodiment.

After that, the operation, which corresponds to the execution of the program by the microcomputer 440A, is performed as illustrated in FIGS. 14A and 14B. A block 530 illustrated in FIG. 14 resides in a constant current driving routine which is composed of a positive current feedback routine 531 and a negative current feedback routine 532. The constant current driving routine 530 is started when the button of the XX switch 185 is not depressed (S03, NO) in the contact scanning operation (Step S02).

In the constant current driving routine 530, as illustrated in FIG. 14B, the microcomputer 186A reads the voltage value inputted from the wiring line 312 (Step S5311), and the value n+ (first feedback register value), which is obtained by performing the A/D conversion, is stored in a temporary register (internal register) (Step S5312). Subsequently, the register value N+, which is held in the set N+ register, is read (Step S5313) to compare the register value N+ and the internal register value n+ (Step S5314). If the values are identical with each other, the process proceeds to Step S5321 while skipping Step S5315. If the values are different from each other, then the value of the set N+ register is overwritten with the internal register value n+ (Step S5315), and the positive current feedback routine 531 comes to an end.

The same or equivalent process is also performed in the negative current feedback routine 532. As illustrated in FIG. 14B, the process, which is the same as or equivalent to that of the routine 531, is performed in the routine 532. That is, the microcomputer 186A reads the voltage value n− of the wiring line 322 (Step S5321), and the value n− (second feedback register value), which is obtained by performing the A/D conversion, is stored in the temporary register (internal register) (Step S5322). Subsequently, the register value N−, which is held in the set N− register, is read (Step S5323) to compare the register value N− and the internal register value n− (Step S5324). If the values are identical with each other, the process skips Step S5325. If the values are different from each other, then the value of the set N− register is overwritten with the internal register value n− (Step S5325), and the negative current feedback routine 532 is completed. The completion of the respective routines 531, 532 results in the waiting state (Step S02) in which the state of the XY switch 185 is subjected to the scanning.

According to the first to sixth embodiments described above, it is possible to effect the connection with the two terminals 23A, 23B possessed by the light-emitting device 20 irrelevant to whether the light-emitting device 20 is the LED bulb or the LED light emission module and irrelevant to whether the light-emitting device 20 is assembled as the light-emitting device equipment or constructed as the bulb. It is possible to adjust the luminance and the color temperature of the light-emitting device 20 by controlling the driving current supply with respect to the LED groups 22A, 22B having the different polarities possessed by the light-emitting device 20.

This fact has such an advantage that the light modulation and the color modulation of the light-emitting device 20 can be realized by utilizing the wiring lines having been already equipped in the building. An advantage is also provided such that any special wiring line, which includes, for example, those based on the three-wire system and the four-wire system, is unnecessary even when the light-emitting device 20 is installed in a newly-built building to realize the light modulation and the color modulation functions.

Further, an advantage is provided such that the means for controlling the light modulation and the color modulation of the light-emitting device 20 can be realized in a form of an "intermediate switch" inserted into an intermediate portion of a power source cord as in the desk (table) illumination equipment.

An advantage is exhibited in the most useful form of utilization when a plurality of bulb sockets are connected in parallel and installed on a ceiling in an existing building, a flashing switch is installed in a form of being embedded in a wall, and the commercial AC power source is supplied to a flashing switch box.

In this case, the light modulation function and the color modulation function can be realized without requiring any change of the wiring lines, merely by exchanging the incandescent bulb with the light-emitting device 20 which performs the light emission at the two types of color temperatures as explained in the embodiment of the present invention, and exchanging the flashing switch with the light modulation/color modulation apparatus as explained in the embodiment of the present invention.

The first to sixth embodiments can be specified as an illumination system which includes an illumination apparatus including a set of LED element groups having different light emission wavelengths and a light control apparatus for supplying a driving current to the illumination apparatus, the light control apparatus comprising an individual electric power control unit which controls individual electric powers to be supplied to the respective LED element groups respectively on an identical time base, and a total electric power control unit which increases/decreases a total value of the individual electric powers supplied to the set of LED element groups without changing a ratio between the individual electric powers.

The light control apparatus of the illumination system may further comprise switching means which switches polarities of the individual electric powers to be supplied to the respective LED element groups respectively so that a positive driving current is supplied as the individual electric power to be supplied to one of the set of LED element groups connected in parallel while providing the opposite polarity and a negative driving current is supplied as the individual electric power to be supplied to the other of the set of LED element groups.

The individual electric power control unit may independently control the individual electric powers to be supplied to the respective LED element groups respectively.

Further, the light control apparatus of the illumination system may further comprise an operation unit which imparts an operation amount for allowing the individual electric power control unit to determine the individual electric power on one hand and which imparts an operation amount for allowing the total electric power control unit to increase/decrease the total value on the other hand.

The LED light modulation circuit as explained in the first to sixth embodiments described above may be included as an embodiment of the light control apparatus. For example, the triac 30 of the LED light modulation circuit according to the first embodiment illustrated in FIG. 1 can function as switching means for switching the polarity of the individual electric power (driving current) to be supplied to the white LED light-emitting device 20 (corresponding to the illumination apparatus) including the set of LED element groups 22A, 22B described above.

The trigger diode 40 and the time constant circuit 50 of the LED light modulation circuit according to the first embodiment can function as control means for controlling the driving electric power to be supplied to each of the set of LED element groups 22A, 22B. The variable resistors 53, 63, which are included in the time constant circuit 50, can function as the individual electric power control unit for controlling the individual electric power (average electric power) to be supplied to each of the LED element groups 22A, 22B on the same time base (time axis). That is, the timing at which the trigger diode 40 is turned ON, i.e., the timing at which the triac 30 is ignited is controlled by each of the resistance values of the variable resistors 53, 63. Accordingly, the ignition time of the triac 30 is controlled in the respective positive and negative half cycles of the AC current on the same time base (see FIGS. 2 (A) and 2 (B)). As a result, the driving current amount (corresponding to the individual electric power (average electric power)), which is supplied to each of the LED groups 22A, 22B, is controlled. The respective resistance values of the variable resistors 53, 63 can be adjusted by the operation unit individually (independently from each other). It is also possible to control the respective individual electric powers independently (individually).

Further, it is possible to change (increase/decrease) the total electric power (total value of the individual electric powers) with respect to the set of LED element groups 22A, 22B without changing the ratio between the individual electric powers by means of the operation in which the respective resistance values of the variable resistors 53, 63 are changed so that the ratio of the electric power amount (average electric power) between the positive and the negative is not changed. That is, the variable resistors 53, 63 also function as the total electric power control unit.

In the LED light modulation circuit according to the second embodiment (FIG. 3), the triac 30 can function as the switching means for the light control apparatus, and the time constant circuit 50 and the trigger diode 40 can function as the control means for the driving current. The variable resistor 64, which is included in the time constant circuit 50 in the second embodiment, functions as the individual electric power control unit, and the variable resistor 51A functions as the total electric power control unit. That is, the ignition timing of the triac 30 is changed in the AC positive and negative half cycles depending on the position of the movable point T of the variable resistor 64, and the ratio between the driving currents (individual electric powers) supplied to the respective LED elements 22A, 22B is changed. Accordingly, the individual electric power is controlled on the same time base. The ignition timing is advanced or delayed approximately to an identical extent in both of the positive and negative cycles by increasing/decreasing the resistance value of the variable resistor 51A. Accordingly, the total value of the individual electric powers is increased/decreased without changing the ratio between the individual electric powers.

In the LED light modulation circuit according to the third embodiment (FIG. 5), the driving circuit 120 functions as the switching means for the light control apparatus, and the duty ratio adjusting circuit 110 and the driving pulse generating/varying circuit 130 function as the control means. The duty ratio adjusting circuit 110 can function as the individual electric power control unit for determining the positive and negative individual electric powers supplied to respective LES's 22A, 22B by means of the driving circuit 120 as illustrated in FIG. 6 (d) in accordance with the operation of the variable resistor 61A. The driving pulse generating/varying circuit 130 can function as the total electric power control unit for changing the total electric power (total value of the individual electric powers) supplied to the set of LED's 22A, 22B without changing the ratio between the individual electric powers by changing the pulse width without changing the number of pulses (see FIG. 7, (a), (b), (c)).

Further, in the LED light modulation circuits according to the fourth and sixth embodiments (FIGS. 8 and 13), the control circuit 150 can function as the switching means for the light control apparatus, and the microcomputer 180 can function as the control means for the driving current. The microcomputer 180 can function as the individual electric power control unit for controlling the individual electric powers supplied to respective LED's 22A, 22B on the same time base by generating the pulses corresponding to the "set N+ register" value and the "set N− register" value (see FIG. 10A, (a) to (f)). The value of only one of the respective register values can be changed. Accordingly, the individual electric powers can be controlled independently from each other. On the other hand, the microcomputer 180 may function as the total electric power control unit for changing the total electric power (total amount of the individual electric powers) without changing the ratio between the individual electric powers with respect to respective LED's 22A, 22B by increasing/decreasing the values of "set N+ register" and "set N− register" depending on the instruction signal for the increase/decrease in the light amount so that the ratio therebetween is not changed (see FIG. 11A, (a) to (f)). Further, the XY switch 185 may function as the operation unit.

In the meantime, when the driving electric power is supplied in the pulses to each of the LED elements 22A, 22B as in the third, fourth, and sixth embodiments, it is preferable that the pulse frequency is at least not less than 50 Hz, usually not less than 60 Hz, preferably not less than 100 Hz, more preferably not less than 120 Hz, and especially preferably not less than 150 Hz. When the pulse frequency is raised, it is possible to avoid the flicker (flickering) of the LED element group subjected to the light emission.

In the first and second embodiments, the individual electric powers (driving currents), which are supplied in the positive and negative half cycles (positive and negative periods of time), are controlled by controlling the ignition timing of the triac 30 as the technique for controlling the individual electric powers on the time base (time axis). On the other hand, in the third embodiment, the reference voltage (slice level) is increased/decreased by operating the resistance value of the variable resistor 61A in order to control the positive and negative individual electric powers on the time base (time axis). Accordingly, the ratio between the positive and negative periods of time is changed in 1 cycle, and the number of pulses is changed in each of the periods of time. Thus, the individual electric power is controlled. Further, in the fourth and sixth embodiments, the number of pulses can be independently controlled in each of the positive and negative periods of time in 1 cycle in order to control the positive and negative individual electric powers on the time base (time axis).

According to the embodiments as described above, the electric power, which is to be supplied to each of the set of LED elements, can be controlled on the time base. Therefore, it is possible to realize the light modulation control and the color modulation control having the high electric power efficiency in which the electric power loss is in a small amount.

In the first to sixth embodiments, the LED light control circuit (light control apparatus) is illustrative of the driving of the white LED light-emitting device 20 (LED illumination apparatus). The LED light modulation circuits according to the first to sixth embodiments are directed to the control objective (target) of the "set of LED element groups having the different light emission wavelength regions" or the illumination apparatus including the set of LED element groups as described above. The phrase "having different light emission wavelengths" means the difference in the chromaticity, which includes not only the difference in the hue but also the difference in the color temperature and the difference in the spectrum distribution. In this way, the light control apparatus as described above is applicable to any light-emitting device other than the white LED light-emitting device. The LED element, which is the objective in relation to the illumination system, can include LED based on the use of an inorganic material and LED based on the use of a GaN-based material. Any element, in which inorganic material LED is coated or covered with a fluorescent member or fluorescent substance to obtain the light having a desired wavelength, is also included in the LED element. Further, the LED element may also include organic EL (organic light-emitting diodes (OLEDs)).

Seventh Embodiment

Next, an illumination system according to a seventh embodiment of the present invention will be explained. The illumination system includes a light control apparatus and an LED illumination apparatus. The illumination apparatus according to the seventh embodiment is different from the white light-emitting device 20 as explained in the first to sixth embodiments in which the set of LED element groups are connected reversely in parallel. It is premised that a set of LED groups are connected in parallel in the forward direction, and the driving current is simultaneously supplied to one LED group and the other LED group respectively.

The seventh embodiment has the constitutive components which are common to those of the fourth embodiment. Therefore, the same constitutive components are designated by the same reference numerals, any explanation of which is omitted.

Figure 15:
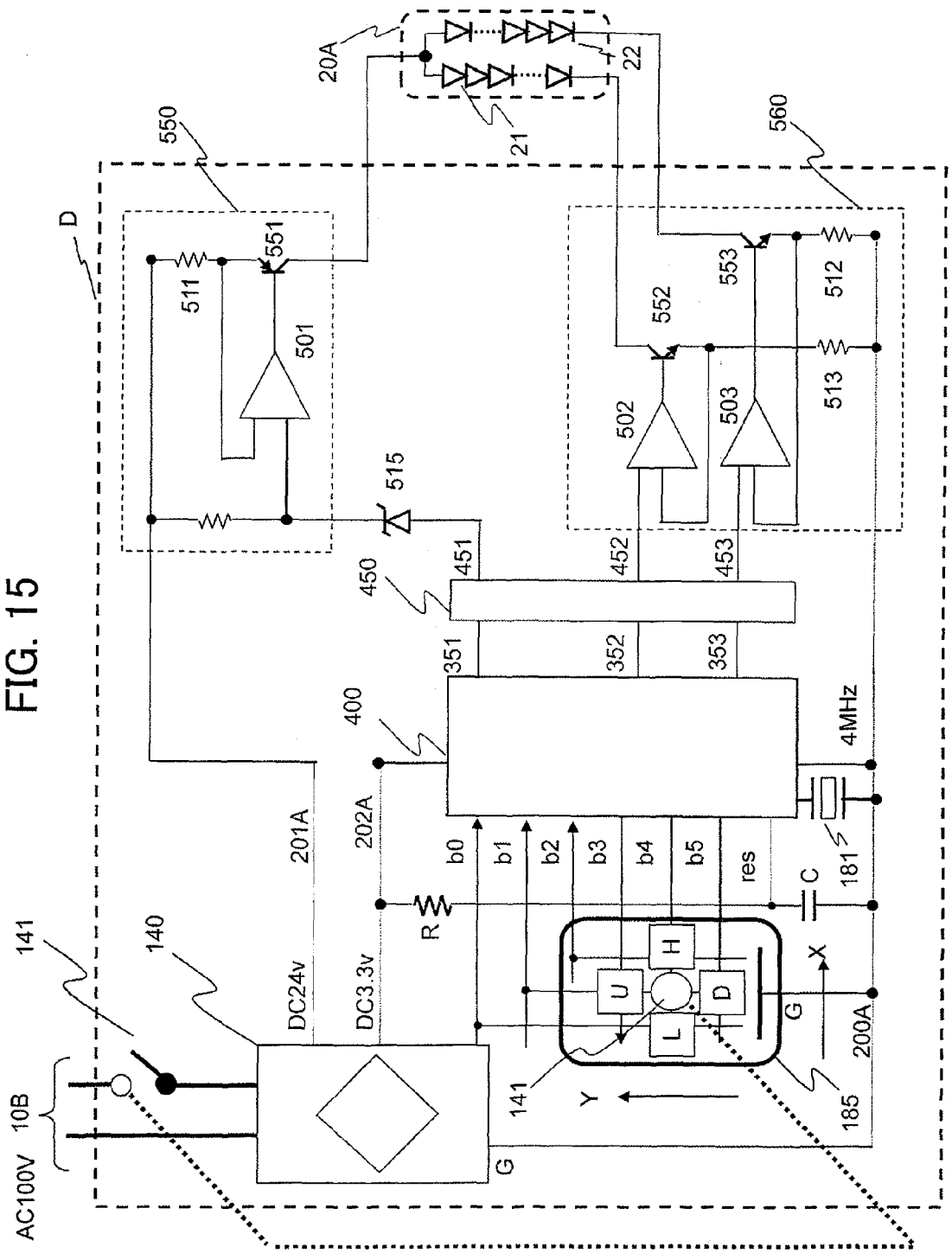
FIG. 15 illustrates an exemplary arrangement of an illumination system according to a seventh embodiment.

FIG. 15 illustrates an exemplary arrangement of the illumination system according to the seventh embodiment. Those provided in FIG. 15 are a light-emitting device 20A which serves as an LED illumination apparatus, and a lighting control apparatus (light control apparatus) D which supplies the driving current to the light-emitting device 20A.

The light-emitting device 20A includes LED groups 21, 22 which are connected in parallel in the forward direction. The light-emitting device 20A has such a structure that the LED group 21 is arranged while directing the polarity in the reverse (opposite) direction (forward direction) as compared with the light-emitting device 20 (FIG. 8). Therefore, the LED group 21 corresponds to the LED group 22B, and the LED group 22 corresponds to the LED group 22A. Therefore, the Kelvin temperature of the LED group 21 is higher than that of the LED group 22, although both of the LED group 21 and the LED group 22 emit the white light.

With reference to FIG. 15, the lighting control apparatus D comprises a commercial AC supply line 10B, a power source switch 141, a two-output type full-wave rectification circuit 140, a light modulation operation panel based on the use of a matrix type push-button switch (XY switch 185), and a microcomputer (microprocessor) 400 (corresponding to the microprocessor 180 as illustrated in FIG. 8). The supply line 10B, the power source switch 141, the power source circuit 140, and the XY switch 185 are the same as or equivalent to those of the fourth embodiment (FIG. 8). The microcomputer 400 also performs the operation which is the same as or equivalent to that of the fourth embodiment.

On the other hand, the lighting control apparatus D is provided with a constant current circuit 550 and a current balance circuit 560 in place of the H-type full bridge control circuit 150 (FIG. 8). A digital/analog converter (D/A converter) 450 is provided in place of the timer (register group) 186.

The constant current circuit 550 includes an operation amplifier 501, a resistor 511, and a transistor 551. The current balance circuit 560 includes operation amplifiers 502, 503, resistors 512, 513, and transistors 552, 553.

The microcomputer 400 is connected to the D/A converter 450 via wiring lines 351, 352, 353. The D/A converter 450 is connected to the terminal of the operation amplifier 501 via a wiring line 451 and a Zener diode 515. The D/A converter 450 is connected to one terminal of the operation amplifier 502 via a wiring line 452, and the D/A converter 450 is connected to one terminal of the operation amplifier 503 via a wiring line 453.

In the lighting control apparatus D as described above, when an operator intends to increase the luminance and depresses UP button (U) included in the light modulation buttons, then the microcomputer 400 detects the depression, and the 4-bit value (luminance control signal), which is outputted from the line 351, is decreased, for example, from "1000" to "0111". The D/A converter 450 generates the analog electric potential corresponding to the 4-bit value on the wiring line 451.

As a result, the analog electric potential of the wiring line 451 is lowered, and the base electric potential of the transistor 551, which is the output of the operation amplifier 501, is also lowered. The emitter current of the pnp transistor 551 is increased. Therefore, the total current, which is supplied to the respective LED's 21, 22 of the LED illumination apparatus (light-emitting device) 20, is increased, and the light, which is emitted from the light-emitting device 20, becomes brighter than that having been previously emitted (luminance is raised). When DOWN button (D) included in the light modulation buttons is depressed, then the action, which is reverse to the foregoing action, is caused, and the light, which is emitted from the light-emitting device 20, becomes dark.

When the operator intends to increase the color temperature and depresses the right (HIGH) button (H) included in the light modulation buttons, then the microcomputer 400 detects the depression, and the 4-bit value (color temperature control signal for LED 21), which is outputted from the line 352, is increased, for example, from "1000" to "1001", while the 4-bit value (color temperature control signal for LED 22), which is outputted from the wiring line 353, is decreased, for example, from "1000" to "0111". The D/A converter 450 generates the analog electric potential corresponding to the 4-bit value of the wiring line 352 on the wiring line 452, while the D/A converter 450 generates the analog electric potential corresponding to the 4-bit value of the wiring line 353 on the wiring line 453.

As a result, the analog electric potential of the wiring line 452 is raised, and the base electric potential of the npn transistor 552, which is the output of the operation amplifier 502, is also raised. The collector current of the npn transistor 552 is increased. On the other hand, the base electric potential of the npn transistor 553, which is the output of the operation amplifier 503, is lowered, and the collector current of the npn transistor 553 is decreased.

Therefore, the light amount of the LED group 21 having the high color temperature is larger than the light amount of the LED group 22 having the low color temperature. A bluish pale blue color is provided as a whole. When the decrease in the color temperature is intended, and LOW button (L) is depressed, then the action, which is reverse to the foregoing action, is caused. The light amount of the LED group 21 is decreased, and the light amount of the LED group 22 is increased. Thus, the light emission color temperature of the light-emitting device 20 is lowered. In accordance with the operation as described above, the light emission of the light-emitting device 20 can be adjusted to provide any arbitrary luminance and any arbitrary color temperature.

Eighth Embodiment

Next, an eighth embodiment will be explained. A semiconductor light-emitting apparatus (package) and a light-emitting module, which constitute an illumination apparatus applicable to the seventh embodiment, are explained in the eighth embodiment. Further, the supply of the individual electric power and the total electric power, which is distinct from that explained in the seventh embodiment, is explained in the eighth embodiment.

Figure 16A:
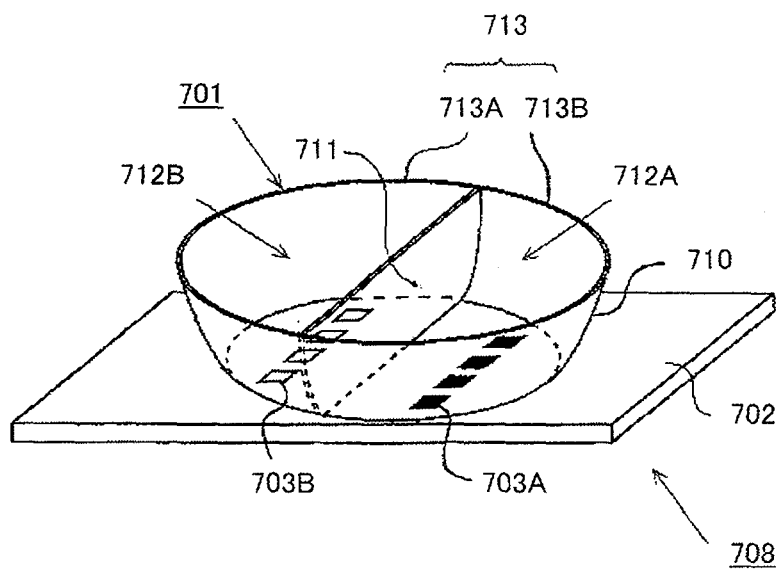
FIG. 16A illustrates a perspective view illustrating a schematic arrangement of a package included in a semiconductor light-emitting apparatus or device (white LED) for constructing a light-emitting module.
Figure 16B:
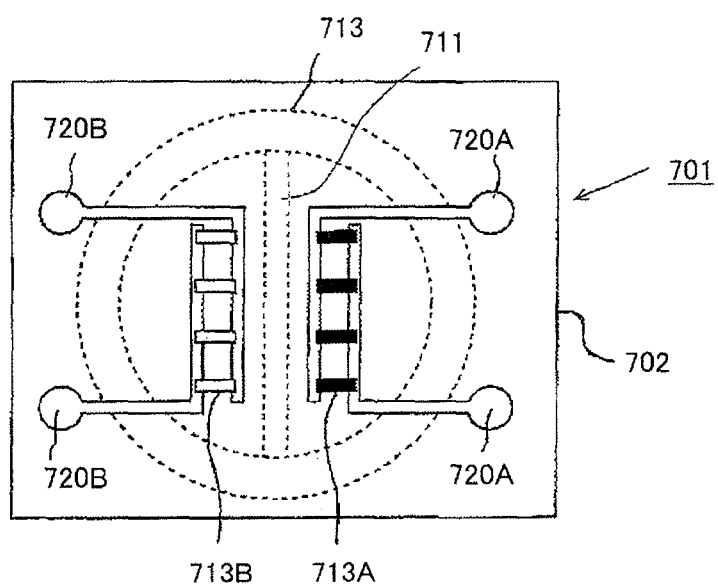
FIG. 16B illustrates a mounted state of wiring lines for supplying the electric power to semiconductor light-emitting elements (LED chips) provided in the package.
Figure 16C:
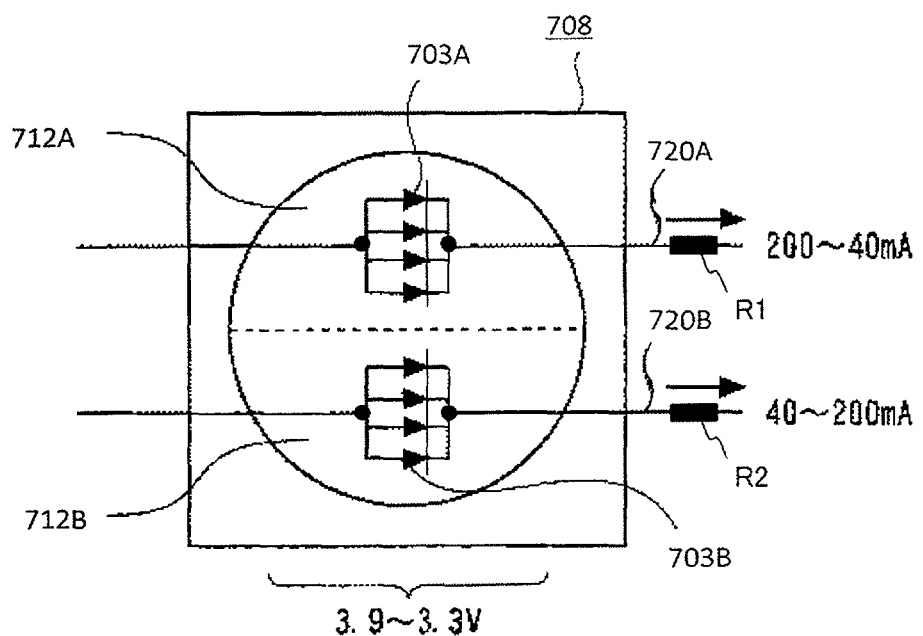
FIG. 16C illustrates the package illustrated in FIGS. 16A and 16B as schematically illustrated by using electrical symbols.

FIG. 16A illustrates a perspective view illustrating a schematic arrangement of a package 701 included in a semiconductor light-emitting apparatus (hereinafter referred to as "white LED") 708 for constructing a light-emitting module 730 (see FIG. 21 described later on). FIG. 16B shows a mounted state of wiring lines 720A, 720B for supplying the electric power to semiconductor light-emitting elements (LED elements, hereinafter referred to as "LED chips") 703A, 703B provided in the package 701. FIG. 16C shows the package 701 illustrated in FIGS. 16A and 16B as schematically illustrated by using electrical symbols. Further, FIG. 17 shows a sectional view illustrating the white LED 708 illustrated in FIG. 16A as sectioned along a plane including the wiring lines 720A, 720B.

As illustrated in FIG. 16A, the white LED 708 is constructed to include the package 701. The package 701 has an annular reflector 710 which is truncated cone-shaped and which is arranged on a substrate 702. The reflector 710 has a function to guide a part of the output light outputted from respective divided area portions 712 described later on in the emission (radiation) direction of the white LED 708, and the reflector 710 also functions as a main body of the package 701. The upper surface side of the truncated cone shape of the reflector 710 is disposed in the emission direction of the light emitted by the white LED 708, on which an opening 713 is formed. On the other hand, the substrate 702 is arranged on the lower surface side of the truncated cone shape of the reflector 710, and wiring lines, which are provided to supply the electric power to the LED chips, are laid, for example, on the lower surface side, although details will be described later on (the wiring lines are not illustrated in FIG. 16A).

Figure 17:
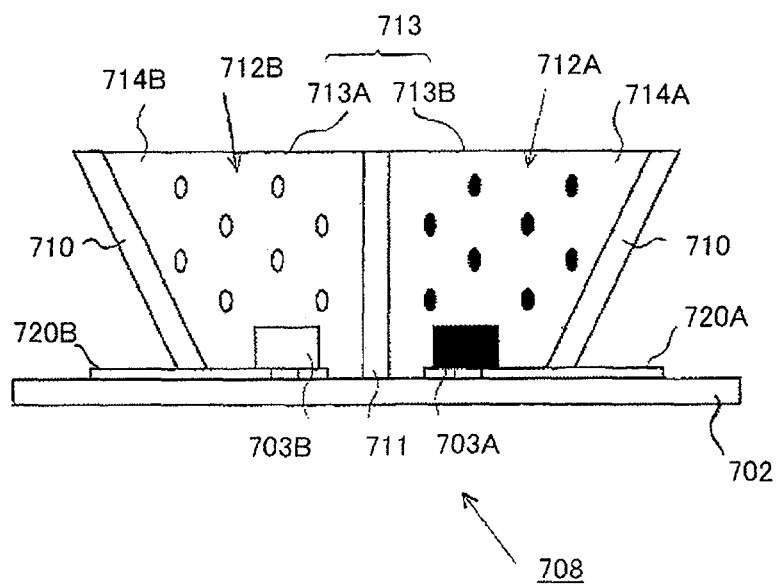
FIG. 17 illustrates a sectional view illustrating white LED illustrated in FIG. 16A as sectioned along a plane including the wiring lines.

A partition 711, which divides the internal space of the annular reflector 710 equivalently into two areas as illustrated in FIGS. 16A and 17, is provided perpendicularly to the substrate 702. Two divided area portions 712A, 712B are defined in the reflector 710 by the partition 711. Further, an opening of the divided area portion 712A occupies the right half of the opening 713 of the reflector 710, and an opening of the divided area portion 712B occupies the left half of the opening 713 of the reflector 710. In this application, the opening of the divided area portion 712A is referred to as "divided opening 713A", and the opening of the divided area portion 712B is referred to as "divided opening 713B". That is, the opening 713 is divided by the partition 711 into the divided openings 713A, 713B.

However, the shapes of the divided area portions 712A, 712B in the package 701 are not limited to the structure in which the perpendicular wall is provided as the partition 711. The divided area portions 712A, 712B may be depressions or recesses which have shapes of, for example, truncated cones, truncated pyramids, or hemispheres respectively. It is not essential that the shapes and the internal volumes of the both divided area portions 712A, 712B should be identical with each other as well.

The package 701 illustrated in FIG. 16A is such a structural member that the divided area portions 712A, 712B are included in the integrated member. However, it is not essential to use such a package 701. Two structural members (packages), which are provided with the structures as the divided area portions, may be juxtaposed, wherein one of them can be allowed to function as the divided area portion 712A, and the other can be allowed to function as the divided area portion 712B.

Four LED chips 703A and four LED chips 703B are provided in the divided area portions 712A, 712B illustrated in FIG. 16A respectively. The LED chips 703A, 703B (referred to as "LED chips 703" when the LED chips are referred to generally or inclusively) are connected respectively to wiring lines 720A, 720B (referred to as "wiring lines 720" generally or inclusively in some cases) which form a pair. The light emission is effected by receiving the electric power supply. The LED chips 703 are connected to the wiring line 720 in each of the divided area portions as illustrated in FIG. 16B. That is, the four LED chips 703A are mounted on the wiring line 720A, and the four LED chips 703B are mounted on the wiring line 720B. The four LED chips 703, which are provided in each of the divided area portions, are connected in parallel in the forward direction with respect to the corresponding wiring line.

Those applicable as the LED chip include an ultraviolet LED chip which emits the ultraviolet wavelength (light emission peak wavelength: 300 to 400 nm), a purple LED chip which emits the purple light (light emission peak wavelength: 400 to 440 nm), and a blue LED chip which emits the blue light (light emission peak wavelength: 440 nm to 480 nm). The number of LED chips 703 provided in each of the divided area portions 712A, 712B is, for example, 1 to 10. The number of LED chips 703 may be appropriately determined depending on the chip size and the required brightness. As for the type or types of the LED chips 703 provided in each of the divided area portions 712A, 712B, the LED chips 703 of the same type may be provided, or the LED chips 703 of different types may be provided. As for the combination of the different types, a combination of ultraviolet or purple LED and blue LED is assumed.

The mounted state of the LED chips 703A, 703B is schematically illustrated as illustrated in FIG. 16C. That is, the electric power is supplied from the wiring line 720A to the four LED chips 703A arranged in the divided area portion 712A. The electric power is supplied from the wiring line 720B to the four LED chips 703B arranged in the divided area portion 712B. As illustrated in FIG. 16C, resistors R1, R2 are provided on the output sides of the wiring lines 720A, 720B. The action of the resistors R1, R2 will be described later on.

The mounting of the LED chips 703 on the substrate 702 will now be explained on the basis of FIG. 18. The substrate 702 is a base portion for holding white LED 708 including the LED chips 703. The substrate 702 has a metal base member 702A, an insulating layer 702D which is formed on the metal base member 702A, and paired wiring lines 720C, 720D which are formed on the insulating layer 702D. The LED chip 703 has a p-electrode and an n- electrode as a pair of electrodes formed on a bottom surface and an upper surface which are opposed to one another. The electrode disposed on the bottom surface side of the LED chip 703 is joined to the upper surface of the paired wiring line 720C by the aid of eutectic solder 705 of AuSn. The electrode disposed on the upper surface side of the LED chip 703 is connected to the other paired wiring line 720D by means of a wire 706 made of metal. A pair of wiring lines 720A or 720B illustrated in FIG. 16B are formed by the pair of the paired wiring lines 720C, 720D so that the electric power is supplied to the four LED chips 703 disposed in each of the divided area portions.

Figure 18:
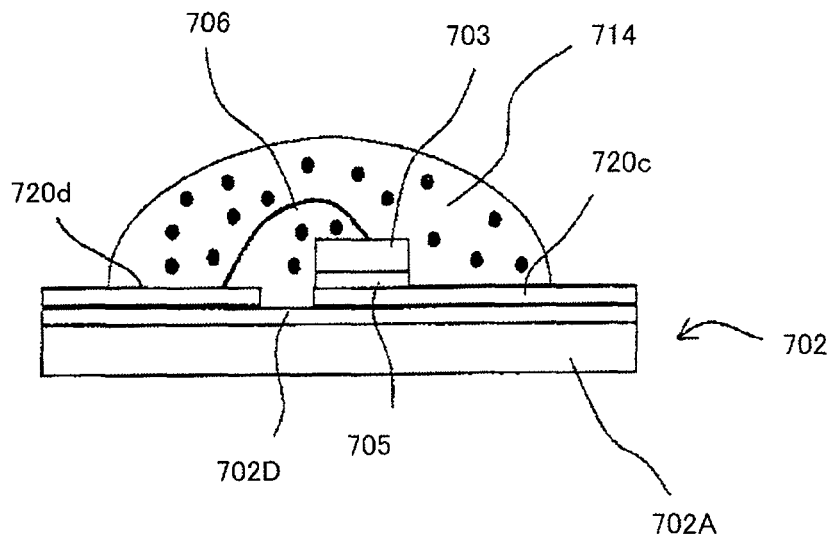
FIG. 18 illustrates a connection relationship between the semiconductor light-emitting element and a substrate in the semiconductor light-emitting device illustrated in FIGS. 16A to 16C.

The electric connection between the LED chip 703 and the pair of paired wiring lines 720C, 720D of the substrate 702 is not limited to the form illustrated in FIG. 18. The electric connection can be performed by means of any appropriate method depending on the arrangement of the set of electrodes of the LED chip 703. For example, when the set of electrodes are formed on only one surface of the LED chip 703, the paired wiring lines 720C, 720D and the LED chip 703 can be electrically connected to one another such that the surface, on which the electrodes are provided, is directed upwardly to install the LED chip 703 thereon, and each set of the electrodes and each of the paired wiring lines 720C, 720D are connected, for example, by means of a wire 706 made of metal respectively. When the LED chip 703 is a flip-chip (face-down), the electric connection can be performed by joining the electrodes of the LED chip 703 to the paired wiring lines 720C, 720D by means of gold bump or solder.

In this arrangement, the LED chip 703 excites fluorescent portions 714A, 714B (referred to as "fluorescent portion 714" generally or inclusively in some cases) as described later on.

In particular, it is preferable to adopt a GaN-based LED element based on the use of a GaN-based compound semiconductor, for the following reason. That is, the light emission output and the external quantum efficiency are extremely large when the ultraviolet to blue light is emitted. Extremely bright light emission is obtained at an extremely low electric power by making combination with any fluorescent substance or fluorescent member as described later on. As for the GaN-based LED element, it is preferable to adopt those having a light-emitting layer containing In, for example, AlxGayInzN light-emitting layer or InxGayN light-emitting layer. The following fact is well-known. That is, when the light emission wavelength is purple to blue, the light emission efficiency is especially enhanced when the light-emitting layer has a multi quantum well structure provided with an InxGayN well layer to provide a double-hetero structure in which the well layer is interposed by cladding layers.

As illustrated in FIG. 18, the fluorescent portion 714, which contains a single or a plurality of fluorescent substance or fluorescent substances (fluorescent material or fluorescent materials) for absorbing a part of the light emitted from the LED chip 703 and emitting the light having a different wavelength and a light-transmissive material for sealing the fluorescent substance or fluorescent substances, is provided on the substrate 702 while covering the LED chip 703 therewith. In FIG. 18, the reflector 710 is omitted from the illustration. However, such a form or mode may be a form or mode of white LED constructed with the package. The part of the light emitted from the LED chip 703 behaves as the exciting light which is partially or totally absorbed by the light-emitting substance (fluorescent substance or fluorescent material) included in the fluorescent portion 714. The fluorescent portion of the white LED 708 will be explained more specifically on the basis of FIG. 17. In the divided area portion 712A, the fluorescent portion 714A covers the LED chip 703A, and the fluorescent portion 714A is exposed at the divided opening 713A. Further, in the divided area portion 712B, the fluorescent portion 714B covers the LED chip 703B, and the fluorescent portion 714B is exposed at the divided opening 713B. Therefore, the output lights from the respective fluorescent portions 714A, 714B are radiated or emitted to the outside from the respective divided openings.

Next, the fluorescent substance (fluorescent material) will be explained in detail. The white LED 708 according to the embodiment of the present invention has an object to output the white light. In particular, the combination of the LED chip 703 and the fluorescent substance is selected so that the light emission color of white LED 708 has the deviation duv from the black-body radiation track which is decreased as small as possible, preferably to satisfy $-0.02 \leq duv \leq 0.02$ in the uv chromaticity diagram of the UCS (u, v) color system (CIE 1960). In the present invention, the deviation duv from the black-body radiation track follows the definition in Note of Item 5.4 of JIS Z8725 (method for measuring light source distribution temperature and color temperature/correlated color temperature). However, the black-body radiation track is not the absolute basis or reference. Any light emission color corresponding to any artificial standard (light emission color normalized by the deviation from any artificially determined reference light) is required in some cases.

When the light emission wavelength of the LED chip 703 is ultraviolet or purple, the white light is obtained by allowing the fluorescent portion 714 to emit or generate the three primary colors of R, G, B or the lights having wavelengths in the complementary color relationship including, for example, BY and RG. When the light emission wavelength of the LED chip 703 is blue, the white light is obtained by allowing the fluorescent portion 714 to emit or generate the light of Y or RG and effecting the color mixture with the light emission of the LED chip 703.

Preferred fluorescent substances are well-known.

(Red Fluorescent Substances)

Red fluorescent substances can be exemplified, for example, by europium-activated alkaline earth silicon nitride fluorescent substance represented by $(Mg,Ca,Sr,Ba)_2Si_5N_8$:Eu, europium-activated rare earth oxychalcogenide fluorescent substance represented by $(Y,La,Gd,Lu)_2O_2S$:Eu, fluorescent substance containing oxynitride and/or oxysulfide containing at least one element selected from the group consisting of Ti, Zr, Hf, Nb, Ta, W, and Mo and containing oxynitride having alpha-SiAlON structure in which a part or all of Al element is substituted with Ga element, Eu-activated oxysulfide fluorescent substance such as $(La,Y)_2O_2S$:Eu and the like, Eu-activated oxide fluorescent substance such as $Y(V,P)O_4$:Eu, $Y_2O_3$:Eu and the like, Eu,Mn-activated silicate fluorescent substance such as $(Ba,Sr,Ca,Mg)_2SiO_4$:Eu,Mn, $(Ba,Mg)_2SiO_4$:Eu,Mn and the like, Eu-activated sulfide fluorescent substance such as $(Ca,Sr)S$: Eu and the like, Eu-activated aluminate fluorescent substance such as $YAlO_3$:Eu and the like, Eu-activated silicate fluorescent substance such as $LiY_9(SiO_4)_6O_2$:Eu, $Ca_2Y_8(SiO_4)_6O_2$:Eu, $(Sr,Ba,Ca)_3SiO_5$:Eu, $Sr_2BaSiO_5$:Eu and the like, Ce-activated aluminate fluorescent substance such as $(Y,Gd)_3Al_5O_{12}$:Ce, $(Tb,Gd)_3Al_5O_{12}$:Ce and the like, Eu-activated nitride fluorescent substance such as $(Ca,Sr,Ba)_2Si_5N_8$:Eu, $(Mg,Ca,Sr,Ba)SiN_2$:Eu, $(Mg,Ca,Sr,Ba)AlSiN_3$:Eu and the like, Ce-activated nitride fluorescent substance such as $(Mg,Ca,Sr,Ba)AlSiN_3$:Ce and the like, Eu,Mn-activated halophosphate fluorescent substance such as $(Sr,Ca,Ba,Mg)_{10}(PO_4)_6Cl_2$:Eu,Mn and the like, Eu,Mn-activated silicate fluorescent substance such as $Ba_3MgSi_2O_8$:Eu,Mn, $(Ba,Sr,Ca,Mg)_3(Zn,Mg)Si_2O_8$:Eu,Mn and the like, Mn-activated germanate fluorescent substance such as $3.5MgO·0.5MgF_2·GeO_2$:Mn and the like, Eu-activated oxynitride fluorescent substance such as Eu-activated α-SiAlON and the like, Eu,Bi-activated oxide fluorescent substance such as $(Gd,Y,Lu,La)_2O_3$:Eu,Bi and the like, Eu,Bi-activated oxysulfide fluorescent substance such as $(Gd,Y,Lu,La)_2O_2S$:Eu,Bi and the like, Eu,Bi-activated vanadate fluorescent substance such as $(Gd,Y,Lu,La)VO_4$:Eu,Bi and the like, Eu, Ce-activated sulfide fluorescent substance such as $SrY_2S_4$:Eu, Ce and the like, Ce-activated sulfide fluorescent substance such as $CaLa_2S_4$:Ce and the like, Eu,Mn-activated phosphate fluorescent substance such as $(Ba,Sr,Ca)MgP_2O_7$:Eu,Mn, $(Sr,Ca,Ba,Mg,Zn)_2P_2O_7$:Eu,Mn and the like, Eu,Mo-activated tungstate fluorescent substance such as $(Y,Lu)_2WO_6$:Eu,Mo and the like, Eu, Ce-activated nitride fluorescent substance such as $(Ba,Sr,Ca)_xSi_yN_z$:Eu, Ce (provided that x, y, z are integers of not less than 1) and the like, Eu,Mn-activated halophosphate fluorescent substance such as $(Ca,Sr,Ba,Mg)_{10}(PO_4)_6(F,Cl,Br,OH)_2$:Eu,Mn and the like, Ce-activated silicate fluorescent substance such as $((Y,Lu,Gd,Tb)_{1-x}Sc_xCe_y)_2(Ca, Mg)_{1-r}(Mg,Zn)_{2+r}Si_{z-q}Ge_qO_{12+\delta}$ and the like, red organic fluorescent substance composed of rare earth element ion complex having ligand of anion such as β-diketonate, β-diketone, aromatic carboxylic acid, Brønsted acid or the like, perylene pigment (for example, dibenzo-{[f, f']-4,4',7,7'-tetraphenyl}-diindeno[1,2,3-cd:1',2',3'-lm]perylene), anthraquinone pigment, lake pigment, azo pigment, quinacridone pigment, anthracene pigment, isoindolinone pigment, phthalocyanine pigment, triphenylmethane basic dye, indanthrone pigment, indophenol pigment, cyanine pigment, and dioxazine pigment.

(Green Fluorescent Substances)

Green fluorescent substances can be exemplified, for example, by europium-activated alkaline earth silicon oxynitride fluorescent substance represented by $(Mg,Ca,Sr,Ba)Si_2O_2N_2$:Eu, europium-activated alkaline earth silicate fluorescent substance represented by $(Ba,Ca,Sr,Mg)_2SiO_4$:Eu, Eu-activated aluminate fluorescent substance such as $Sr_4Al_{14}O_{25}$:Eu, $(Ba,Sr,Ca)Al_2O_4$:Eu and the like, Eu-activated silicate fluorescent substance such as $(Sr,Ba)Al_2Si_2O_8$:Eu, $(Ba,Mg)_2SiO_4$:Eu, $(Ba,Sr,Ca,Mg)_2SiO_4$:Eu, $(Ba,Sr,Ca)_2(Mg,Zn)Si_2O_7$:Eu and the like, Ce,Tb-activated silicate fluorescent substance such as $Y_2SiO_5$:Ce,Tb and the like, Eu-activated borate phosphate fluorescent substance such as $Sr_2P_2O_7$—$Sr_2B_2O_5$:Eu and the like, Eu-activated halosilicate fluorescent substance such as $Sr_2Si_3O_8$-$2SrCl_2$:Eu and the like, Mn-activated silicate fluorescent substance such as $Zn_2SiO_4$:Mn and the like, Tb-activated aluminate fluorescent substance such as $CeMgAl_{11}O_{19}$:Tb, $Y_3Al_5O_{12}$:Tb and the like, Tb-activated silicate fluorescent substance such as $Ca_2Y_8(SiO_4)_6O_2$:Tb, $La_3Ga_5SiO_{14}$:Tb and the like, Eu,Tb,Sm-activated thiogallate fluorescent substance such as $(Sr,Ba,Ca)Ga_2S_4$:Eu,Tb,Sm and the like, Ce-activated aluminate fluorescent substance such as $Y_3(Al,Ga)_5O_{12}$:Ce, $(Y,Ga,Tb,La,Sm,Pr,Lu)_3(Al,Ga)_5O_{12}$:Ce and the like, Ce-activated silicate fluorescent substance such as $Ca_3Sc_2Si_3O_{12}$:Ce, $Ca_3(Sc,Mg,Na,Li)_2Si_3O_{12}$:Ce and the like, Ce-activated oxide fluorescent substance such as $CaSc_2O_4$:Ce and the like, Eu-activated oxynitride fluorescent substance such as $SrSi_2O_2N_2$:Eu, $(Sr,Ba,Ba)Si_2O_2N_2$:Eu, Eu-activated β-SiAlON and the like, Eu,Mn-activated aluminate fluorescent substance such as $BaMgAl_{10}O_{17}$:Eu,Mn and the like, Eu-activated aluminate fluorescent substance such as $SrAl_2O_4$:Eu and the like, Tb-activated oxysulfide fluorescent substance such as $(La,Gd,Y)_2O_2S$:Tb and the like, Ce,Tb-activated phosphate fluorescent substance such as $LaPO_4$:Ce,Tb and the like, sulfide fluorescent substance such as $ZnS$:Cu,Al, $ZnS$:Cu,Au,Al and the like, Ce,Tb-activated borate fluorescent substance such as $(Y,Ga,Lu,Sc,La)BO_3$:Ce,Tb, $Na_2Gd_2B_2O_7$:Ce,Tb, $(Ba,Sr)_2(Ca,Mg,Zn)B_2O_6$:K,Ce,Tb and the like, Eu,Mn-activated halosilicate fluorescent substance such as $Ca_8Mg(SiO_4)_4Cl_2$:Eu,Mn and the like, Eu-activated thioaluminate fluorescent substance and thiogallate fluorescent substance such as $(Sr,Ca,Ba)(Al,Ga,In)_2S_4$:Eu and the like, Eu,Mn-activated halosilicate fluorescent substance such as $(Ca,Sr)_8(Mg,Zn)(SiO_4)_4Cl_2$:Eu,Mn and the like, pyridine-phthalimide condensation derivative, fluorescent dye such as benzooxazinone compound, quinazolinone compound, coumarin compound, quinophthalone compound, naphthalate imide compound and the like, and organic fluorescent substance such as terbium complex and the like.

(Blue Fluorescent Substances)

Blue fluorescent substances can be exemplified, for example, by europium-activated barium magnesium aluminate fluorescent substance represented by $BaMgAl_{10}O_{17}$:Eu, europium-activated halophosphate calcium fluorescent substance represented by $(Ca,Sr,Ba)_5(PO_4)_3Cl$:Eu, europium-activated alkaline earth chloroborate fluorescent substance represented by $(Ca,Sr,Ba)_2B_5O_9Cl$:Eu, europium-activated alkaline earth aluminate fluorescent substance represented by $(Sr,Ca,Ba)Al_2O_4$:Eu or $(Sr,Ca,Ba)_4Al_{14}O_{25}$:Eu, Sn-activated phosphate fluorescent substance such as $Sr_2P_2O_7$:Sn and the like, Eu-activated aluminate fluorescent substance such as $Sr_4Al_{14}O_{25}$:Eu, $BaMgAl_{10}O_{17}$:Eu, $BaAl_8O_{13}$:Eu and the like, Ce-activated thiogallate fluorescent substance such as $SrGa_2S_4$:Ce, $CaGa_2S_4$:Ce and the like, Eu,Tb,Sm-activated aluminate fluorescent substance such as $(Ba,Sr,Ca)MgAl_{10}O_{17}$:Eu, $SaMgAl_{10}O_{17}$:Eu,Tb,Sm and the like, Eu,Mn-activated aluminate fluorescent substance such as (Ba,Sr,Ca)MgAl$_{10}$O$_{17}$:Eu,Mn and the like, Eu,Tb,Sm-activated halophosphate fluorescent substance such as (Sr,Ca,Ba,Mg)$_{10}$(PO$_4$)$_6$Cl$_2$:Eu, (Ba,Sr,Ca)$_5$(PO$_4$)$_3$(Cl,F,Br,OH):Eu,Mn,Sb and the like, Eu-activated silicate fluorescent substance such as BaAl$_2$Si$_2$O$_8$:Eu, (Sr,Ba)$_3$MgSi$_2$O$_8$:Eu and the like, Eu-activated phosphate fluorescent substance such as Sr$_2$P$_2$O$_7$:Eu and the like, sulfide fluorescent substance such as ZnS:Ag, ZnS:Ag,Al and the like, Ce-activated silicate fluorescent substance such as Y$_2$SiO$_5$:Ce and the like, tungstate fluorescent substance such as CaWO$_4$ and the like, Eu,Mn-activated borate phosphate fluorescent substance such as (Ba,Sr,Ca)BPO$_5$:Eu,Mn, (Sr,Ca)$_{10}$(PO$_4$)$_6$.nB$_2$O$_3$:Eu, 2SrO.0.84P$_2$O$_5$.0.16B$_2$O$_3$:Eu and the like, Eu-activated nalosilicate fluorescent substance such as Sr$_2$Si$_3$O$_8$.2SrCl$_2$:Eu and the like, fluorescent dye such as naphthalate imide compound, benzoxazole compound, styryl compound, coumarine compound, pyrazoline compound, and triazole compound, and organic fluorescent substance such as thulium complex and the like.

It is appropriate that the white LED 708 is provided with the fluorescent portion 714 including the LED chips 703 and the fluorescent substance as described above. The other parts or components are not specifically limited. The LED chips 703 and the fluorescent portion 714 are usually arranged so that the fluorescent substance is excited to cause the light emission by the light emission of the LED chips 703, and the light emission is taken out to the outside. In the case of the structure provided as described above, the LED chips 703 and the fluorescent substance are usually sealed and protected with the light-transmissive material (sealing material). Specifically, the sealing material is adopted in order that the fluorescent substance is dispersed to constitute light-emitting portions by including the sealing material in the fluorescent portion 714 and the LED chips 703, the fluorescent substance, and the substrate 702 are adhered to one another.

The light-transmissive material to be used is usually exemplified, for example, by thermoplastic resins, thermosetting resins, and photo-curable resins. However, the output light of the LED chip 703 usually has the wavelength which is in a short wavelength region of 300 nm to 480 nm. Therefore, the resin, which has the sufficient transparency and the sufficient light resistance with respect to the output light, is preferred as the sealing material. Accordingly, the sealing material is specifically exemplified, for example, by (meth)acrylic resin such as polymethyl (meth)acrylate and the like; styrene resin such as polystyrene, styrene-acrylonitrile copolymer and the like, polycarbonate resin; polyester resin; phenoxy resin; butyral resin; polyvinyl alcohol; cellulose resin such as ethyl cellulose, cellulose acetate, cellulose acetate butyrate and the like; epoxy resin; phenol resin; and silicone resin. It is also possible to use inorganic materials including, for example, an inorganic material obtained by solidifying metal alkoxide, ceramic precursor polymer, or a solution prepared by hydrolyzing and polymerizing a solution containing metal alkoxide by means of the sol-gel method or a combination thereof, an inorganic material having, for example, siloxane bond, and glass.

Among them, in view of the heat resistance and the light resistance, it is preferable to use silicone resin as a silicon-containing compound, metal alkoxide, ceramic precursor polymer, or an inorganic material obtained by solidifying a solution prepared by hydrolyzing and polymerizing a solution containing metal alkoxide by means of the sol-gel method or a combination thereof, and an inorganic material having, for example, siloxane bond.

The white LED 708 constructed as described above has the fluorescent portion 714 which is excited by the light emitted by the four LED chips 703 and which is provided in each of the two divided area portions 712A, 712B divided by the partition 711. Further, the two divided area portions 712A, 712B are provided integrally while juxtaposing the emitting ports for the output lights, i.e., the divided openings 713A, 713B in the reflector 710. The white light, which resides in the output lights from the respective fluorescent portions 714A, 714B (appropriately including the output light of the LED chip as well when the LED chip emits the blue light), is emitted or radiated to the outside from the respective divided openings 713A, 713B. In this arrangement, the white light, which is released from the divided openings respectively, is obtained by the aid of the fluorescent portions 714 including the fluorescent substance. Therefore, the light components (lights emitted from the LED chips and the respective fluorescent substances) are sufficiently diffused (owing to the occurrence of the scattering and the irregular reflection on account of the sufficient difference usually existing between the refractive indexes of the fluorescent substance particles and the sealing material). The light is emitted (allowed to outgo), in which the light distribution follows the Lambertian. As a result, the color mixture (mixing) effectively occurs between the white lights emitted from the plurality of divided area portions. Therefore, the uniform white light is obtained.

Figure 19:
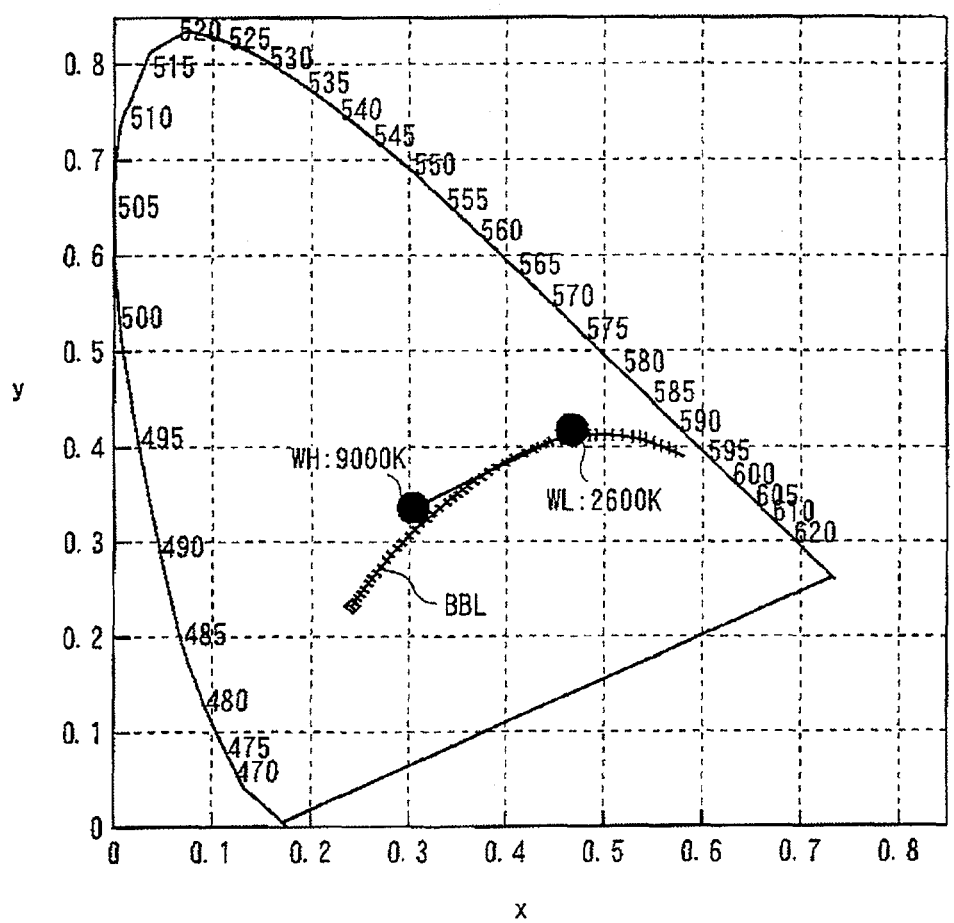
FIG. 19 illustrates a relationship between the black-body radiation track and the chromaticity point of the white light set as the output light from each of divided area portions in the semiconductor light-emitting device illustrated in FIGS. 16A to 16C.
Figure 20:
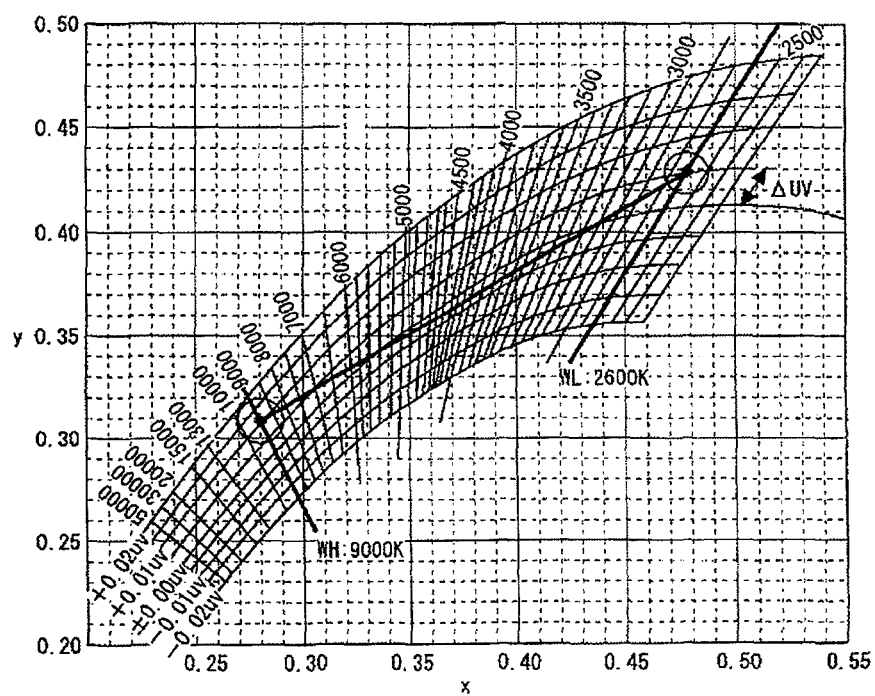
FIG. 20 illustrates an enlarged view illustrating main parts in relation to the relationship between the black-body radiation track and the chromaticity point of the white light illustrated in FIG. 19.

In this arrangement, the fluorescent substance contained in the fluorescent portion 714A and the fluorescent substance contained in the fluorescent portion 714B are appropriately selected so that the spectrum of the white light outputted from the divided area portion 712A (hereinafter referred to as "white light A") and the spectrum of the white light outputted from the divided area portion 712B (hereinafter referred to as "white light B") are different from each other. Assuming that the chromaticity points on the xy chromaticity diagram (CIE 1931) corresponding to the white lights A, B are represented by $W_L$, $W_H$, as illustrated in FIGS. 19 and 20, the correlated color temperature of the chromaticity point $W_L$ is 2600K, and the correlated color temperature of the chromaticity point $W_H$ is 9000K. Further, it is assumed that the deviation duv of the chromaticity point $W_L$ from the black-body radiation track BBL is +0.005, and the deviation duv of the chromaticity point $W_H$ from the black-body radiation track BBL is +0.01. FIG. 20 shows an enlarged view illustrating main parts of FIG. 19, wherein the range $-0.02 \leq duv \leq 0.02$ of the deviation from the black-body radiation track illustrated in the drawing resides in those obtained by the conversion from the UCS color system (CIE 1960) onto the xy chromaticity diagram (CIE 1931).

The correlated color temperatures of the white light A and the white light B themselves can be appropriately changed depending on the object. If the difference between the correlated color temperatures of the both is not less than 2000K, the color temperature difference is sensed, which can be assumed to be "color temperature variable". As described above, the black-body radiation track is not the absolute basis or reference. Any light emission color corresponding to any artificial standard (light emission color normalized by the deviation from any artificially determined reference light) is required in some cases.

As described above, the white LED 708 (semiconductor light-emitting apparatus or device) comprises the divided area portion 712A for emitting the white light A, i.e., the first white light source including the light emitting diode, and the divided area portion 712B for emitting the white light B, i.e., the second white light source including the light emitting diode, the second white light source emitting the white light having the spectrum different from that of the white light emitted from the first white light source, wherein the combined or synthesized white light, which is obtained by combining or synthesizing the white lights emitted from the first and second white light sources, is emitted. The white LED 708 is controlled so that a predetermined ratio is provided between the times (driving voltage application times, driving current application times, or white light source light-emitting times) in which the driving electric power is supplied to the first and second white light sources, and thus it is possible to change the color temperature of the combined white light.

An explanation will now be made on the basis of FIGS. 21A and 21B about an exemplary arrangement of a light-emitting module 730 constructed by using a plurality of white LED's 708 which are constructed as described above and which are capable of easily outputting the white light having the color temperature between the two color temperatures.

Figure 21A:
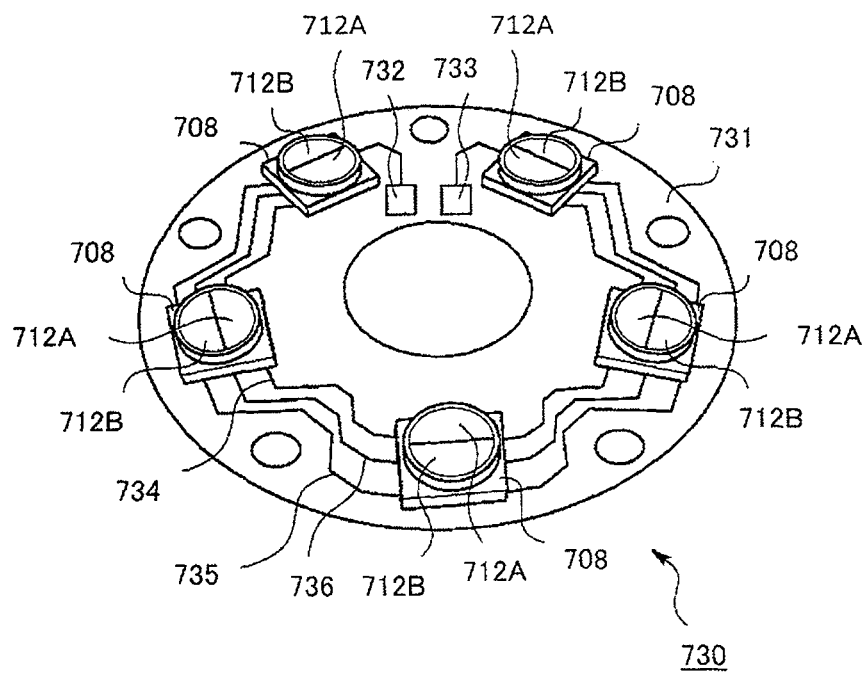
FIG. 21A illustrates an arrangement of a light-emitting module according to an embodiment of the present invention, and FIG. 21B simply illustrates an arrangement of semiconductor light-emitting devices in the light-emitting module.
Figure 21B:
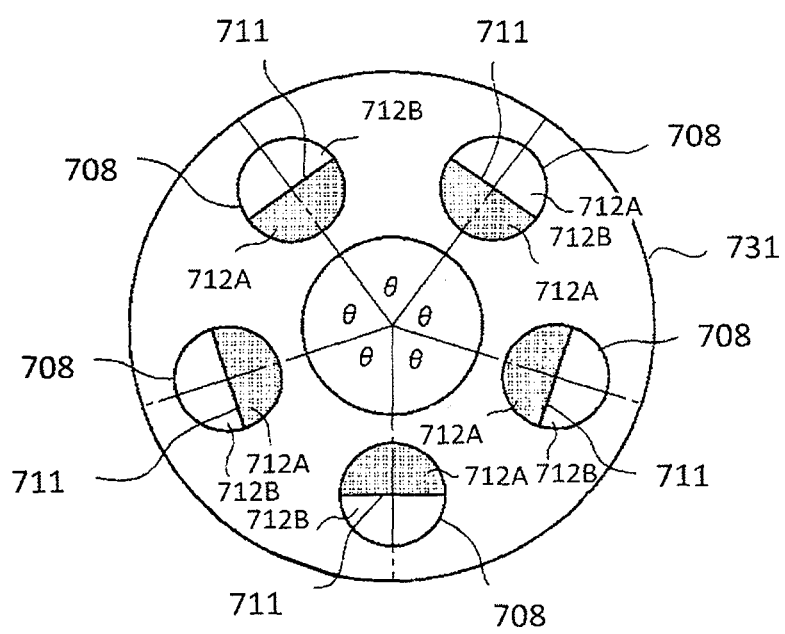

FIG. 21A illustrates a specified structure of the light-emitting module 730, and FIG. 21B schematically illustrates the arrangement state of the five white LED's 708 on the light-emitting module illustrated in FIG. 21A. The white LED's 708 are arranged in an annular form on an annular base 731. A lens element such as a convex lens or the like can be provided on each of the openings 713 of the white LED's 708.

Figure 22:
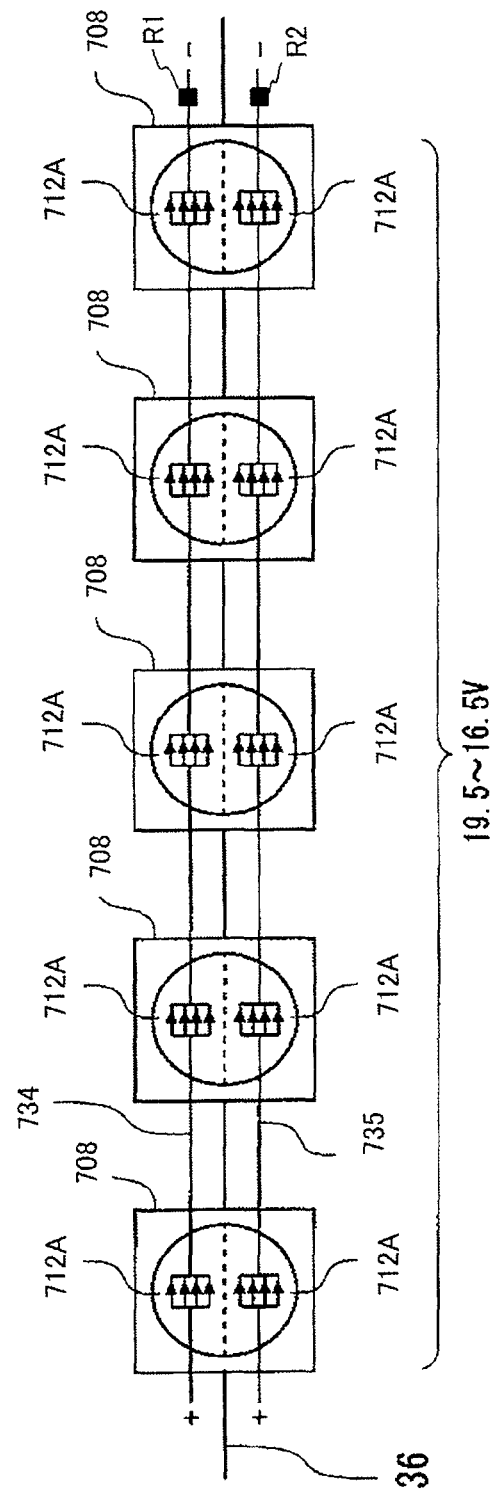
FIG. 22 illustrates a state of wiring lines for supplying the electric power between the semiconductor light-emitting devices in the light-emitting module illustrated in FIG. 21.

In the light-emitting module 730, the wiring lines 720A of the five divided area portions 712A possessed by the respective light-emitting devices 708 are connected in series to form a wiring line 734, and the wiring lines 720B of the five divided area portions 712B are connected in series to form a wiring line 735. Further, the ground lines of the respective light-emitting devices 708 also form a wiring line 736 by connecting the respective light-emitting devices 708 in series. FIG. 22 schematically shows the state of the five light-emitting devices 708 connected by the wiring lines 734 to 736. Electrodes 732, 733, which supply the electric power to allow the respective light-emitting devices 708 to emit the light, are provided with respect to the wiring lines 734 to 736. The light emission control can be performed with ease for the light-emitting module 730 by connecting in series the respective divided area portions 712A, 712B of the respective light-emitting devices 708 as described above. Further, in this embodiment, resistors R1, R2 are provided respectively on the output sides of the wiring lines 734, 735. Accordingly, as illustrated in FIG. 16C, the individual white LED 708 is in such a state that the resistors R1, R2 are connected in series respectively on the output sides of the respective wiring lines.

Figure 23:
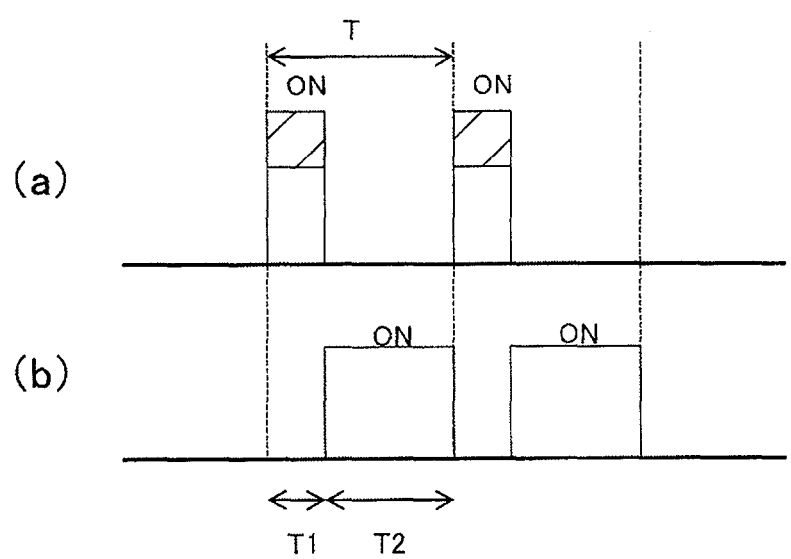
FIG. 23 illustrates an example of the voltage applied to each white LED in order to control the light emission of the light-emitting module.

FIG. 23 illustrates an example of the voltage applied to each of the white LED's 708 in order to control the light emission of the light-emitting module 730. FIG. 23 (*a*) shows the transition or change of the voltage applied to the LED chip 703A arranged in the divided area portion 712A of each of the white LED's 708 via the wiring line 734, and FIG. 23 (*b*) shows the transition or change of the voltage applied to the LED chip 703B arranged in the divided area portion 712B of each of the white LED's 708 via the wiring line 735. As illustrated in FIGS. 23 (*a*) and (*b*), the voltage having a constant value is applied for a constant time to each of the first white light source and the second white light source at a predetermined period T. In this way, this embodiment can be constructed such that the voltage having the constant value is applied for the constant time in the predetermined period to the light emitting diodes included in the first white light source and the light emitting diodes included in the second white light source respectively, and the driving voltage, which corresponds to the predetermined driving voltage ratio, is applied so that the combined white light of the white light emitted from the first white light source and the white light emitted from the second white light source has the specified luminance.

The voltage, which is supplied from an unillustrated power source circuit, is applied to each of the LED chips 703 at a desired duty ratio at the period T by means of the pulse width modulation (PWM) performed by the unillustrated power source circuit. In the example illustrated in FIGS. 23 (*a*) and (*b*), a substantially rectangular voltage, which is constant in a predetermined time T1, is applied to the LED chips 703A, and a substantially rectangular driving voltage, which is constant in a predetermined time T2, is applied to the LED chips 703B. Each of the LED chip 703A and the LED chip 703B is turned ON while allowing the driving current corresponding to the voltage value to flow therethrough during the period in which the driving voltage is applied. The color temperature of the combined white light emitted by the white LED 708 is changed by controlling the ratio between the time T1 in which the LED chips 703A are turned ON and the time T2 in which the LED chips 703B are turned ON as described above. The times T1, T2 are referred to as "electric power supply times" (provided that times T1, T2 are referred to as "voltage application times", "current application times", or "light emission times" in some cases). In the example illustrated in FIGS. 23 (*a*) and (*b*), the chromaticity (color temperature) of the combined white light is determined depending on the ratio between the lighting time of the first white light source (predetermined time T1) and the lighting time of the second white light source (predetermined time T2) (ratio of the other with respect to one of T1 and T2). On the other hand, the luminance (light emission amount) of the combined white light is determined depending on the ratio of the lighting times T1, T2 with respect to the predetermined period T (ratio of ON/OFF of the first and second white light sources in the predetermined period T). Therefore, the color temperature and the luminance of the combined white light can be adjusted respectively by controlling the ratio between the lighting times in the predetermined period T (T1/T2) and the ratio of ON/OFF of the light emitting diode in the predetermined period T (T/T1+T2) respectively.

In the example illustrated in FIGS. 23 (*a*) and (*b*), the current is applied so that the electric power supply times are not overlapped with each other. That is, when one of the LED chips 703 is turned ON, the other is turned OFF. However, the time T1 and the time T2 may include overlapped portions on condition that the color temperature of the combined white light can be made to be the desired (specified) value.

In this arrangement, the ratio between the driving voltages applied to the respective LED chips 703A, 7036 is determined so that the luminance of the white light A obtained when only the LED chips 703A are turned ON and the luminance of the white light B obtained when only the LED chips 703B are turned ON are identical with each other, by means of the resisters R1, R2 (R1<R2) inserted into the wiring lines 734, 735. In other words, even when the power source voltage is identical, the different driving voltages are applied to the LED chips 703A, 703B depending on the difference between the resistance value of the resister R1 and the resistance value of the resister R2. In the example illustrated in FIGS. 23 (*a*) and (*b*), the voltage ratio is determined so that the driving voltage applied to the LED chips 703A is higher than the driving voltage applied to the LED chips 703B (see hatched portions illustrated in FIG. 24 (*a*)). Therefore, the current value allowed to flow through the wiring line 734, i.e., the current value allowed to flow toward the LED chips 703A is higher than the current value allowed to flow through the wiring line 735, i.e., the current value allowed to flow toward the LED chips 703B.

In this way, the ratio (T1/T2) between the electric power supply times with respect to the LED chips 703A and the ZED chips 703B per unit time (1 period T) is changed. Accordingly, the correlated color temperature of the output light of the light-emitting module 730 can be adjusted to have an arbitrary value between 2600K and 9000K. Further, the driving voltages are applied to the respective chips at such a voltage ratio that the luminance is identical between the white light A allowed to come from the LED chips 703A and the white light B allowed to come from the LED chips 703B. Therefore, it is possible to provide the constant luminance of the combined white light emitted from the white LED 708 irrelevant to the change of the color temperature. In other words, the color temperature and the luminance (brightness) of the combined white light emitted from the white LED 708 can be adjusted to have the desired values. As for the change of the ratio of the light emission intensity between the light emission from the divided area portion 712A and the light emission from the divided area portion 712B, the ratio may be changed in a stepwise manner, or the ratio may be changed continuously.

FIG. 22 is illustrative of the example in which the resisters R1, R2 (R1<R2) are provided. However, it is also allowable to provide R1>R2 depending on the type and the number of the LED chips for constructing each of the divided area portions 12 and the type and the concentration of the fluorescent substance. Alternatively, it is also allowable to provide only one of the resisters R1, R2. Variable resistors can be also applied as the resisters R1, R2. The resisters R1, R2 can be also provided on the input sides of the respective LED chips. The resisters R1, R2 may be inserted onto the wiring lines or incorporated into the light-emitting module or the package.

Figure 24:
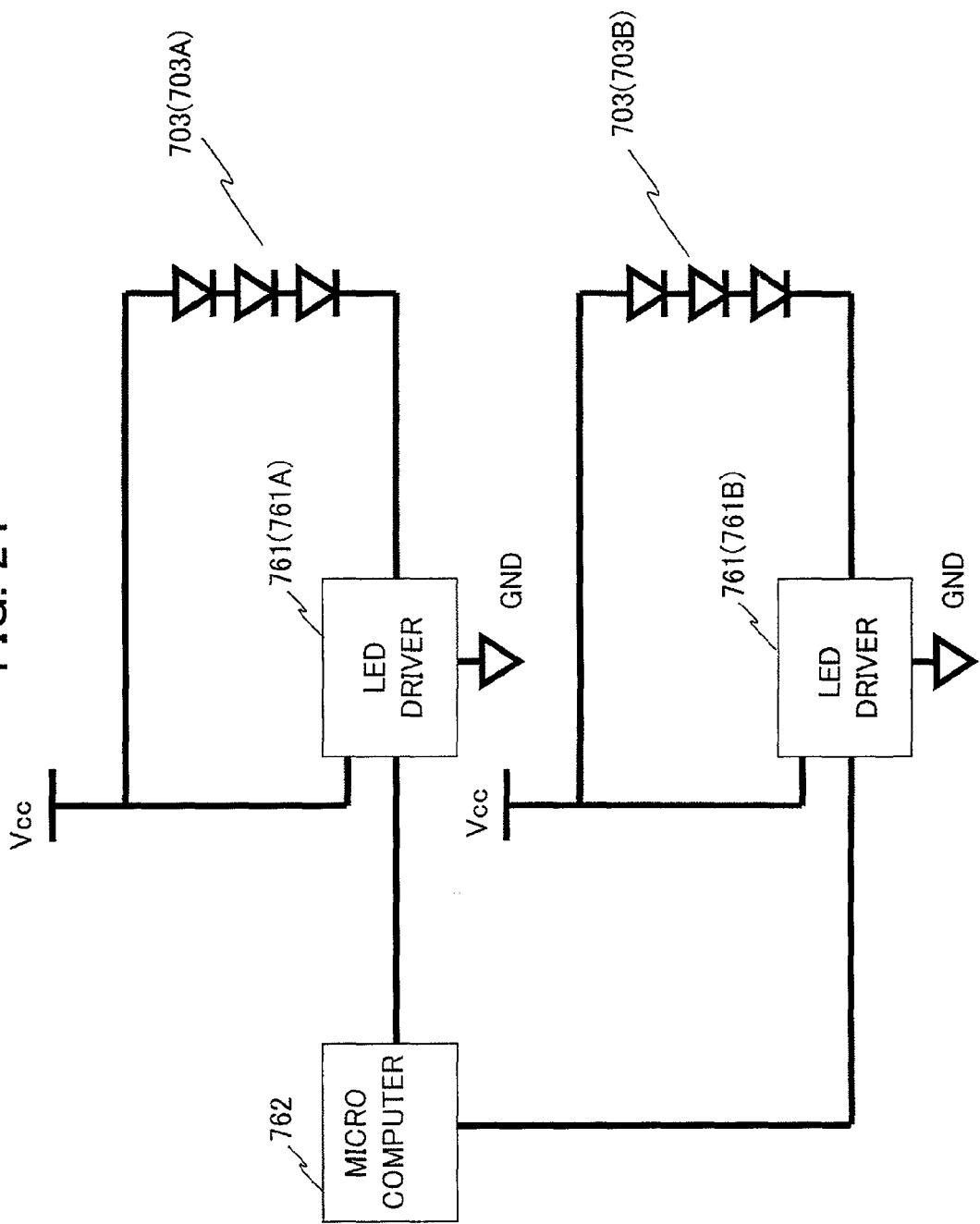
FIG. 24 illustrates an exemplary arrangement of a control circuit capable of driving LED chips at a predetermined ratio between application times (T1/T2) for the respective LED chips and at a predetermined driving voltage ratio when resistors R1, R2 are removed in relation to FIG. 22.

FIG. 24 illustrates an exemplary arrangement of a control circuit capable of driving the LED chips 703A, 703B at a predetermined ratio between application times (T1/T2) for the respective LED chips 703A, 703B and at a predetermined driving voltage ratio when the resistors R1, R2 are removed in relation to FIG. 22. The exemplary arrangement illustrated in FIG. 24 is provided with an LED driver 761A which controls the driving of the LED chip 703A, an LED driver 761B which controls the driving of the LED chip 703B, and a microcomputer 762 which controls the operation of the LED drivers 761A, 761B.

Each of the LED drivers 761A, 761B is, for example, ZD3315 produced by ZYWYN described above. ZD3315 has an enable (EN) pin. The application (supply of LED current) with respect to the LED chip 703 is turned ON/OFF depending on ON/OFF of the signal with respect to the EN pin.

For example, PIC16F84A is applicable to the microcomputer 762 as described above. The microcomputer 762 provides the ON/OFF signal (i.e., enable/disable signal) into which the ratio between the application times of the driving voltage with respect to the LED chips 703A, 703B (i.e., the lighting times of the LED chips 703A, 703B) is taken into consideration, with respect to the EN pin of each of the LED drivers 761A, 761B (ZD3315) in accordance with a previously incorporated program. The LED drivers 761A, 761B turn ON/OFF the application of the driving voltage at the duty ratio in accordance with the ON/OFF signal with respect to the EN pin. Accordingly, the driving voltage can be applied at the predetermined application time ratio with respect to each of the LED chips 703A, 703B. It is possible to emit the combined white light corresponding to the ratio from the white LED 708.

Although not illustrated in FIG. 24, each of the LED drivers 761A, 761B has an ISET pin as described above. A resister (not illustrated) is connected to the ISET pin in order to allow the desired LED current to flow to the LED chip 703. It is possible to set different values for the resistance values of the resisters between the LED drivers 761. When the resistance value differs, then the LED current differs between the LED chips 703A, 703B, and thus the driving voltage also differs between the LED chips 703A, 703B. Therefore, the resistance value of the resister connected to each of the ISET pins is determined so that the driving voltage ratio, at which the desired luminance of the combined white light is obtained, is provided. Therefore, it is possible to provide the constant luminance of the combined white light irrelevant to the change of the color temperature.

In the arrangement illustrated in FIG. 24, the color temperature of the white LED 708 can be dynamically changed, for example, such that the resister, which is connected to the ISET pin, is a variable resistor, a plurality of color temperature designated values can be inputted into the microcomputer 762, and the ON/OFF timing with respect to the EN pin of each of the LED drivers 761A, 761B is switched depending on the color temperature designated value. Further, the luminance of the combined white light can be made constant irrelevant to the change of the color temperature such that the resistance value, which corresponds to the color temperature designated value, is previously determined, and the microcomputer 762 changes the resistance value of each of the variable resistors depending on the color temperature designated value.

Ninth Embodiment

Next, a ninth embodiment of the present invention will be explained.

The arrangement of the ninth embodiment includes portions which are common to those of the eighth embodiment. Therefore, the common portions are omitted from the explanation, and different portions will be principally explained.

In the eighth embodiment, the DC current is supplied to each of the LED chips 703A, 703B of the light-emitting module 730 by using the wiring lines 734, 735. In the ninth embodiment, an example is explained, in which the AC current is supplied to the light-emitting module 730 (each of the LED chips 703A, 703B).

Figure 25:
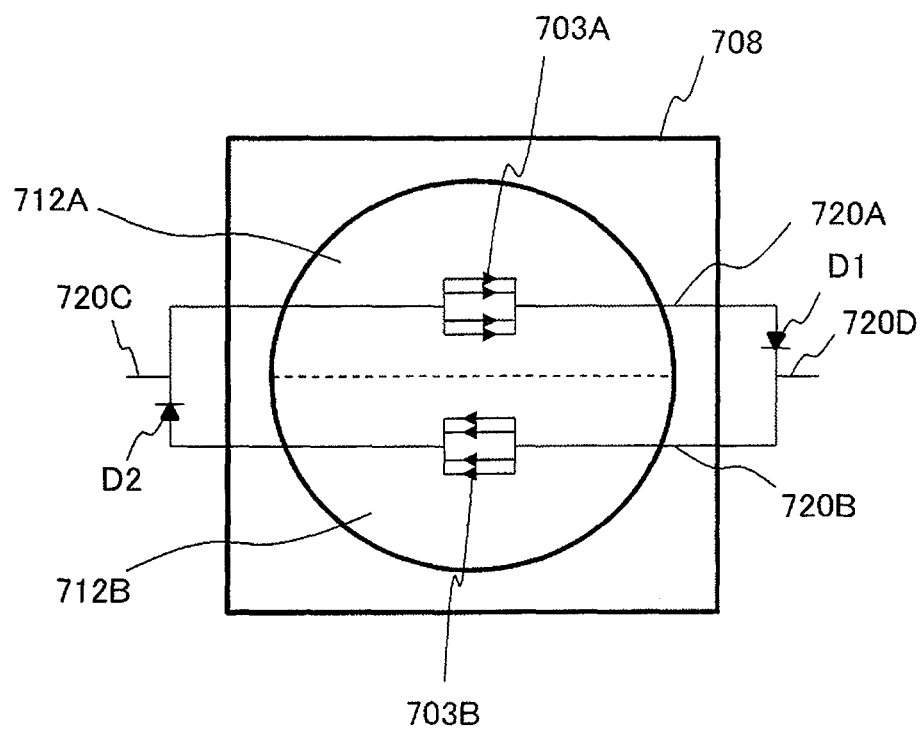
FIG. 25 illustrates white LED according to a ninth embodiment as schematically illustrated by using electrical symbols.
Figure 26:
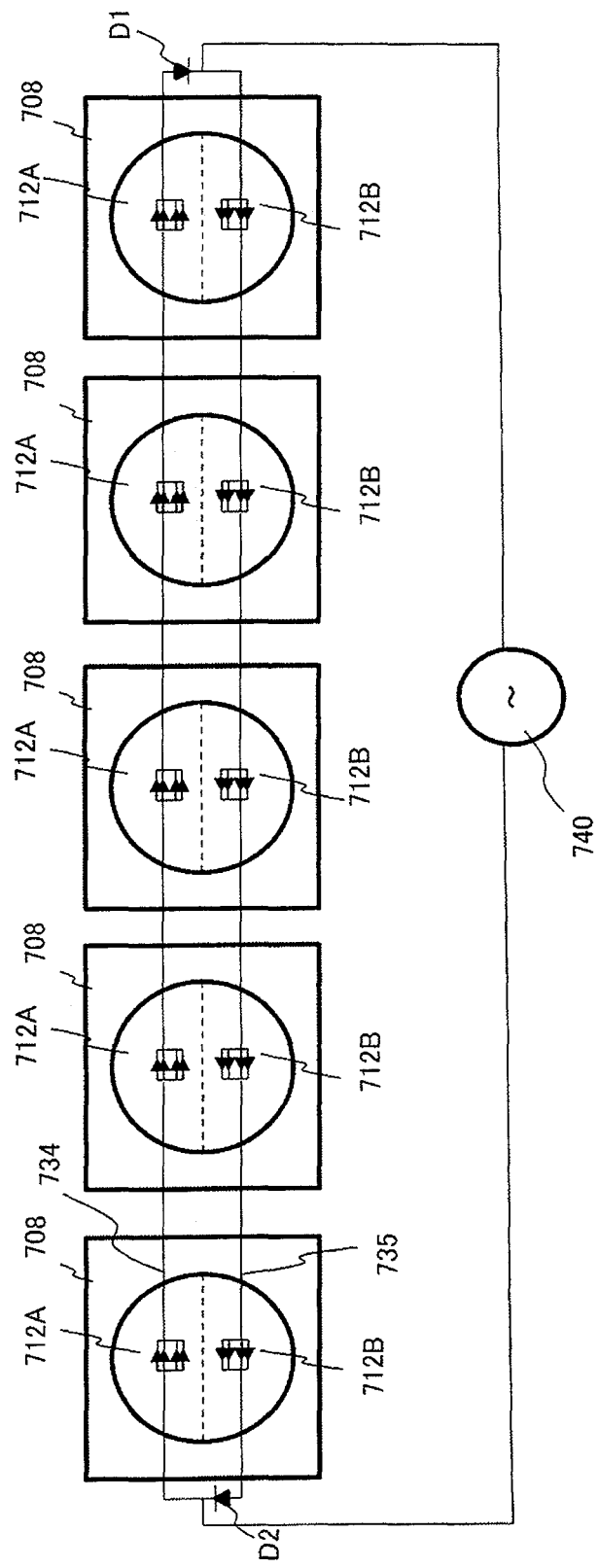
FIG. 26 illustrates a light-emitting module as schematically illustrated by using electrical symbols.

FIG. 25 shows white LED according to the ninth embodiment as schematically illustrated by using electrical symbols. In the white LED 708 according to the ninth embodiment, the LED chips 703A, 703B are connected in parallel by using wiring lines 720A, 720B between a wiring line 720C and a wiring line 720D. The wiring line 720C and the wiring line 720D are connected to an AC power source. For example, when the positive current is allowed to flow (positive current is applied) from the side of the wiring line 720C to the side of the wiring lines 720D, then the driving current is allowed to flow through the LED chip 703A, and the current is not allowed to flow through the LED chip 703B on account of a protective diode D2. On the contrary, when the negative current is allowed to flow (negative current is applied) from the side of the wiring line 720D to the side of the wiring lines 720C, then the driving current is allowed to flow through the LED chip 703B, and the current is not allowed to flow through the LED chip 703A on account of a protective diode D1. Alternatively, a semiconductor switch, which is turned ON when the voltage between the both ends of the chip is not less than a predetermined value, may be provided for the input side of each of the LED chips 703A, 703B so that the currents, which are outputted from the protective diodes D1, D2, are prevented from making any detour to arrive at the other LED chip. In this way, it is preferable to provide the protective circuit such as the protective diode or the semiconductor switch. As illustrated in FIG. 25, white LED, in which the light emitting diode (LED chip 703A) included in the first white light source and the light emitting diode (LED chip 703B) included in the second white light source are connected in parallel while providing the opposite polarities, is applicable as the white LED. The example illustrated in FIG. 25 is illustrative of such a case that a plurality of LED elements are connected in parallel in each of the set of LED chips 703A, 703B for constructing the reverse parallel connection, However, one LED element may be used to construct each of the LED chips 703A, 703B. Alternatively, it is also allowable to provide such an arrangement that a plurality of LED elements are connected in series in the forward direction. When the white LED, which has the set of LED chips in the reverse parallel connection, is applied, then the commercial power source (for example, 100 V) may be applied as the driving voltage, or any voltage lower than the commercial power source may be applied. It is preferable to apply the LED chip having high reverse voltage resistance. When the white LED, which has the set of LED chips in the reverse parallel connection, is applied, it is possible to utilize the AC power source. Therefore, it is possible to expect the simplification of the control circuit in view of the fact that it is unnecessary to provide any AC-DC converter and any driver for the DC control FIG. 26 shows the light-emitting module 730 as schematically illustrated by using electrical symbols. In an example illustrated in FIG. 26, five white LED's 708 are connected in series by wiring lines 734, 735, and the both ends of the white LED 708 group are connected to an AC power source circuit 740.

Figure 27:
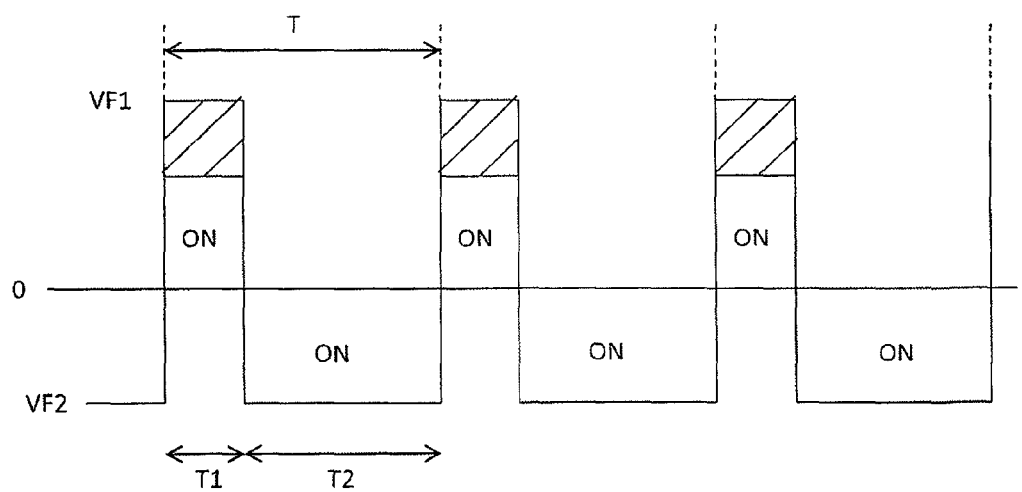
FIG. 27 illustrates an example of the current supplied to each white LED by means of an AC power source circuit.

FIG. 27 shows an example of the current supplied to each of the white LED's 708A by means of the AC power source circuit 740. The AC power source circuit 740 is constructed so that the positive and negative pulse voltages are applied at a period T to the LED chip 703A (divided area portion 712A) and the LED chip 703B (divided area portion 712B). In this example, the positive voltage VF1 is applied to the LED chip 703A with the application time T1, and the negative voltage VF2 is applied to the LED chip 703B with the application time T2.

In the AC power source circuit 740, it is possible to change the ratio between the application time T1 of the positive voltage VF1 and the application time T2 of the negative voltage VF2. Further, the AC power source circuit 740 can provide the driving voltage for the LED chip 703A and the driving voltage for the LED chip 703B at a predetermined ratio. The example illustrated in FIG. 27 is illustrative of a case in which the application voltage value of the voltage having the short application time is higher than the application voltage value of the voltage having the long application time. Accordingly, the current value, which is provided at the higher application voltage, is higher than the current value which is provided at the lower application voltage. The control is performed such that the ratio between the positive and negative voltages is constant irrelevant to the ratio between the application times T1, T2.

Therefore, it is possible to change the color temperature of the combined white light emitted from the respective divided area portions 712A, 712B by changing the ratio between the application times T1, T2 in the same manner as in the eighth embodiment. The driving voltages are applied to the LED chips 703A, 7035 at such a voltage ratio that the luminance is constant irrelevant to the change of the color temperature. It is also allowable that the maximum light amount, which is brought about from the respective divided area portions 712A, 712B, is obtained in the case of VF1=VF2. Alternatively, it is also allowable that the maximum light amount is obtained when VF1 and VF2 are different from each other.

For example, when the direction of the LED chip 703B is reversed in the circuit diagram illustrated in FIG. 24, a state is given, in which the LED chip 703B is driven by the negative voltage to provide such a state that the AC driving is substantially performed, although the circuit arrangement is different from that illustrated in FIG. 26.

The arrangement, in which the LED chips 703A, 703B are driven at the driving voltage ratio so that the luminance of the combined white light is constant irrelevant to the change of the color temperature throughout the eighth embodiment and the ninth embodiment. The successful achievement of the constant luminance of the combined white light, which is provided irrelevant to the change of the color temperature, means that the luminance of the combined white light can be adjusted to have a desired value at each color temperature.

That is, the present invention is not limited to the package 701 and the light-emitting module 730 in which the luminance is constant with respect to the color temperature as explained in the eighth and ninth embodiments. The present invention is generally applicable when it is intended that the contribution of the light emission from each of the white light-emitting portions is set in accordance with the temporal control, when the luminance efficiency is not identical between the two white light-emitting portions (on account of, for example, the difference in the light emission efficiency of HL paste (fluorescent substance or fluorescent member) as well as the dispersion of the LED chips, the difference in the property between the purple LED chip and the blue LED chip, and other factors).

The individual electric powers for the LED chips 703A, 703B can be also controlled on the same time base (time axis) (see FIG. 27) in the arrangement of the light-emitting device (illumination apparatus) in which the positive and negative driving currents are supplied to the LED chips 703A, 703B respectively as in the ninth embodiment explained above. Further, it is possible to increase/decrease the transmission electric power without changing the ratio between the individual electric powers supplied to the LED chips 703A, 703B by increasing/decreasing the power source voltage.

The lighting control circuits (light control apparatuses) B, C, D explained in the fourth to seventh embodiments adopt such an arrangement that the signal from the operation unit, which indicates the operation amount, is received, for example, by the microcomputer 180 via the physical wiring line. On the contrary, the operation unit may be constructed as a remote controller which is physically separated from the lighting control apparatuses B, C, D, and the operation amount of the operation unit may be transmitted to the main body of the lighting control circuit (light control apparatus) by means of the non-contact communication.

For example, the fourth to seventh embodiments can be modified as follows. That is, the XY switch 185, which is the operation unit in the fourth to seventh embodiments, is accommodated in a casing as a remote controller, and an infrared transmitter is further accommodated in the casing. The ON/OFF pattern (bit pattern) of bit $b_0$ to $b_5$, which is generated by the operation of the XY switch 185 by a user, is converted by the infrared transmitter, for example, into an infrared signal which is transmitted. On the other hand, an infrared receiver is arranged at the preceding stage of the microcomputer 180. The bit pattern is demodulated from the infrared signal received by the infrared receiver, which is inputted into the microcomputer 180. The wireless communication is also applicable in place of the infrared communication. In this way, the transmission route of the signal for expressing the operation amount of the operation unit may include the wireless route without being limited to only the wired route. It is also allowable to provide such an arrangement that the remote controller detects the operation amount of the operation unit by means of a rotary encoder.

What is claimed is:

1. A light control apparatus for a white LED light-emitting device, comprising:
   a driving current supply unit which supplies an AC current as a driving current via a pair of terminals to the white LED light-emitting device including a set of LED elements having mutually different light emission wavelength regions connected in parallel while providing opposite polarities and the pair of terminals provided to supply the driving current to the set of LED elements;
   an individual amount defining unit which defines a positive driving current amount and a negative driving current amount respectively to be supplied to the white LED light-emitting device in a positive half cycle and a negative half cycle included in one cycle of the AC current respectively; and
   an operation unit which is provided to impart, to the individual amount defining unit, an operation amount for adjusting the positive driving current amount and the negative driving current amount defined by the individual amount defining unit,
   wherein the individual amount defining unit includes:
   a triac which controls supply start and supply stop of positive and negative driving currents, which respectively correspond to the positive and negative driving current amounts, with respect to the white LED light-emitting device;
   a trigger generating unit which imparts, to the triac, a supply start trigger for the positive driving current and a supply start trigger for the negative driving current; and
   a time constant circuit which includes a first variable resistor for determining a time constant for allowing the trigger generating unit to generate the supply start trigger for the positive driving current and a second variable resistor for determining a time constant for allowing the trigger generating unit to generate the supply start trigger for the negative driving current; and
   the operation unit includes a first operation unit for adjusting a resistance value of the first variable resistor and a second operation unit for adjusting a resistance value of the second variable resistor.

2. The light control apparatus for the white LED light-emitting device according to claim 1, further comprising:
   a total amount defining unit which performs at least one of increasing and decreasing a total amount of the positive driving current amount and the negative driving current amount to be supplied to the white LED light-emitting device during the one cycle without changing a ratio of the positive driving current amount and the negative driving current amount, wherein:
   the operation unit imparts, to the total amount defining unit, an operation amount for adjusting the total amount defined by the total amount defining unit depending on an operation.

3. The light control apparatus for the white LED light-emitting device according to claim 2, wherein:
   the driving current supply unit supplies, to the white LED light-emitting device, one or more pulse-shaped current or pulse-shaped currents having a predetermined pulse width or pulse widths in a predetermined period of time of the positive half cycle and a predetermined period of time of the negative half cycle respectively in the one cycle of the AC current, the apparatus further including:
   a pulse control unit which serves as the individual amount defining unit and the total amount defining unit for defining at least one of a number and the pulse width or pulse widths of the positive pulse-shaped current or pulse-shaped currents supplied in the predetermined period of time in the positive half cycle and at least one of a number and the pulse width or pulse widths of the negative pulse-shaped current or pulse-shaped currents supplied in the predetermined period of time in the negative half cycle; and
   the operation unit including a first operation unit which imparts, to the pulse control unit, an operation amount for increasing one of the at least one of the number and the pulse width or pulse widths of the positive pulse-shaped current or pulse-shaped currents and the at least one of the number and the pulse width or pulse widths of the negative pulse-shaped current or pulse-shaped currents and decreasing the other in accordance with an operation, and a second operation unit which imparts, to the pulse control unit, an operation amount for increasing/decreasing the at least one of the number and the pulse width or pulse widths of the positive pulse-shaped current or pulse-shaped currents and the at least one of the number and the pulse width or pulse widths of the negative pulse-shaped current or pulse-shaped currents at equal proportions in accordance with an operation.

4. The light control apparatus for the white LED light-emitting device according to claim 3, wherein:
   the driving current supply unit supplies the positive pulse-shaped current or pulse-shaped currents and the negative pulse-shaped current or pulse-shaped currents from one of two wiring lines connected to the pair of terminals of the white LED light-emitting device respectively, the apparatus further including:
   a changeover switch which switches a connection state in relation to the pair of terminals and the two wiring lines.

5. The light control apparatus for the white LED light-emitting device according to claim 3, wherein:
   the pulse control unit includes a first register which holds a register value corresponding to the number of the positive pulse-shaped current or pulse-shaped currents in accordance with the operation of the first operation unit and the second operation unit, and a second register which holds a register value corresponding to the number of the negative pulse-shaped current or pulse-shaped currents in accordance with the operation of the first operation unit and the second operation unit;
   the driving current supply unit supplies, to the white LED light-emitting device, the positive pulse-shaped current or pulse-shaped currents of the number corresponding to the register value of the first register and the negative pulse-shaped current or pulse-shaped currents of the number corresponding to the register value of the second register from one of two wiring lines connected to the pair of terminals of the white LED light-emitting device respectively; and
   the register value of the first register and the register value of the second register are replaced with each other in accordance with the operation of the operation unit to switch a connection state in relation to the pair of terminals and the two wiring lines.

6. The light control apparatus for the white LED light-emitting device according to claim 3, wherein:
   the driving current supply unit supplies the positive pulse-shaped current or pulse-shaped currents and the negative pulse-shaped current or pulse-shaped currents from one of two wiring lines connected to the pair of terminals of the white LED light-emitting device respectively, the apparatus further including:
a detecting unit which detects a first voltage value and a second voltage value proportional to respective average values of the positive pulse-shaped current or pulse-shaped currents and the negative pulse-shaped current or pulse-shaped currents supplied to the white LED light-emitting device respectively in respective predetermined periods of time of the positive and negative half cycles from one of the two wiring lines;
a converting unit which converts the first voltage value into a first feedback register value corresponding to the number of the positive pulse-shaped current or pulse-shaped currents and which converts the second voltage value into a second feedback register value corresponding to the number of the negative pulse-shaped current or pulse-shaped currents; and
a feedback control unit which compares the first feedback register value and the register value stored in the first register, which rewrites the value of the first register into the first feedback register value if the both are different from each other, which compares the second feedback register value and the register value stored in the second register, and which rewrites the value of the second register into the second feedback register value if the both are different from each other.

7. The light control apparatus for the white LED light-emitting device according to claim 1, wherein the individual amount defining unit defines a supply start timing for the positive driving current and a supply start timing for the negative driving current in the positive half cycle and the negative half cycle depending on the operation amount of the operation unit.

8. A light control apparatus for a white LED light-emitting device, comprising:
a driving current supply unit which supplies an AC current as a driving current via a pair of terminals to the white LED light-emitting device including a set of LED elements having mutually different light emission wavelength regions connected in parallel while providing opposite polarities and the pair of terminals provided to supply the driving current to the set of LED elements;
an individual amount defining unit which defines a positive driving current amount and a negative driving current amount respectively to be supplied to the white LED light-emitting device in a positive half cycle and a negative half cycle included in one cycle of the AC current respectively; and
an operation unit which is provided to impart, to the individual amount defining unit, an operation amount for adjusting the positive driving current amount and the negative driving current amount defined by the individual amount defining unit,
wherein the individual amount defining unit includes:
a triac which controls supply start and supply stop of the positive and negative driving currents, which respectively correspond to the positive and negative driving current amounts, with respect to the white LED light-emitting device;
a trigger generating unit which imparts, to the triac, a supply start trigger for the positive driving current and a supply start trigger for the negative driving current; and
two time constant circuits in which a portion disposed on one side from a movable point possessed by a variable resistor is a resistor a for determining a time constant A for allowing the trigger generating unit to generate the supply start trigger for the positive driving current and a portion disposed on the other side from the movable point is a resistor b for determining a time constant B for generating the supply start trigger for the negative driving current; and
the operation unit includes a first adjusting unit for adjusting a position of the movable point of the variable resistor depending on an operation.

9. The light control apparatus for the white LED light-emitting device according to claim 8, wherein:
the total amount defining unit further includes one common variable resistor which is used to determine the time constant A for allowing the trigger generating unit to generate the supply start trigger for the positive driving current together with the resistor a, which is used to determine the time constant B for allowing the trigger generating unit to generate the supply start trigger for the negative driving current together with the resistor b; and
the operation unit further includes a second adjusting unit which is independent from the first adjusting unit and which adjusts a resistance value of the common variable resistor.

10. The light control apparatus for the white LED light-emitting device according to claim 9, wherein the operation unit includes a first dial which is provided as the first adjusting unit and a second dial which is provided as the second adjusting unit, the first dial and the second dial being arranged coaxially and independently from each other.

11. The light control apparatus for the white LED light-emitting device according to claim 9, wherein the operation unit includes a first slide knob which is provided as the first adjusting unit and a second slide knob which is provided as the second adjusting unit.

12. The light control apparatus for the white LED light-emitting device according to claim 9, wherein:
the operation unit includes a touch panel which includes a shift button directed toward the one side and a shift button directed toward the other side to serve as the first adjusting unit as well as an increase button to increase the resistance value and a decrease button to decrease the resistance value to serve as the second adjusting unit;
the individual amount defining unit generates a resistance equivalent to that of the common variable resistor by using at least one transistor in accordance with a depressing operation for depressing the increase button to increase the resistance value or the decrease button to decrease the resistance value; and
the total amount defining unit generates a resistance equivalent to that of the variable resistor by means of at least one transistor in accordance with an operation of the shift button directed toward the one side or the shift button directed toward the other side.

13. A light control apparatus for a white LED light-emitting device, comprising:
a driving current supply unit which supplies an AC current as a driving current via a pair of terminals to the white LED light-emitting device including a set of LED elements having mutually different light emission wavelength regions connected in parallel while providing opposite polarities and the pair of terminals provided to supply the driving current to the set of LED elements;
an individual amount defining unit which defines a positive driving current amount and a negative driving current amount respectively to be supplied to the white LED light-emitting device in a positive half cycle and a negative half cycle included in one cycle of the AC current respectively; and an operation unit which is provided to impart, to the individual amount defining unit, an operation amount for adjusting the positive driving current amount and the negative driving current amount defined by the individual amount defining unit, wherein: the individual amount defining unit includes an integration circuit which generates a triangular wave voltage having a period equal to that of an AC voltage of the AC current, a non-inverting input terminal into which the triangular wave voltage generated by the integration circuit is inputted, an inverting input terminal into which a voltage obtained by divining, by a variable resistor, a DC voltage provided by rectifying the AC voltage is inputted as a reference voltage for defining a slice level of the triangular wave voltage, and a comparator which outputs positive and negative rectangular wave voltages as a result of comparison between voltages inputted from the non-inverting input terminal and the inverting input terminal respectively;

the driving current supply unit supplies a positive driving current, which corresponds to the positive driving current amount, to the white LED light-emitting device in a period of time in which the positive voltage is outputted from the comparator, while the driving current supply unit supplies a negative driving current, which corresponds to the negative driving current amount, to the white LED light-emitting device in a period of time in which the negative voltage is supplied from the comparator; and the operation unit adjusts a resistance value of the variable resistor in accordance with an operation.

14. The light control apparatus for the white LED light-emitting device according to claim 13, wherein:

the driving current supply unit supplies the positive driving current and the negative driving current as pulse-shaped currents to the white LED light-emitting device; and the total amount defining unit includes pulse width adjusting means for adjusting pulse widths of the pulse-shaped currents supplied as the positive driving current and the negative driving current.

\* \* \* \* \*